(12) United States Patent
Tsutsumi et al.

(10) Patent No.: US 12,713,606 B2
(45) Date of Patent: Aug. 18, 2026

(54) THREE-DIMENSIONAL MEMORY DEVICE CONTAINING SILICON OXYCARBIDE LINERS AND METHODS OF FORMING THE SAME

(71) Applicant: SANDISK TECHNOLOGIES LLC, Addison, TX (US)

(72) Inventors: Masanori Tsutsumi, Yokkaichi (JP); Naohiro Hosoda, Yokkaichi (JP); Takumi Moriyama, Yokkaichi (JP); Ryota Suzuki, Yokkaichi (JP); Takashi Kudo, Yokkaichi (JP); Nobuyuki Fujimura, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 403 days.

(21) Appl. No.: 18/356,919

(22) Filed: Jul. 21, 2023

(65) Prior Publication Data

US 2024/0260267 A1 Aug. 1, 2024

Related U.S. Application Data

(60) Provisional application No. 63/488,243, filed on Mar. 3, 2023, provisional application No. 63/481,622, filed on Jan. 26, 2023.

(51) Int. Cl.
*H10B 43/27* (2023.01)
*H10B 43/35* (2023.01)

(52) U.S. Cl.
CPC ............ *H10B 43/27* (2023.02); *H10B 43/35* (2023.02)

(58) Field of Classification Search
None
See application file for complete search history.

(56) References Cited

U.S. PATENT DOCUMENTS

| | | | |
|---|---|---|---|
| 8,658,499 | B2 | 2/2014 | Makala et al. |
| 9,356,031 | B2 | 5/2016 | Lee et al. |
| 9,397,093 | B2 | 7/2016 | Makala et al. |
| 9,419,012 | B1 | 8/2016 | Shimabukuro et al. |
| 9,576,975 | B2 | 2/2017 | Zhang et al. |

(Continued)

OTHER PUBLICATIONS

ISR—Notification of Transmittal of The International Search Report and Written Opinion of the International Searching Authority for International Patent Application No. PCT/US2023/081806, mailed Apr. 15, 2024, 22 pages.

(Continued)

*Primary Examiner* — Nilufa Rahim
(74) *Attorney, Agent, or Firm* — THE MARBURY LAW GROUP PLLC

(57) ABSTRACT

A method of making a memory device includes forming an alternating stack of insulating layers and sacrificial material layers, where a silicon oxycarbide liner is interposed between a first sacrificial material layer and a first insulating layer, and the first sacrificial material layer is direct contact with a second insulating layer or a dielectric material layer composed of a silicon oxide material, forming a memory opening through the alternating stack, forming a memory opening fill structure in the memory opening, forming backside recesses by removing the sacrificial material layers selective to the silicon oxycarbide liner, and forming electrically conductive layers in the backside recesses.

12 Claims, 53 Drawing Sheets

(56) References Cited

U.S. PATENT DOCUMENTS 9,613,977 B2 4/2017 Sharangpani et al.
9,659,955 B1 5/2017 Sharangpani et al.
9,659,956 B1 5/2017 Pachamuthu et al.
9,691,884 B2 6/2017 Makala et al.
9,875,929 B1 1/2018 Shukla et al.
9,893,081 B1 2/2018 Kanakamedala et al.
10,283,513 B1 5/2019 Zhou et al.
10,373,969 B2 8/2019 Zhang et al.
10,438,964 B2 10/2019 Makala et al.
10,516,025 B1 12/2019 Nishikawa et al.
10,804,282 B2 10/2020 Baraskar et al.
10,861,869 B2 12/2020 Nakamura et al.
10,998,331 B2 5/2021 Zhou et al.
11,049,807 B2 6/2021 Li et al.
11,101,289 B1 8/2021 Ueda et al.
11,114,462 B1 9/2021 Cui et al.
11,177,280 B1 11/2021 Rajashekhar et al.
11,482,531 B2 10/2022 Said et al.
11,515,326 B2 11/2022 Cui et al.
11,659,711 B2 5/2023 Kasai et al.
2013/0252391 A1 9/2013 Lee et al.
2014/0225181 A1 8/2014 Makala et al.
2016/0043093 A1 2/2016 Lee et al.
2016/0086972 A1 3/2016 Zhang et al.
2016/0379989 A1 12/2016 Sharangpani et al.
2017/0125436 A1 5/2017 Sharangpani et al.
2017/0352681 A1* 12/2017 Lee ........................ H10B 43/27
2018/0040627 A1 2/2018 Kanakamedala et al.
2018/0374866 A1 12/2018 Makala et al.
2019/0139973 A1 5/2019 Zhou et al.
2019/0214395 A1 7/2019 Zhang et al.
2019/0386108 A1 12/2019 Nishikawa et al.
2020/0006375 A1 1/2020 Zhou et al.
2020/0020715 A1 1/2020 Nakamura et al.
2020/0388627 A1 12/2020 Hopkins et al.
2021/0143171 A1 5/2021 Kim et al.
2021/0159167 A1 5/2021 Tsutsumi et al.
2021/0265372 A1 8/2021 Kanakamedala et al.
2021/0265385 A1 8/2021 Rajashekhar et al.
2021/0327889 A1 10/2021 Makala et al.
2021/0327890 A1 10/2021 Makala et al.
2021/0327897 A1 10/2021 Kasai et al.
2021/0335805 A1 10/2021 Kai et al.
2021/0335999 A1 10/2021 Kai et al.
2021/0408035 A1 12/2021 Sato et al.
2022/0052073 A1 2/2022 Kitazawa et al.
2022/0093644 A1 3/2022 Sharangpani et al.
2022/0109003 A1 4/2022 Nagahata et al.
2022/0278216 A1 9/2022 Pitner et al.
2022/0285386 A1 9/2022 Said et al.
2022/0285387 A1 9/2022 Hinoue et al.
2022/0285388 A1 9/2022 Cui et al.
2022/0352193 A1 11/2022 Said et al.
2022/0352199 A1 11/2022 Mukae et al.
2022/0352200 A1 11/2022 Sano et al.
2022/0352201 A1 11/2022 Hinoue et al.
2022/0399232 A1 12/2022 Amano et al.
2022/0399350 A1 12/2022 Sharangpani et al.
2022/0399354 A1 12/2022 Sharangpani et al.
2022/0406379 A1 12/2022 Takeguchi et al.
2022/0406720 A1 12/2022 Hinoue et al.
2022/0406793 A1 12/2022 Takeguchi et al.
2022/0406794 A1 12/2022 Hinoue et al.
2023/0018394 A1 1/2023 Makala et al.

OTHER PUBLICATIONS

Hosoda, N. et al., "Three-Dimensional Memory Device Containing Silicon Oxycarbide Liners and Methods of Forming the Same," U.S. Appl. No. 18/356,896, filed Jul. 21, 2023.

IPRP-WO—Notification Concerning Transmittal of International Preliminary Report On Patentability and Written Opinion of the International Searching Authority for International Patent Application No. PCT/US2023/081806, Mailed Aug. 7, 2025, 11 pages.

Endoh et al., "Novel Ultra High-Density Memory with a Stacked-Surrounding Gate Transistor (S-SGT) Structured Cell," IEDM Proc. (2001) 33-36.

Gaind, A.K. et al., "Physicochemical Properties of CVD Silicon Oxynitride from a SiH4—CO2—NH3—H2 System," J. Electrochem. Soc., vol. 125, No. 1, pp. 139-145, (1978).

ISR—Notification of Transmittal of The International Search Report and Written Opinion of the International Searching Authority for International Patent Application No. PCT/US2022/030506, mailed Oct. 27, 2022, 10 pages.

U.S. Appl. No. 17/587,470, filed Jan. 28, 2022, SanDisk Technologies LLC.

U.S. Appl. No. 17/587,518, filed Jan. 28, 2022, SanDisk Technologies LLC.

U.S. Appl. No. 17/715,662, filed Apr. 7, 2022, SanDisk Technologies LLC.

U.S. Appl. No. 17/716,698, filed Apr. 8, 2022, SanDisk Technologies LLC.

U.S. Appl. No. 18/060,732, filed Dec. 1, 2022, SanDisk Technologies LLC.

* cited by examiner 58
63
62
11
10
32T(32)
43
32
332
32B(32)
51'
52
53
54
56
50
60
55
43D
51

THREE-DIMENSIONAL MEMORY DEVICE CONTAINING SILICON OXYCARBIDE LINERS AND METHODS OF FORMING THE SAME

FIELD

The present disclosure relates generally to the field of semiconductor devices, and particularly to a three-dimensional memory device containing silicon oxycarbide liners and methods of forming the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device is provided, which comprises: an alternating stack of insulating layers and electrically conductive layers, wherein a first electrically conductive layer of the electrically conductive layers has a first major horizontal surface in contact with a silicon oxycarbide liner and an opposing second major horizontal surface in contact with one of the insulating layers or with a dielectric material layer composed of a silicon oxide material; a memory opening vertically extending through the alternating stack; and a memory opening fill structure located in the memory opening and comprising a vertical semiconductor channel and a memory film.

According to another aspect of the present disclosure, a memory device is provided, which comprises: an alternating stack of insulating layers and electrically conductive layers, wherein each of the electrically conductive layers is vertically spaced from a respective overlying insulating layer and from a respective underlying insulating layer by a respective backside dielectric metal oxide blocking dielectric layer, wherein a first backside dielectric metal oxide blocking dielectric layer of the backside dielectric metal oxide blocking dielectric layers comprises a first horizontal surface that is in direct contact with a silicon oxycarbide liner and a second horizontal surface that is in direct contact with one of the insulating layers or a dielectric material layer composed of a silicon oxide material; a memory opening vertically extending through the alternating stack; and a memory opening fill structure located in the memory opening and comprising a vertical semiconductor channel and a memory film.

According to yet another aspect of the present disclosure, a method of forming a memory device is provided, which comprises: forming an alternating stack of insulating layers and sacrificial material layers, wherein a silicon oxycarbide liner is interposed between a first sacrificial material layer of the sacrificial material layers and a first insulating layer of the insulating layers, and the first sacrificial material layer is direct contact with a second insulating layer of the insulating layers or is in direct contact with a dielectric material layer composed of a silicon oxide material; forming a memory opening through the alternating stack; forming a memory opening fill structure in the memory opening, wherein the memory opening fill structure comprises a memory film that includes, from outside to inside, a silicon oxide blocking dielectric layer, a continuous memory material layer, and a tunneling dielectric layer, and further comprises a vertical semiconductor channel that is formed on the memory film; forming backside recesses by removing the sacrificial material layers selective to the silicon oxycarbide liner; and forming electrically conductive layers in the backside recesses.

DETAILED DESCRIPTION

Figure 1:
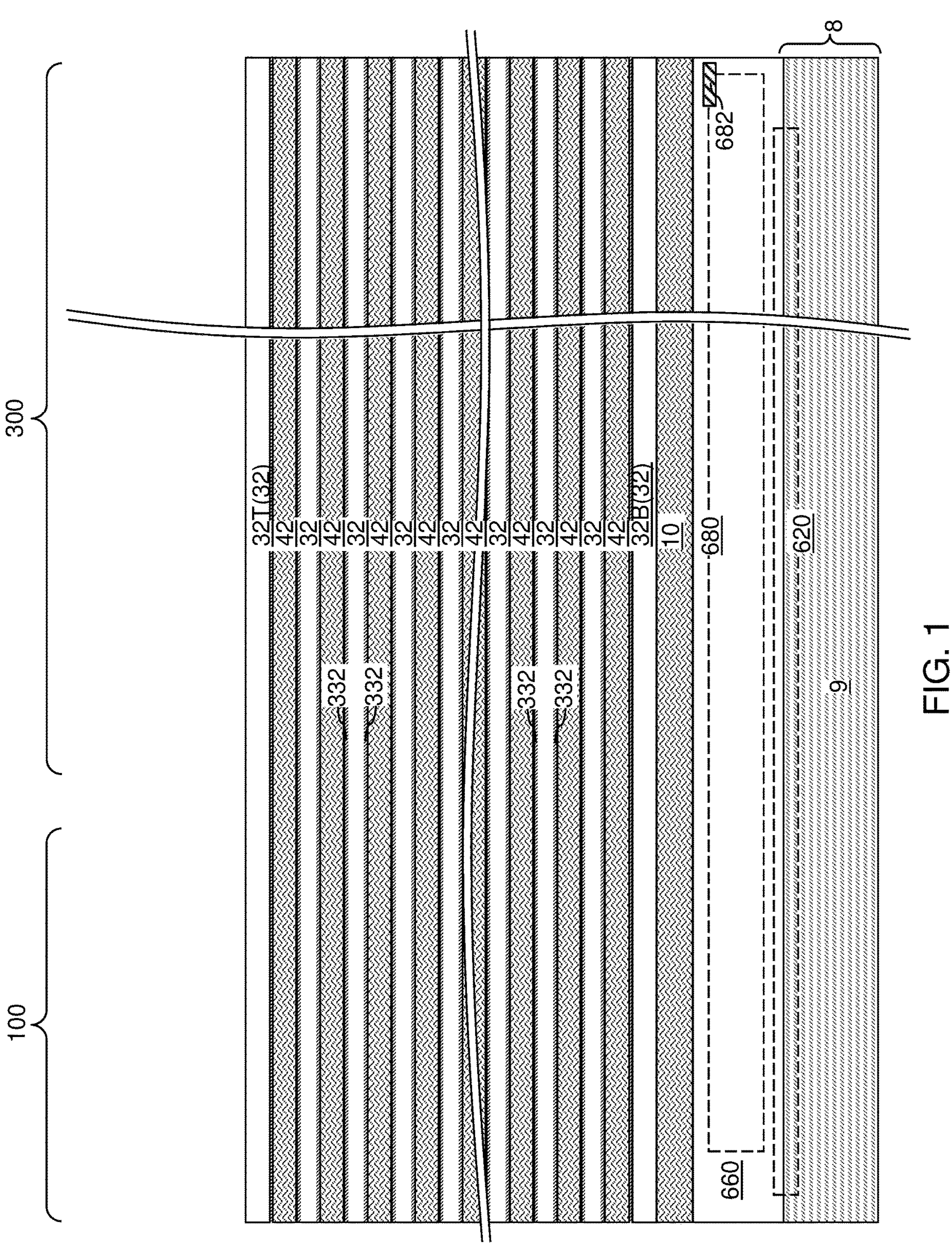
FIG. 1 is a schematic vertical cross-sectional view of a first exemplary structure after formation of optional semiconductor devices, optional lower-level metal interconnect structures, a semiconductor material layer, and a vertical repetition of multiple instances of a repetition unit of an insulating layer, a first silicon oxycarbide liner, a sacrificial material layer, and a second silicon oxycarbide liner according to a first embodiment of the present disclosure.

As discussed above, the embodiments of the present disclosure are directed to a three-dimensional memory device containing silicon oxycarbide liners and methods of forming the same, the various aspects of which are described below. The embodiments provide enhanced word line edge shape with reduced corner rounding, which reduces short channel effects.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm.

As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to a first embodiment of the present disclosure is illustrated. The first exemplary structure comprises a substrate 8, which may be a semiconductor substrate, an insulating substrate, a conductive substrate, or a combination thereof. The substrate 8 comprises a substrate material layer 9, which may or may not be a semiconductor material layer. In one embodiment, the substrate 8 may comprise a semiconductor substrate consisting essentially of a single crystalline semiconductor material or a polycrystalline semiconductor material. In one embodiment, the substrate 8 may be a commercially available silicon wafer on which a plurality of semiconductor dies, such as a two-dimensional array of semiconductor dies, can be subsequently formed. In this case, the substrate material layer 9 may comprise a doped well in the silicon wafer or an epitaxial silicon layer located on the silicon wafer. In case the substrate 8 comprises a semiconductor substrate, semiconductor devices 620 may optionally be formed on top of the substrate 8. Generally, the semiconductor devices 620 may comprise any type of semiconductor devices known in the art. In one embodiment, the semiconductor devices 620 may comprise complementary metal-oxide-semiconductor (CMOS) field effect transistors of a peripheral circuit for controlling operation of a three-dimensional memory device to be subsequently formed thereabove.

Optionally, metal interconnect structures 680 embedded within dielectric material layers 660 may be formed above the substrate 8. The metal interconnect structures 680 are also referred to as lower-level metal interconnect structures 680, and the dielectric material layers 660 are also referred to lower-level dielectric material layers 660. In case the semiconductor devices 620 are present, the lower-level metal interconnect structures 680 may provide electrical connection to the semiconductor devices 620. In one embodiment, the metal interconnect structures 680 may comprise metal pads 682, which may be employed as a contact pad for connection via structures to be subsequently formed. Alternatively, the formation of the semiconductor devices 620, metal interconnect structures 680 and dielectric material layers 660 over the substrate 8 may be omitted. Instead, the semiconductor devices 620 may be formed over a separate substrate and then bonded to the three-dimensional memory device.

In case the lower-level dielectric material layers 660 are present, a semiconductor material layer (e.g., polysilicon layer) 10 may be formed over the lower-level dielectric material layers 660. The semiconductor material layer 10 may comprise a single semiconductor material layer, or may comprise a vertical stack of multiple semiconductor material sublayers. In one embodiment, the semiconductor material layer 10 may have a doping of a first conductivity type, which may be p-type or n-type. In one embodiment, in-process source-level material layers may be formed in lieu of the semiconductor material layer 10. In this case, the in-process source-level material layers may comprise a vertical stack including a lower source semiconductor layer, a source-level sacrificial layer that is subsequently replaced with a source contact layer, and an upper source semiconductor layer. In case the lower-level dielectric material layers 660 are not employed, the semiconductor material layer 10 may be omitted. While an embodiment is described in which a semiconductor material layer 10 is employed, embodiments are expressly contemplated herein in which the semiconductor material layer is replaced with in-process source-level material layers or is omitted.

A vertical repetition of multiple instances of a repetition unit of an insulating layer 32, a first silicon oxycarbide liner 332, a sacrificial material layer, and a second silicon oxycarbide liner 332 can be formed over the substrate. The insulating layers 32 comprise an insulating material, such as a silicon oxide material. The sacrificial material layers 42 comprise a sacrificial material that can be removed selective to the insulating material of the insulating layers 32. As used herein, a removal of a first material is "selective to" a second material if the removal process removes the first material at a rate that is at least twice the rate of removal of the second material. The first silicon oxycarbide liners 332 and the second silicon oxycarbide liners 332 comprise a silicon oxycarbide material containing at least 10 atomic percent of each of silicon, oxygen and carbon.

The bottommost one of the insulating layers 32 is herein referred to as a bottommost insulating layer 32B. The topmost one of the insulating layers 32 is herein referred to as a topmost insulating layer 32T. In one embodiment, the insulating layers 32 comprise a silicon oxide material, such as undoped silicate glass or a doped silicate glass.

The sacrificial material layers 42 may comprise an insulating material, a semiconductor material, or a conductive material. Non-limiting examples of the sacrificial material of the sacrificial material layers 42 include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

The oxycarbide material of the first silicon oxycarbide liners 332 and the second silicon oxycarbide liners 332 may have a material composition of $SiC_xO_{2(1-x)}$, in which x greater than 0.1 and is less than 0.9, and/or greater than 0.2 and less than 0.8, and/or greater than 0.3 and less than 0.7.

The insulating layers 32 can be deposited, for example, by chemical vapor deposition (CVD). The sacrificial material layers 42 can be formed, for example, CVD or atomic layer deposition (ALD). The first silicon oxycarbide liners 332 and the second silicon oxycarbide liners 332 can be deposited by CVD or ALD. In an illustrative example, the insulating layers 32 may comprise undoped silicate glass that is deposited by plasma-assisted decomposition of tetraethylorthosilicate (TEOS). The sacrificial material layers 42 may comprise silicon nitride deposited by plasma-enhanced chemical vapor deposition, and the first and second silicon oxycarbide liners 322 may be deposited by a plasma-assisted chemical vapor deposition process employing silane and carbon dioxide as precursor gases.

In one embodiment, the silicon oxycarbide liners 332 are thinner than the insulating layers 32 and the sacrificial material layers 42. The thicknesses of the insulating layers 32 and the sacrificial material layers 42 can be in a range from 20 nm to 50 nm, although lesser and greater thicknesses can be employed for each insulating layer 32 and for each sacrificial material layer 42. The thickness of each of the first silicon oxycarbide liners 332 and the second silicon oxycarbide liners 332 can be in a range from 0.5 nm to 4 nm, and/or from 1.0 nm to 2.5 nm, although lesser and greater thicknesses may also be employed. The number of repetitions of the pairs of an insulating layer 32 and a sacrificial material layer 42 can be in a range from 2 to 1,024, and typically from 8 to 256, although a greater number of repetitions can also be employed.

The first exemplary structure may comprise a memory array region 100 in which memory stack structures are to be subsequently formed, and a contact region 300 in which stepped surfaces and contact via structures are to be subsequently formed.

Figure 2:
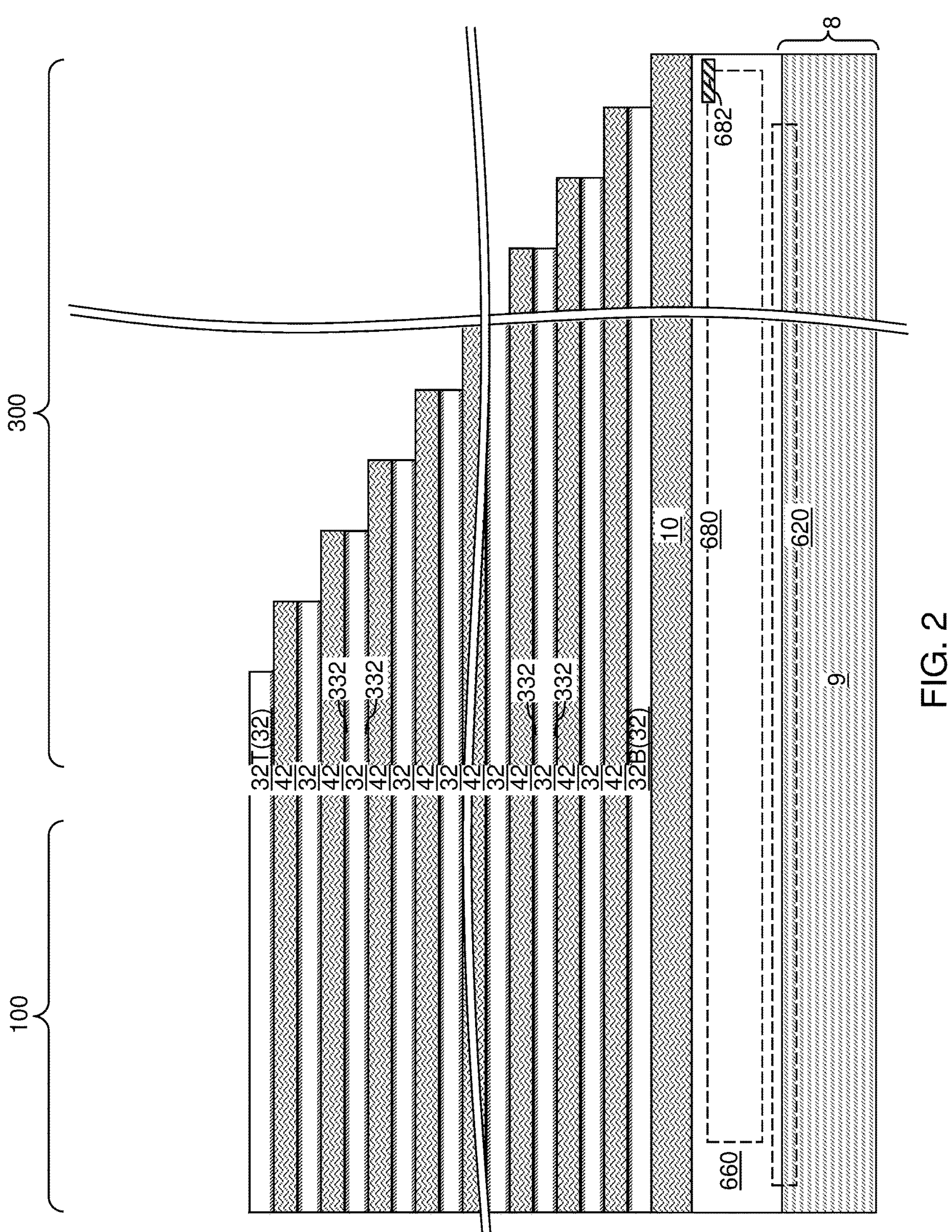
FIG. 2 is a schematic vertical cross-sectional view of the first exemplary structure after formation of stepped terraces according to the first embodiment of the present disclosure.

Referring to FIG. 2, stepped surfaces are formed at a peripheral portion of the vertical repetition (32, 42, 332), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the vertical repetition (32, 42, 332) are removed through formation of the stepped surfaces. A "stepped cavity" refers to a cavity having stepped surfaces.

The terrace region is formed in the contact region 300. The stepped cavity can have various stepped surfaces such that the horizontal cross-sectional shape of the stepped cavity changes in steps as a function of the vertical distance from the top surface of the semiconductor material layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the vertical repetition (32, 42, 332) laterally extends farther than any overlying sacrificial material layer 42 within the vertical repetition (32, 42, 332) in the terrace region. The terrace region includes stepped surfaces of the vertical repetition (32, 42, 332) that continuously extend from a bottommost layer within the vertical repetition (32, 42, 332) to a topmost layer within the vertical repetition (32, 42, 332).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

Figure 3:
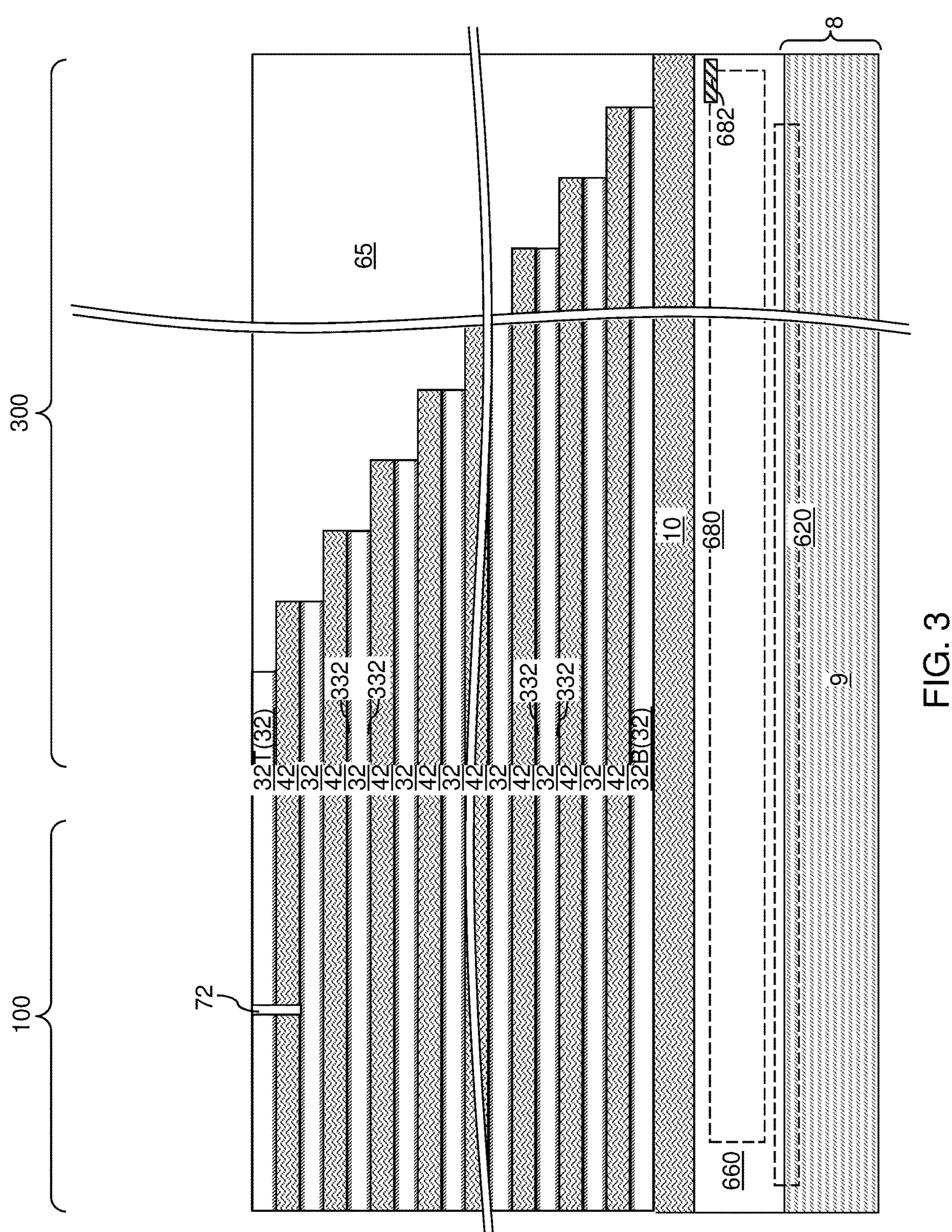
FIG. 3 is a schematic vertical cross-sectional view of the first exemplary structure after formation of a retro-stepped dielectric material portion according to the first embodiment of the present disclosure.

Referring to FIG. 3, a retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may or may not, be doped with dopants such as B, P, and/or F.

Optionally, drain-select-level isolation structures 72 can be formed through the topmost insulating layer 32T and a subset of the sacrificial material layers 42 located at drain-select-levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the topmost insulating layer 32T.

Figure 4A:
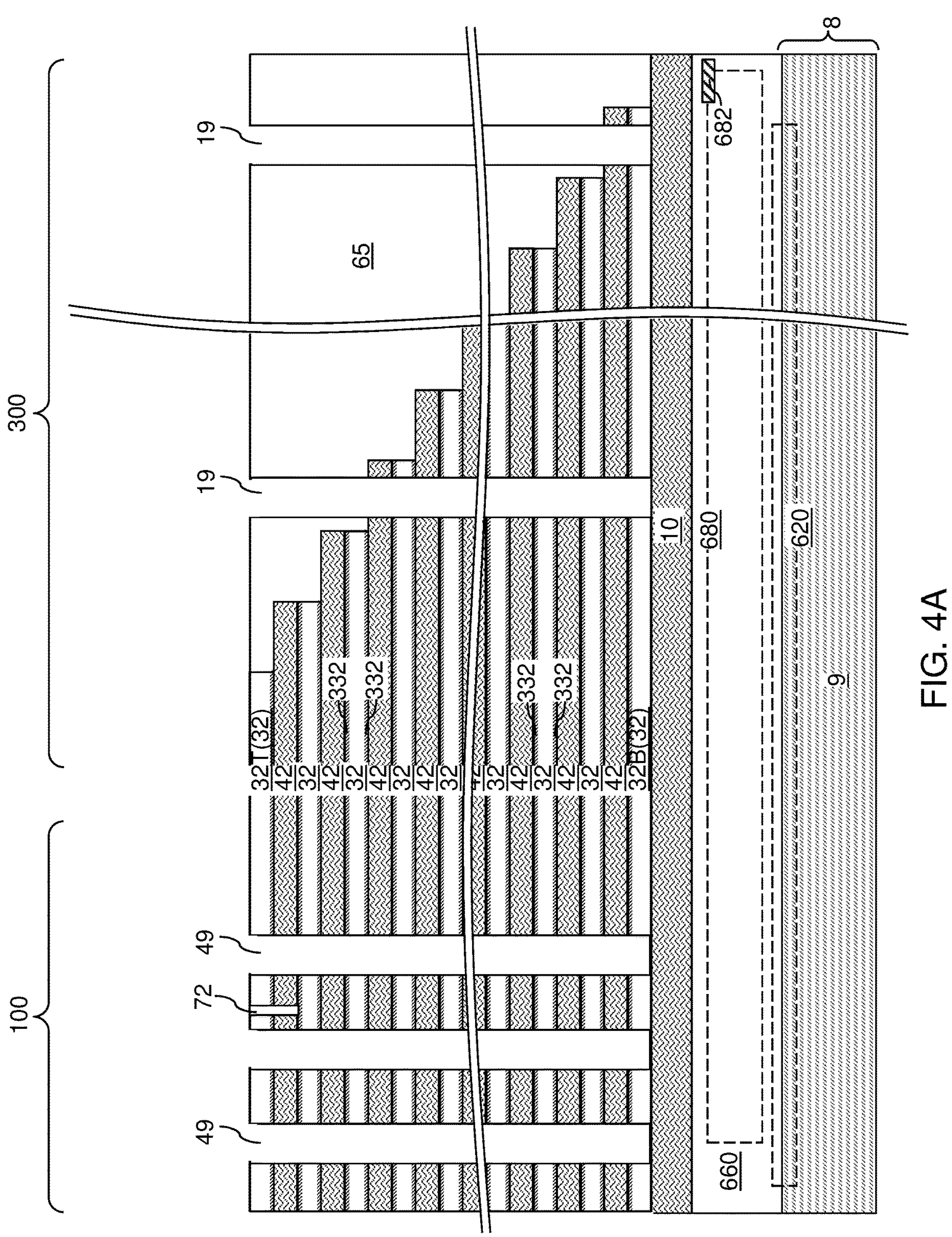
FIG. 4A is a schematic vertical cross-sectional view of the first exemplary structure after formation of memory openings and support openings according to the first embodiment of the present disclosure.
Figure 4B:
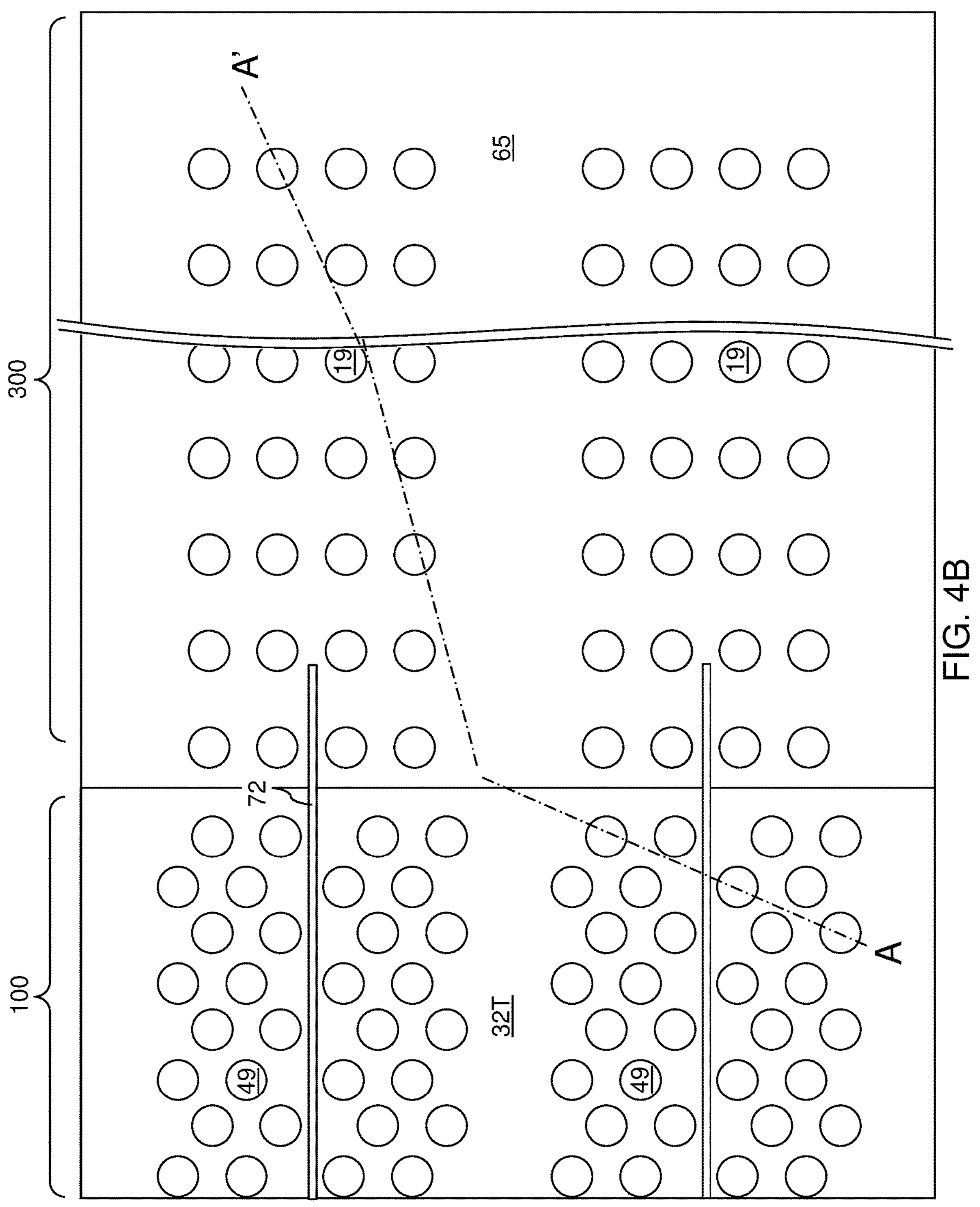
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the topmost insulating layer 32T and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the topmost insulating layer 32T or the retro-stepped dielectric material portion 65, and through the vertical repetition (32, 42, 332) by at least one anisotropic etch that employs the patterned lithographic material stack as an etch mask. Portions of the vertical repetition (32, 42, 332) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the topmost insulating layer 32T and the entirety of the vertical repetition (32, 42, 332) in the memory array region 100. The support openings 19 are formed through the retro-stepped dielectric material portion 65 and the portion of the vertical repetition (32, 42, 332) that underlie the stepped surfaces in the contact region 300.

The memory openings 49 extend through the entirety of the vertical repetition (32, 42, 332). The support openings 19 extend through a subset of layers within the vertical repetition (32, 42, 332). The chemistry of the anisotropic etch process employed to etch through the materials of the vertical repetition (32, 42, 332) may be modulated (i.e., periodically changed) to optimize etching of the various materials in the vertical repetition (32, 42, 332). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the vertical repetition (32, 42, 332) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the semiconductor material layer 10. A two-dimensional array of memory openings 49 can be formed in the memory array region 100. A two-dimensional array of support openings 19 can be formed in the contact region 300.

FIGS. 5A-5F are sequential schematic vertical cross-sectional views of a memory opening 49 within the first exemplary structure during formation of a memory opening fill structure 58 according to the first embodiment of the present disclosure.

Figures 5A, 5B:
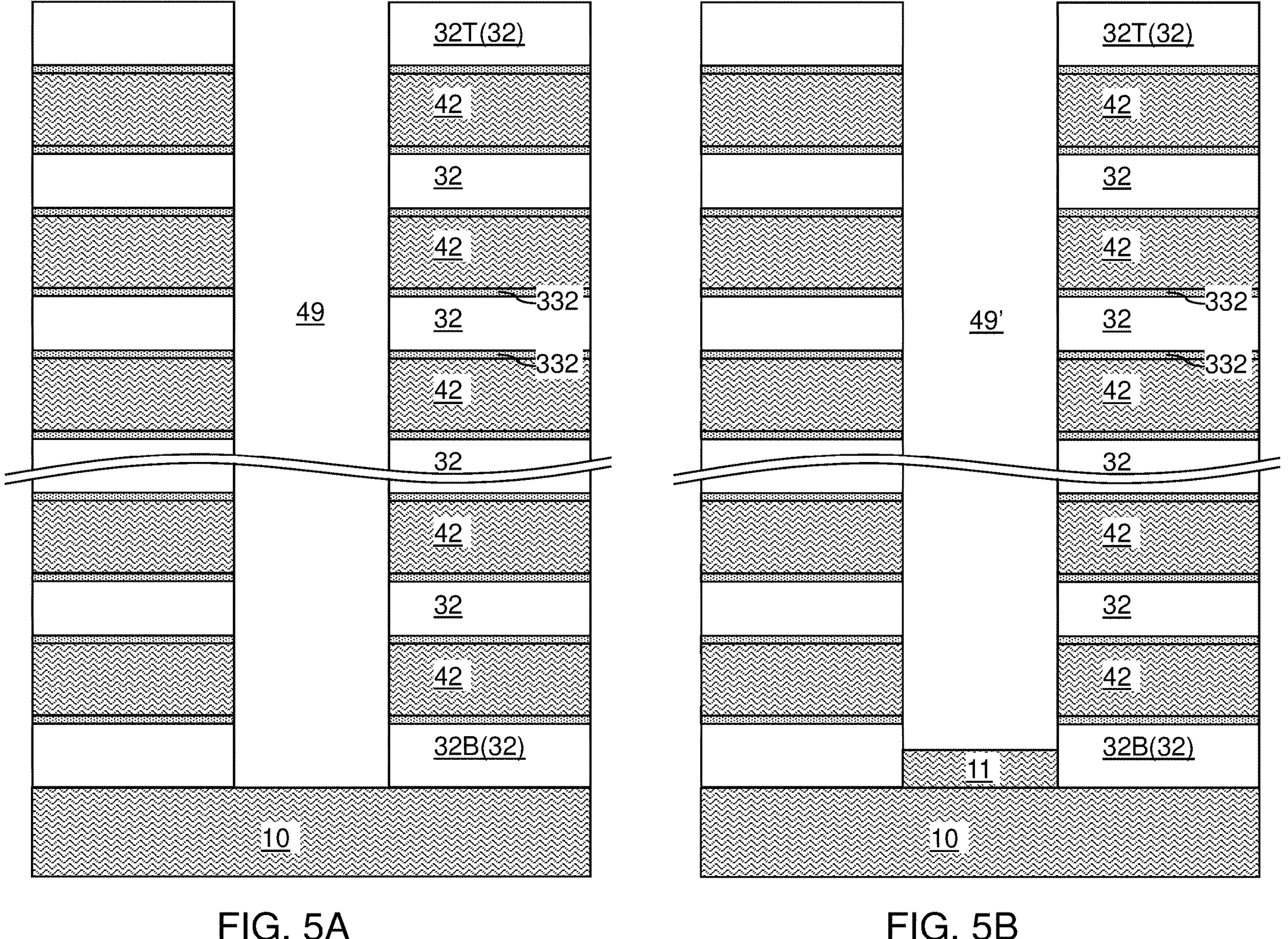
FIGS. 5A-5F are sequential schematic vertical cross-sectional views of a memory opening within the first exemplary structure during formation of a memory opening fill structure according to the first embodiment of the present disclosure.

FIG. 5A illustrates a memory opening after the processing steps of FIGS. 4A and 4B.

Referring to FIG. 5B, an optional pedestal channel portion 11 can be formed at the bottom portion of each memory opening 49 and each support openings 19, for example, by a selective semiconductor deposition process. In one embodiment, the pedestal channel portion 11 can be doped with electrical dopants of the same conductivity type as the semiconductor material layer 10, which is a first conductivity type. In one embodiment, the top surface of each pedestal channel portion 11 can be formed below a horizontal plane including the top surface of the bottommost insulating layer 32B. The pedestal channel portion 11 can be a portion of a transistor channel that extends between a source region to be subsequently formed in the semiconductor material layer 10 and a drain region to be subsequently formed in an upper portion of the memory opening 49. A memory cavity 49' is present in the unfilled portion of the memory opening 49 above the pedestal channel portion 11. If the semiconductor material layer 10 comprises a single crystalline semiconductor material, the pedestal channel portion 11 may comprise a single crystalline semiconductor material in epitaxial alignment with the single crystalline semiconductor material of the semiconductor material layer 10. In one embodiment, the pedestal channel portion 11 can comprise single crystalline silicon.

Figures 5C, 5D:
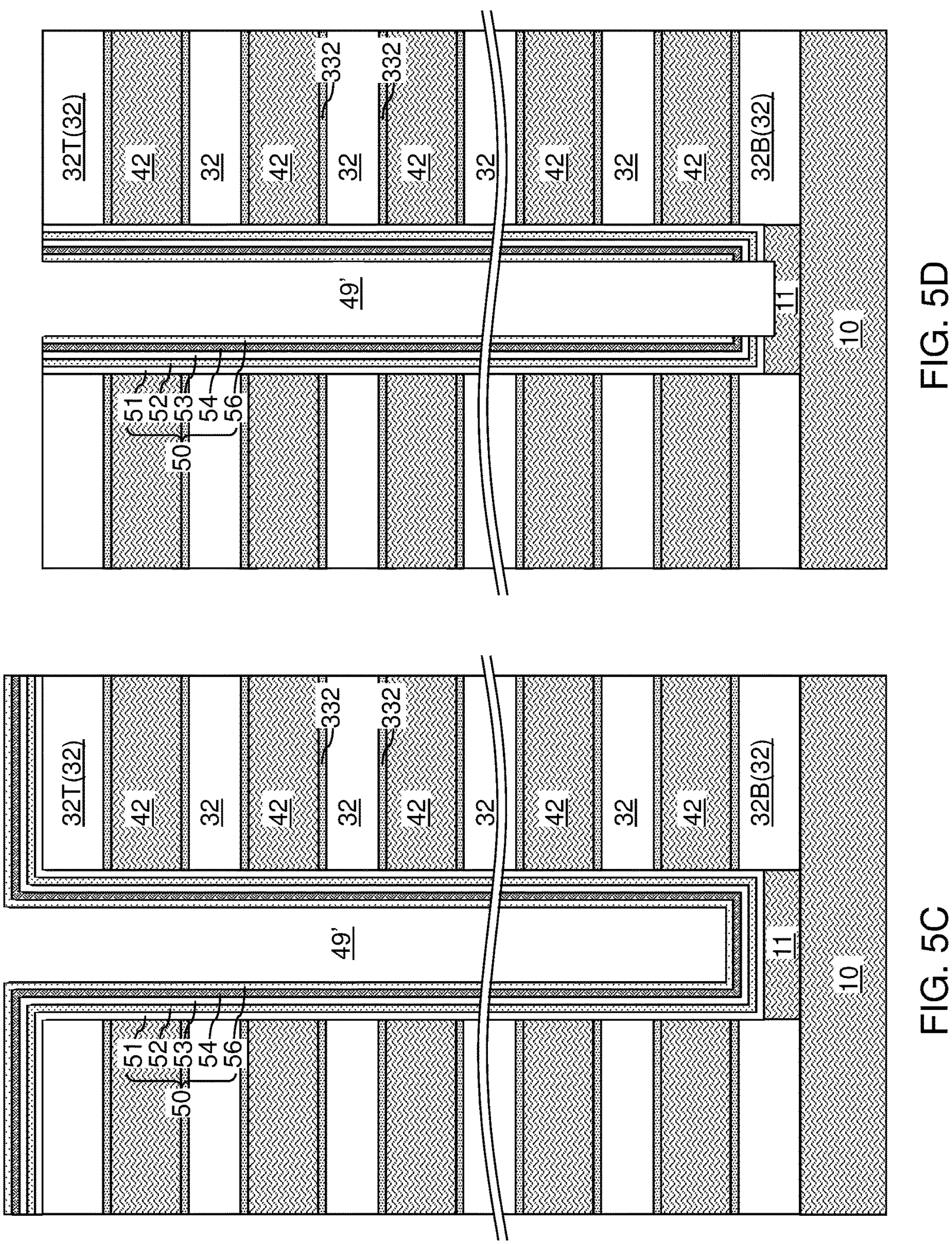

Referring to FIG. 5C, a memory film 50 can be formed by a series of conformal deposition processes. The memory film 50 may include, from bottom to top above the topmost insulating layer 32T or from outside to inside within each memory opening 49, a silicon oxide liner 51, a dielectric metal oxide blocking dielectric layer 52, a silicon oxide blocking dielectric layer 53, a memory material layer 54, and a tunneling dielectric layer 56.

The silicon oxide liner 51 comprises, and/or consists essentially of, a silicon oxide material, such as undoped silicate glass. In one embodiment, the silicon oxide liner 51 can be formed by a low pressure chemical vapor deposition (LPCVD) process employing thermal decomposition of tetraethylorthosilicate (TEOS). The thickness of the silicon oxide liner 51 may be in a range from 1 nm to 12 nm, such as from 3 nm to 8 nm, although lesser and greater thicknesses may also be employed.

The dielectric metal oxide blocking dielectric layer 52 comprises a dielectric metal oxide material having a dielectric constant greater than 7.9. Exemplary dielectric metal oxide materials that may be employed for the dielectric metal oxide blocking dielectric layer 52 include, but are not limited to, aluminum oxide, hafnium oxide, tantalum oxide, yttrium oxide, lanthanum oxide, dielectric oxides of other transition metals, or alloys or layer stacks thereof. The dielectric metal oxide blocking dielectric layer 52 can be deposited by a conformal deposition process, such as an atomic layer deposition (ALD) process. The thickness of the dielectric metal oxide blocking dielectric layer 52 may be in a range from 1 nm to 12 nm, such as from 3 nm to 8 nm, although lesser and greater thicknesses may also be employed.

The memory material layer 54 may comprise any memory material such as a charge storage material, a ferroelectric material, a phase change material, or any material that can store data bits in the form of presence or absence of electrical charges, a direction of ferroelectric polarization, electrical resistivity, or another measurable physical parameter. In one embodiment, the memory material layer 54 can be a continuous silicon nitride layer. In one embodiment, the sacrificial material layers 42 and the insulating layers 32 can have vertically coincident sidewalls, and the memory material layer 54 can be formed as a single continuous layer. Generally, the memory material layer 54 may comprise a vertical stack of memory elements that are located at levels of the sacrificial material layers 42. For example, the vertical stack of memory elements may comprise annular portions of the memory material layer 54 located at levels of the sacrificial material layers 42.

The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

Optionally, a sacrificial cover layer (not shown) may be formed over the memory film 50.

Referring to FIG. 5D, the optional sacrificial cover material layer (not shown), the tunneling dielectric layer 56, the memory material layer 54, the silicon oxide blocking dielectric layer 53, the dielectric metal oxide blocking dielectric layer 52, and the silicon oxide liner 51 are sequentially anisotropically etched employing at least one anisotropic etch process. The portions of the sacrificial cover material layer, the tunneling dielectric layer 56, the memory material layer 54, the silicon oxide blocking dielectric layer 53, the dielectric metal oxide blocking dielectric layer 52, and the silicon oxide liner 51 located above the top surface of the topmost insulating layer 32T can be removed by the at least one anisotropic etch process. Further, the horizontal portions of the sacrificial cover material layer, the tunneling dielectric layer 56, the memory material layer 54, the silicon oxide blocking dielectric layer 53, the dielectric metal oxide blocking dielectric layer 52, and the silicon oxide liner 51 at a bottom of each memory cavity 49' can be removed to form openings in remaining portions thereof. Each of the sacrificial cover material layer, the tunneling dielectric layer 56, the memory material layer 54, the silicon oxide blocking dielectric layer 53, the dielectric metal oxide blocking dielectric layer 52, and the silicon oxide liner 51 can be etched by a respective anisotropic etch process employing a respective etch chemistry, which may or may not be the same for the various material layers.

Each remaining portion of the sacrificial cover material layer (if present) can have a tubular configuration. A surface of the pedestal channel portion 11 (or a surface of the semiconductor material layer 10 in case a pedestal channel portions 11 is not employed) can be physically exposed underneath the opening through the sacrificial cover material layer, the tunneling dielectric layer 56, the memory material layer 54, the silicon oxide blocking dielectric layer 53, the dielectric metal oxide blocking dielectric layer 52, and the silicon oxide liner 51 at the bottom of each memory cavity 49'. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. The sacrificial cover material layer can be subsequently removed selective to the material of the tunneling dielectric layer 56. In case the sacrificial cover material layer includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer. Alternatively, the sacrificial cover material layer may be retained in the final device if it comprises a semiconductor material.

Figures 5E, 5F:
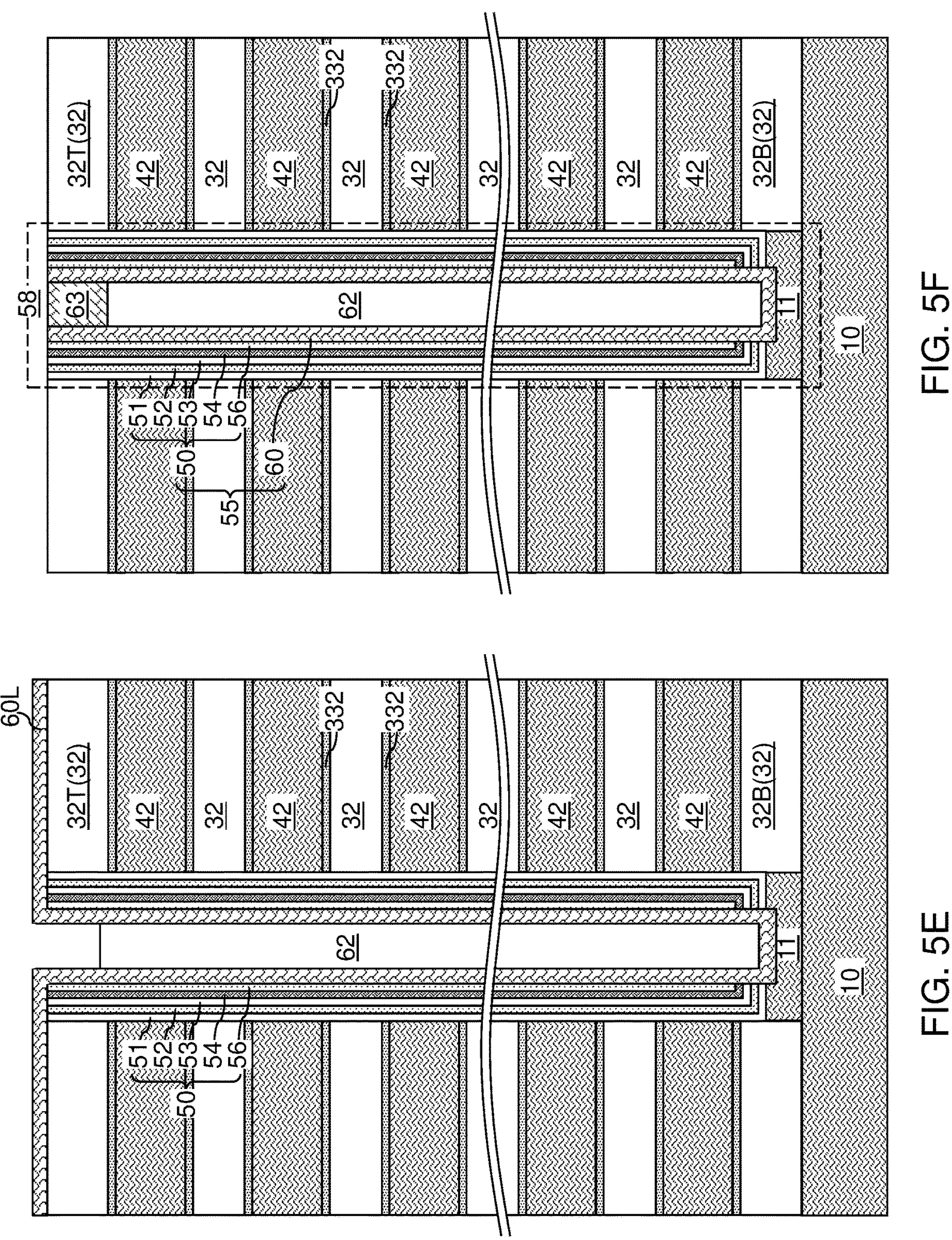

Referring to FIG. 5E, a semiconductor channel layer 60L can be deposited directly on the semiconductor surface of the pedestal channel portion 11 (or the semiconductor material layer 10 if the pedestal channel portion 11 is omitted), and directly on the memory film 50. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

A dielectric core layer can be deposited to fill any remaining portion of the memory cavity 49' within each memory opening 49. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. The horizontal portion of the dielectric core layer can be removed, for example, by a recess etch process such that each remaining portions of the dielectric core layer is located within a respective memory opening 49 and has a respective top surface below the horizontal plane including the top surface of the topmost insulating layer 32T. Each remaining portion of the dielectric core layer constitutes a dielectric core 62.

Referring to FIG. 5F, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the topmost insulating layer 32T, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

Each combination of a memory film 50 and a vertical semiconductor channel 60 within a memory opening 49 constitutes a memory stack structure 55. The memory stack structure 55 is a combination of a vertical semiconductor channel 60, the tunneling dielectric layer 56, a plurality of memory elements (comprising portions of the memory material layer 54 located at the levels of the sacrificial material layers 42), the silicon oxide blocking dielectric layer 53, the dielectric metal oxide blocking dielectric layer 52, and the silicon oxide liner 51. Each contiguous combination of a pedestal channel portion 11 (if present), a memory stack structure 55, a dielectric core 62, and a drain region 63 that fills a respective memory opening 49 is herein referred to as a memory opening fill structure 58. Each contiguous combination of a pedestal channel portion 11 (if present), a memory film 50, a vertical semiconductor channel 60, a dielectric core 62, and a drain region 63 that fills a respective support opening 19 is herein referred to as a support pillar structure.

Generally, a vertical semiconductor channel 60 is formed on each memory film 50. Each memory film 50 comprises, from outside to inside, a silicon oxide liner 51, a dielectric metal oxide blocking dielectric layer 52, a silicon oxide blocking dielectric layer 53, a memory material layer 54, and a tunneling dielectric layer 56. The silicon oxide liner 51 laterally surrounds and contacts the dielectric metal oxide blocking dielectric layer 52.

Figure 6:
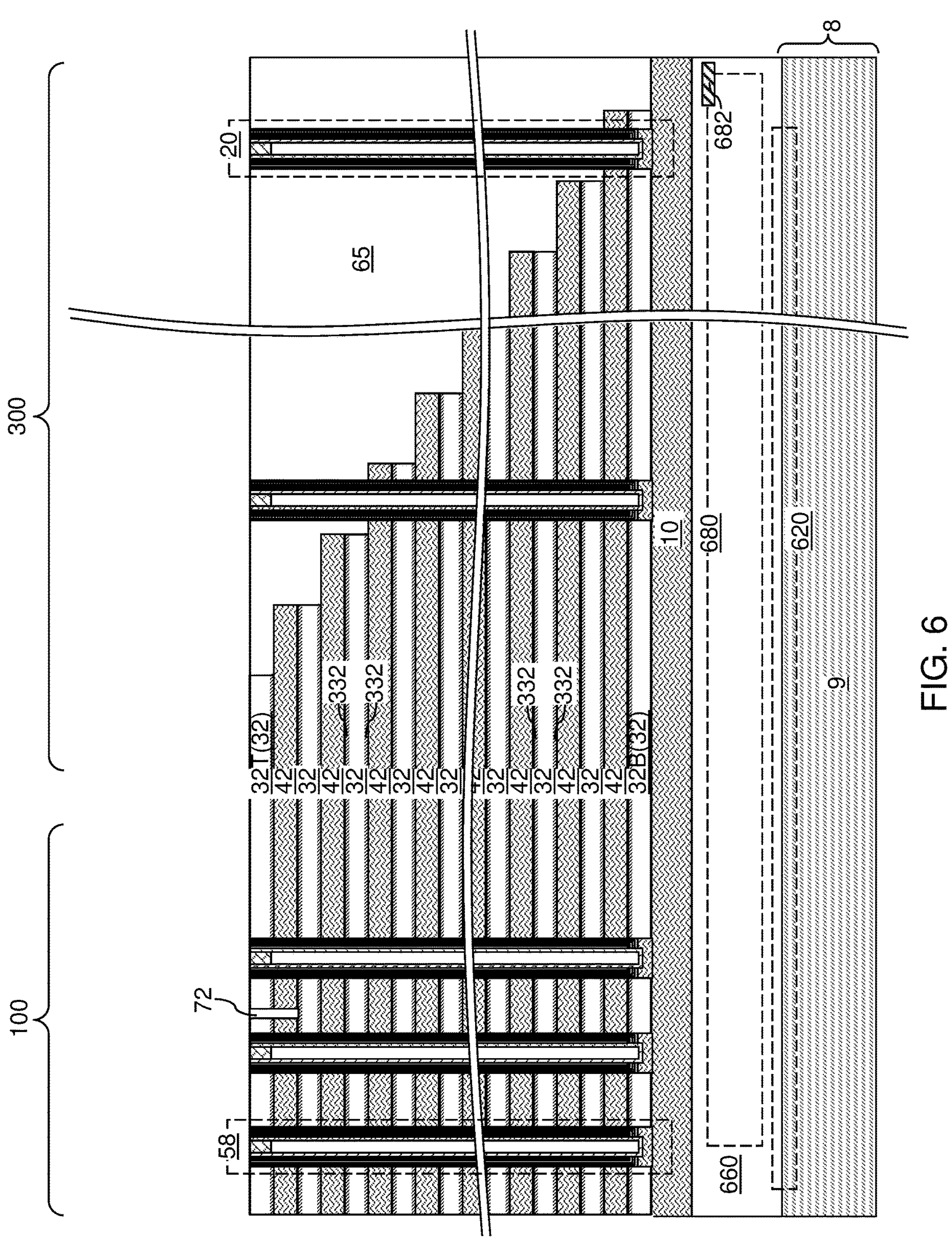
FIG. 6 is a schematic vertical cross-sectional view of the first exemplary structure after formation of memory opening fill structures and support pillar structures according to the first embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Figure 7A:
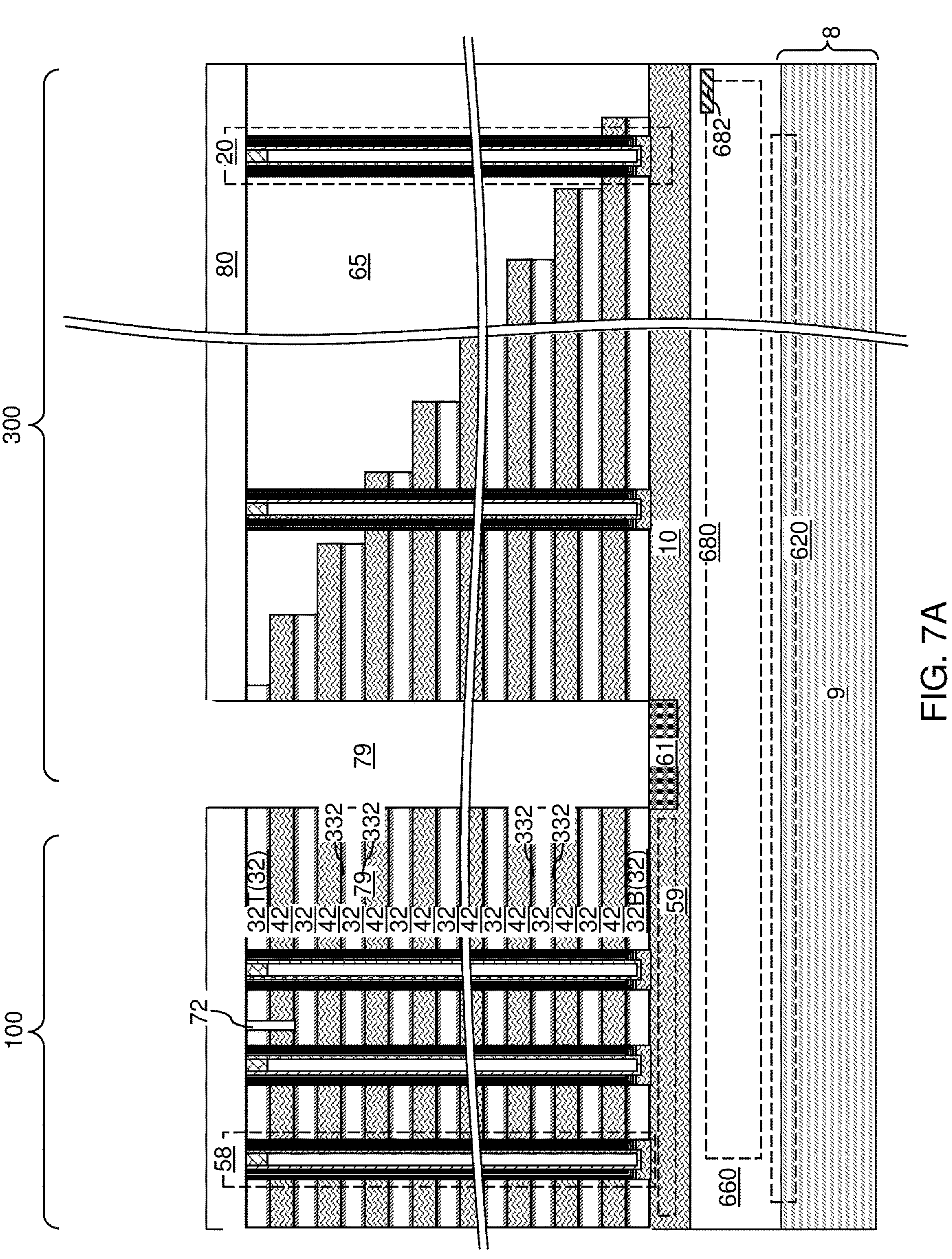
FIG. 7A is a schematic vertical cross-sectional view of the first exemplary structure after formation of a contact-level dielectric layer, backside trenches, and source regions according to the first embodiment of the present disclosure.
Figure 7B:
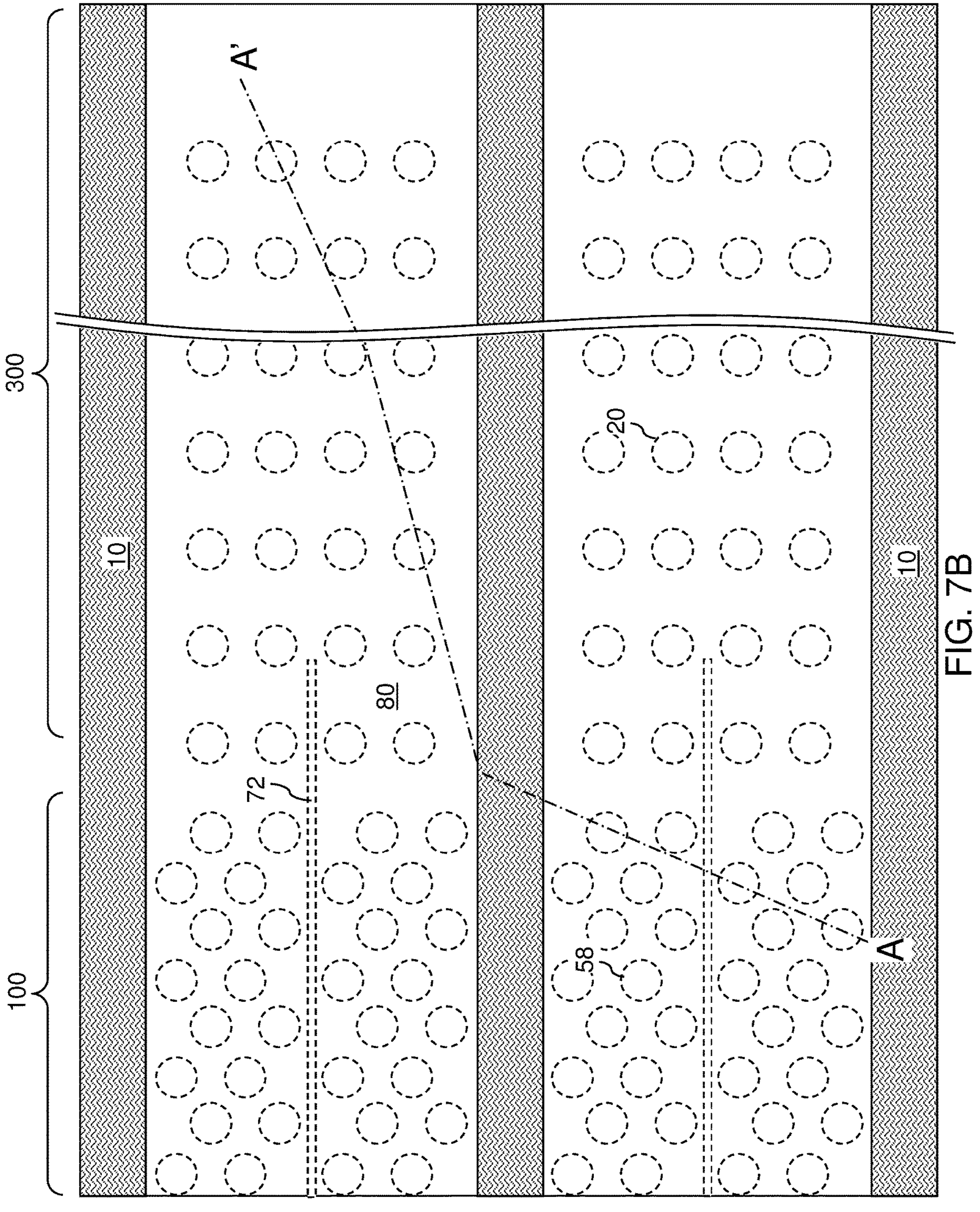
FIG. 7B is a partial see-through top-down view of the first exemplary structure of FIG. 7A. The vertical plane A-A' is the plane of the schematic vertical cross-sectional view of FIG. 7A.

Referring to FIGS. 7A and 7B, a contact-level dielectric layer 80 can be formed over the vertical repetition (32, 42, 332) of insulating layer 32 and sacrificial material layers 42, and over the memory opening fill structures 58 and the support pillar structures 20. The contact-level dielectric layer 80 includes a dielectric material that is different from the dielectric material of the sacrificial material layers 42. For example, the contact-level dielectric layer 80 can include silicon oxide. The contact-level dielectric layer 80 can have a thickness in a range from 50 nm to 500 nm, although lesser and greater thicknesses can also be employed.

A photoresist layer (not shown) can be applied over the contact-level dielectric layer 80, and is lithographically patterned to form openings in areas between clusters of memory stack structures 55. The pattern in the photoresist layer can be transferred through the contact-level dielectric layer 80, the vertical repetition (32, 42, 332) and/or the retro-stepped dielectric material portion 65 employing an anisotropic etch to form backside trenches 79, which vertically extend from the top surface of the contact-level dielectric layer 80 at least to the top surface of the semiconductor material layer 10, and laterally extend through the memory array region 100 and the contact region 300.

In one embodiment, the backside trenches 79 can laterally extend along the first horizontal direction hd1 (which may be a word line direction), and can be laterally spaced apart among one another along the second horizontal direction hd2 (which can be a bit line direction) that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory opening fill structures 58 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing. Generally, backside trenches 79 laterally extending along the first horizontal direction hd1 can be formed through the contact-level dielectric layer 80 and the vertical repetition (32, 42, 332). The vertical repetition (32, 42, 332) as formed at the processing steps of FIG. 2 is divided into multiple alternating stacks (32, 42) that are laterally spaced apart along the second horizontal direction hd2 by the backside trenches 79.

Dopants of the second conductivity type can be implanted into physically exposed surface portions of the semiconductor material layer 10 (which may be surface portions of the semiconductor material layer 10) that are located at the bottom of the backside trenches by an ion implantation process. A source region 61 can be formed at a surface portion of the semiconductor material layer 10 under each backside trench 79. Each source region 61 is formed in a surface portion of the semiconductor material layer 10 that underlies a respective backside trench 79. Due to the straggle of the implanted dopant atoms during the implantation process and lateral diffusion of the implanted dopant atoms during a subsequent activation anneal process, each source region 61 can have a lateral extent greater than the lateral extent of the lateral extent of the overlying backside trench 79.

An upper portion of the semiconductor material layer 10 that extends between the source region 61 and the vertical semiconductor channels 60 in the memory opening fill structures 58 constitutes a horizontal semiconductor channel 59 for a plurality of field effect transistors. The horizontal semiconductor channel 59 is connected to multiple vertical semiconductor channels 60.

Figure 8:
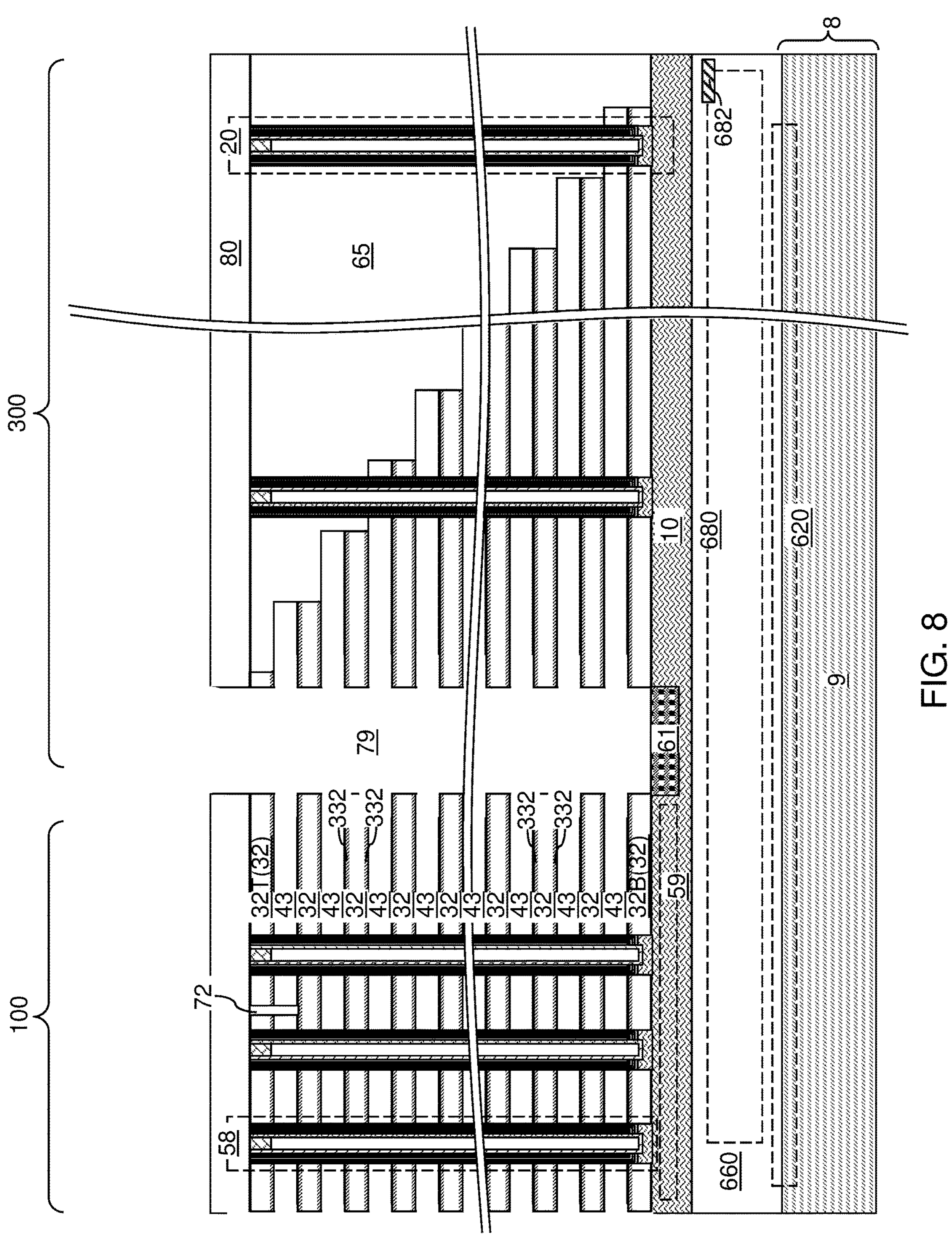
FIG. 8 is a schematic vertical cross-sectional view of the first exemplary structure after formation of backside recesses according to the first embodiment of the present disclosure.

Referring to FIG. 8, an etchant that selectively etches the sacrificial material layers 42 with respect to the first material of the insulating layers 32 and the silicon oxycarbide liners 332 can be introduced into the backside trenches 79, for example, employing an etch process. Backside recesses 43 are formed in volumes from which the sacrificial material layers 42 are removed. The removal of the sacrificial material layers 42 can be selective to the first material of the insulating layers 32, the material of the silicon oxycarbide liners 332, the material of the retro-stepped dielectric material portion 65, the semiconductor material of the semiconductor material layer 10, and the material of the outermost layer of the memory films 50 (such as the silicon oxide liner 51). In one embodiment, the sacrificial material layers 42 can include silicon nitride, and the materials of the insulating layers 32 and the retro-stepped dielectric material portion 65 can be selected from silicon oxide and dielectric metal oxides.

The etch process that etches the sacrificial material layers 42 selective to the insulating layers 32, the silicon oxycarbide liners 322, and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the sacrificial material layers 42 are removed. The memory openings in which the memory stack structures 55 are formed are herein referred to as front side openings or front side cavities in contrast with the backside recesses 43. Each of the plurality of backside recesses 43 can extend substantially parallel to the top surface of the semiconductor material layer 10. A backside recess 43 can be vertically bounded by a top surface of an underlying silicon oxycarbide liner 322 (such as a first silicon oxycarbide liner) and a bottom surface of an overlying silicon oxycarbide liner 322 (such as a second silicon oxycarbide liner). In one embodiment, each backside recess 43 can have a uniform height throughout.

Figures 9A, 9B:
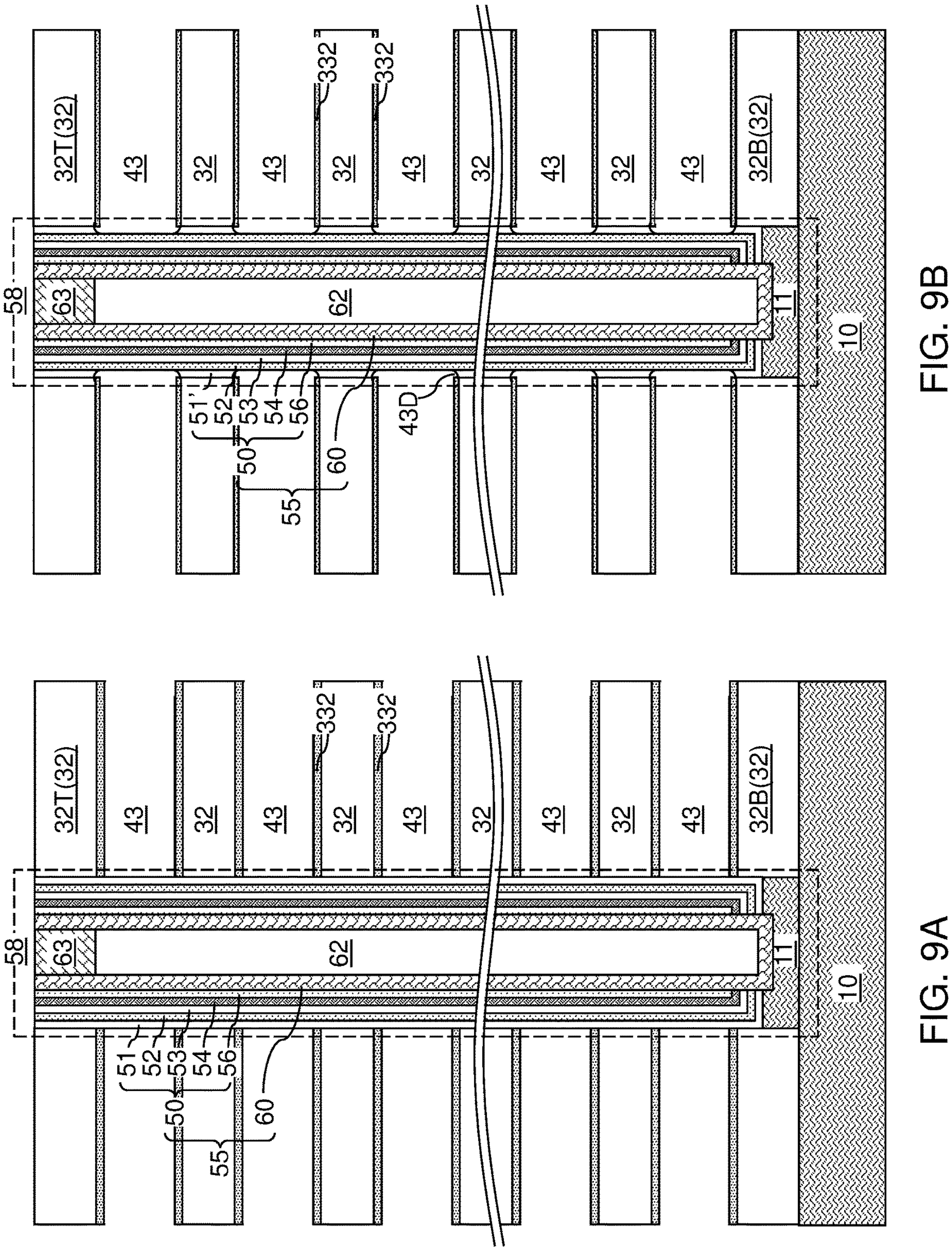
FIGS. 9A-9C are sequential vertical cross-sectional views of a region around a memory opening fill structure in a first configuration of the first exemplary structure during formation of electrically conductive layers according to the first embodiment of the present disclosure.
Figure 9C:
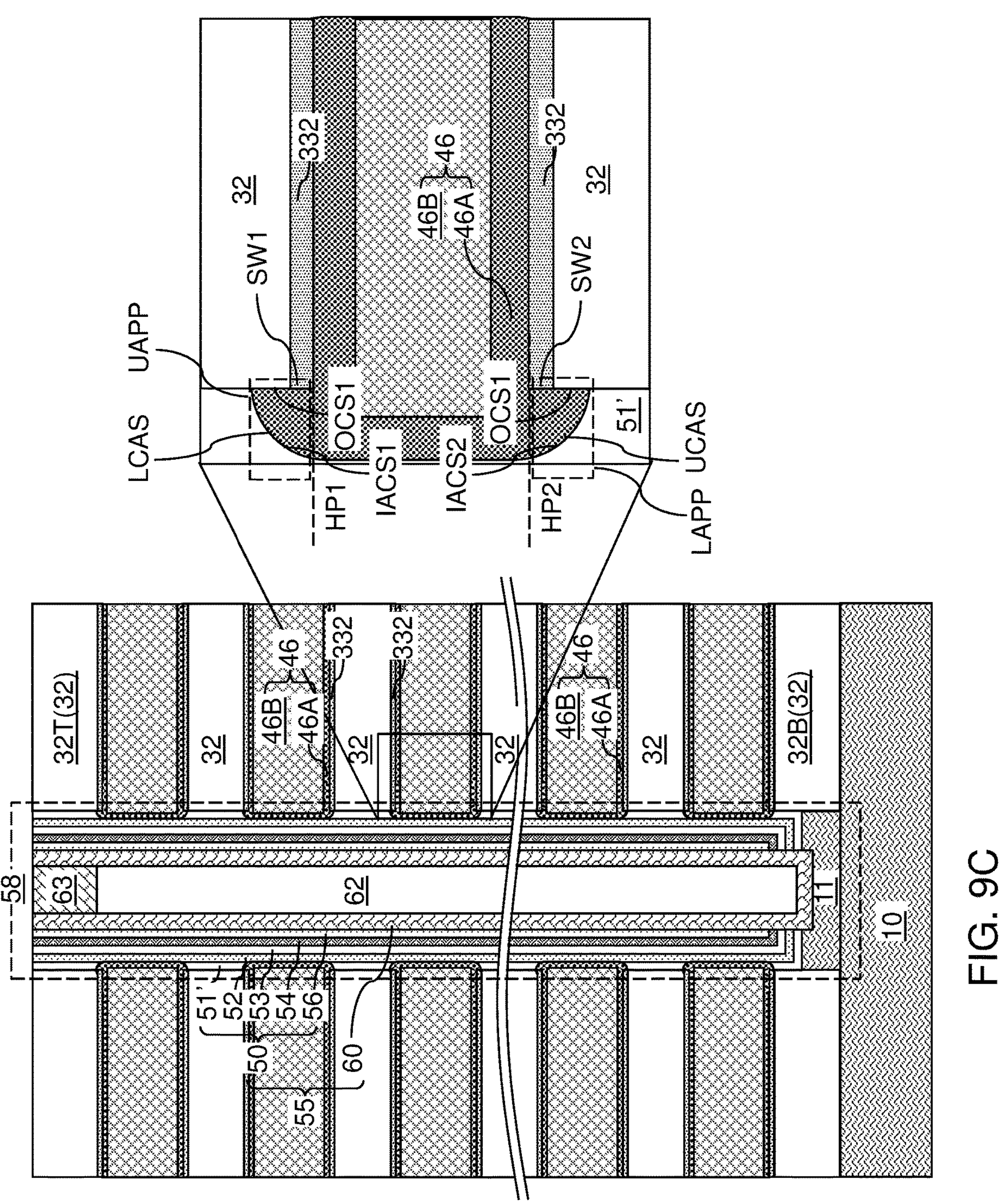

FIGS. 9A-9C are sequential vertical cross-sectional views of a region around a memory opening fill structure 58 in a first configuration of the first exemplary structure during formation of electrically conductive layers 46 according to the first embodiment of the present disclosure.

Referring to FIG. 9A, a region around a memory opening fill structure 58 in the first configuration of the first exemplary structure is illustrated after the processing steps of FIG. 8. The isotropic etch process that etches the sacrificial material layers 42 may be selective to the materials of the insulating layers 32, the silicon oxycarbide liners 332, and the silicon oxide liner 51.

Referring to FIG. 9B, an isotropic etch process that etches the material of the silicon oxide liner 51 is performed. The etch chemistry of the isotropic etch process is selected such that the isotropic etch process etches the material of the silicon oxide liner 51 (i.e., a silicon oxide material) at a higher etch rate than the material of the silicon oxycarbide liners 332. In other words, the isotropic etch process etches a material of the silicon oxide liner at a higher etch rate than materials of the first silicon oxycarbide liners 332 and the second silicon oxycarbide liners 332.

In an illustrative example, the silicon oxide liner 51 may comprise silicon dioxide, and the isotropic etch process may comprise dilute hydrofluoric acid or buffered hydrofluoric acid. An etch rate of a silicon oxycarbide material formed by chemical vapor deposition employing silane and carbon dioxide as precursor gases in 500:1 dilute hydrofluoric acid is about 2.2 nm/minute. An etch rate of silicon dioxide formed by decomposition of tetraethylorthosilicate glass in 500:1 dilute hydrofluoric acid is about 11.8 nm/minute. The ratio of the etch rate of the silicon oxycarbide material to the etch rate of the silicon oxide material is about 0.18 in this case. The use of buffered hydrofluoric acid as the etching liquid provides a ratio of about 0.48 between the etch rate of a silicon oxycarbide material and the etch rate of a silicon oxide material.

Generally, the etch rate of the silicon oxycarbide liners 322 may be significantly less than the etch rate of the silicon oxide material of the silicon oxide liner 51. In one embodiment, the etch rate of the silicon oxycarbide liners 322 is less than 50% of the etch rate of the silicon oxide material of the silicon oxide liner 51. In one embodiment, the etch rate of the silicon oxycarbide liners 322 is less than 20% of the etch rate of the silicon oxide material of the silicon oxide liner 51.

In one embodiment, the thickness of the silicon oxide liner 51, the thickness of the silicon oxycarbide liners 332, and the chemistry and the duration of the isotropic etch process can be selected such that cylindrical portions of the silicon oxide liner 51 are removed at each level of the backside recesses 43 without completely removing the silicon oxycarbide liners 332. Cylindrical segments of the outer sidewall of a dielectric metal oxide blocking dielectric layer 52 can be physically exposed to the backside recesses 43 around each memory opening fill structure 58. The silicon oxide liner 51 of each memory opening fill structure 58 can be divided into a plurality of discrete silicon oxide portions having a respective tubular configuration, which is herein referred to as a vertical stack of tubular silicon oxide spacers 51'.

Each of the first silicon oxycarbide liners 332 and the second silicon oxycarbide liners 332 may be thinned. In one embodiment, the thickness of each of the first silicon oxycarbide liners 332 and the second silicon oxycarbide liners 332 prior to the isotropic etch process may be in a range from 0.5 nm to 4 nm, and/or from 1.0 nm to 2.5 nm, and the thickness of each of the first silicon oxycarbide liners 332 and the second silicon oxycarbide liners 332 after the isotropic etch process may be in a range from 0.25 nm to 2 nm, and/or from 0.5 nm to 1.2 nm. Generally, the thickness decrease of each of the first silicon oxycarbide liners 332 and the second silicon oxycarbide liners 332 may be in a range from 25% to 75% of the initial thickness of a respective silicon oxycarbide liner 332.

Generally, portions of the silicon oxide liner 51 can be removed from around the backside recesses 43 by performing an isotropic etch process. Outer cylindrical surface segments of the dielectric metal oxide blocking dielectric layer 52 are exposed after the isotropic etch process. Remaining portions of the silicon oxide liner 51 comprise a vertical stack of tubular silicon oxide spacers 51'. The memory film 50 comprises a vertical stack of tubular silicon oxide spacers 51' in contact with the respective insulating layers 32.

The isotropic etch process etches the silicon oxide liner 51 isotropically. As such, concave annular surfaces are formed on each of the tubular silicon oxide spacers 51'. Annular divots 43D are formed by the isotropic etch process between the dielectric metal oxide blocking dielectric layer 52 and the first and second silicon oxycarbide liners 332. In one embodiment, a plurality of tubular silicon oxide spacers 51' may comprise a respective upper concave annular surface and a respective lower concave annular surface having a respective radius of curvature that is the same as or greater than the thickness of each tubular silicon oxide spacer 51' (i.e., the lateral distance between an inner cylindrical sidewall and an outer cylindrical sidewall).

Figure 11:
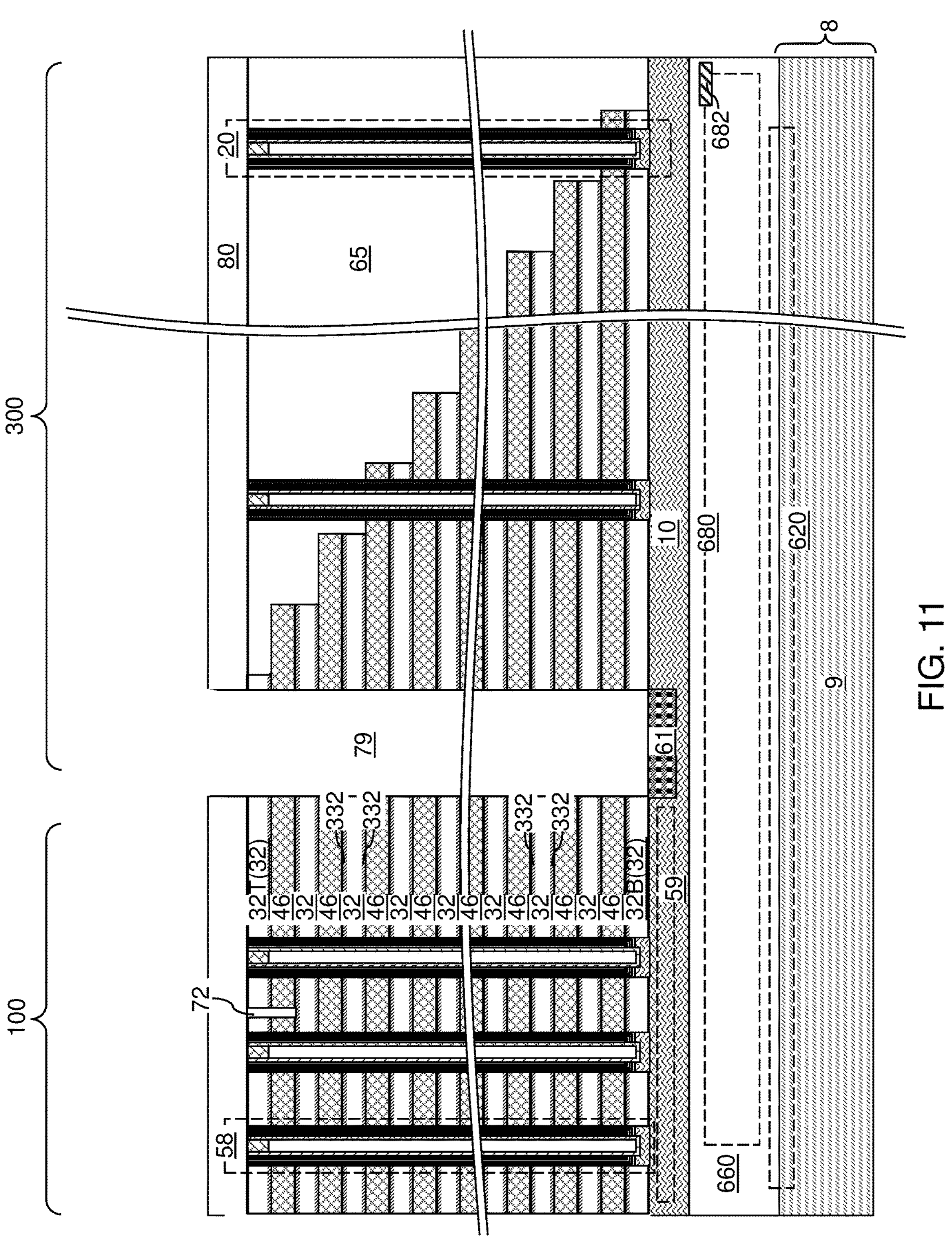
FIG. 11 is a schematic vertical cross-sectional view of the first exemplary structure after formation of the electrically conductive layers according to the first embodiment of the present disclosure.

Referring to FIGS. 9C and 11, at least one conductive material can be deposited in the backside recesses 43 and in the divots 43D by providing at least one reactant gas into the backside recesses 43 through the backside trenches 79. A metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the contact-level dielectric layer 80 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer can be formed on the sidewalls of each backside trench 79 and over the contact-level dielectric layer 80. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer includes a continuous portion of the metallic barrier layer 46A and a continuous portion of the metallic fill material layer 46B that are located in the backside trenches 79 or above the contact-level dielectric layer 80.

The deposited metallic material of the continuous electrically conductive material layer is etched back from the sidewalls of each backside trench 79 and from above the contact-level dielectric layer 80 by performing an isotropic etch process that etches the at least one conductive material of the continuous electrically conductive material layer. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each middle electrically conductive layer 46 can be a word line that functions as a common control gate electrode for the plurality of vertical memory devices. At least one uppermost electrically conductive layer 46 can be a drain side select gate electrode. At least one bottommost electrically conductive layer 46 can be a source side select gate electrode.

The electrically conductive layers 46 are formed directly on the outer cylindrical surface segments of the dielectric metal oxide blocking dielectric layer 52 of each memory opening fill structure 58. As shown in the inset in FIG. 9C, in one embodiment, the tubular silicon oxide spacers 51' comprise a respective upper concave annular surface UCAS and a respective lower concave annular surface LCAS, and the electrically conductive layers 46 are formed on the upper concave annular surface UCAS and the lower concave annular surface LCAS of the tubular silicon oxide spacers 51'.

The electrically conductive layers 46 have a hammer-type shape. At least one of the electrically conductive layer 46 comprises an upper annular protrusion portion UAPP that protrudes into the divot 43D above a first horizontal plane HP1 including an interface between an electrically conductive layer 46 and the overlying silicon oxycarbide liner 332, and a lower annular protrusion portion LAPP that protrudes into another divot 43D below a second horizontal plane HP2 including an interface between the electrically conductive layer 46 and the underlying silicon oxycarbide liner 332.

In one embodiment, the upper annular protrusion portion UAPP contacts a sidewall SW1 of an opening in the overlying silicon oxycarbide liner 332; the lower annular protrusion portion LAPP contacts a sidewall of an opening in the underlying silicon oxycarbide liner 332; and the memory opening fill structure 58 vertically extends through the opening in the overlying silicon oxycarbide liner 332 and through the opening in the underlying silicon oxycarbide liner 332. In one embodiment, the upper annular protrusion portion UAPP comprises a first inner annular convex surface IACS1 and a first outer cylindrical surface OCS1; and the lower annular protrusion portion LAPP comprises a second inner annular convex surface IACS2 and a second outer cylindrical surface OCS2.

In one embodiment, the memory film 50 in each memory opening fill structure 58 comprises a vertical stack of tubular silicon oxide spacers 51' in contact with a respective one of the insulating layers 32. In one embodiment, a plurality of the tubular silicon oxide spacers 51' comprises an upper concave annular surface UCAS that contacts a first electrically conductive layer 46 and further comprises a lower concave annular surface LCAS that contacts a second electrically conductive layer 46.

The memory film 50 includes a continuous memory material layer (e.g., charge storage layer) 54 which continuously extends through all of the electrically conductive layers 46. Since the insulating layers 32 are not replaced after formation, the insulating layers 32 do not embed a seam or an air gap therein.

FIGS. 10A-10E are sequential vertical cross-sectional views of a region around a memory opening fill structure 58 in a second configuration of the first exemplary structure during formation of electrically conductive layers 46 according to the first embodiment of the present disclosure.

Figures 10A, 10B:
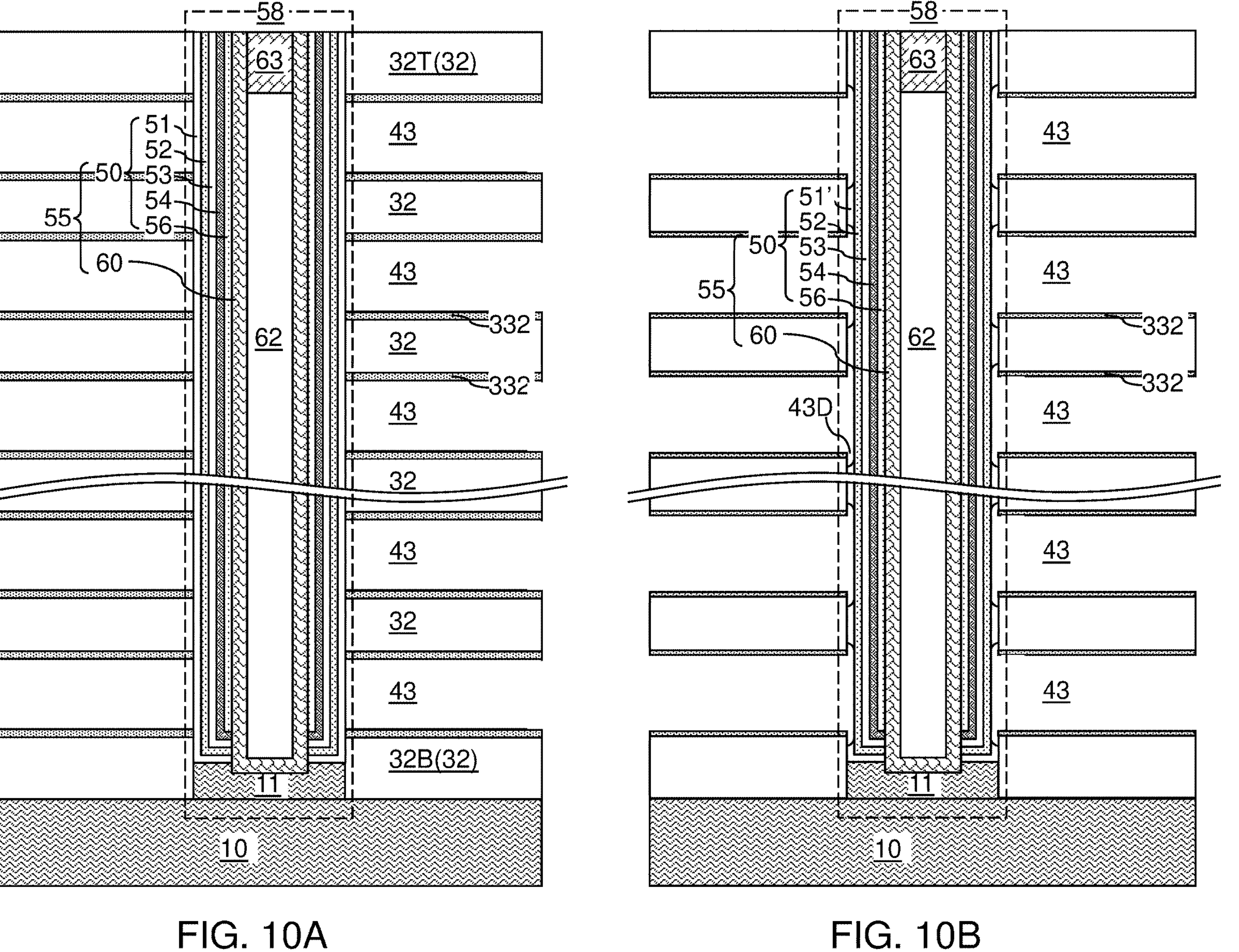
FIGS. 10A-10E are sequential vertical cross-sectional views of a region around a memory opening fill structure in a second configuration of the first exemplary structure during formation of electrically conductive layers according to the first embodiment of the present disclosure.

Referring to FIG. 10A, a region around a memory opening fill structure 58 in the second configuration of the first exemplary structure is illustrated after the processing steps of FIG. 8. The illustrated region of FIG. 10A can be the same as the illustrated region in FIG. 9A.

Referring to FIG. 10B, an isotropic etch process that etches the material of the silicon oxide liner 51 is performed in the same manner as described with reference to FIG. 9B. The illustrated region of FIG. 10B can be the same as the illustrated region in FIG. 9B.

Figures 10C, 10D:
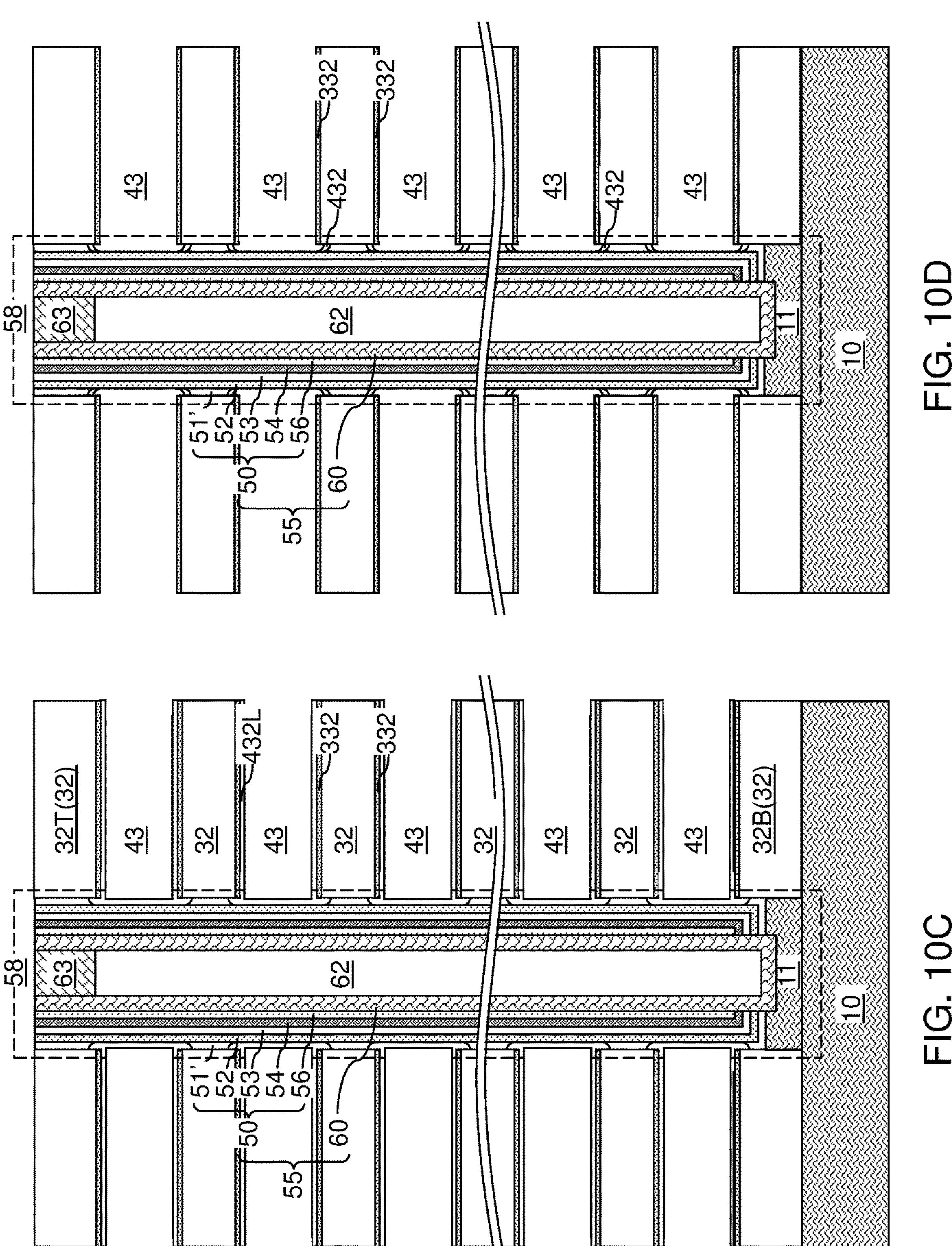

Referring to FIG. 10C, a conformal dielectric liner 432L is deposited in the annular divots 43D around the memory opening fill structures 58, on the physically exposed surfaces of the silicon oxycarbide spacers 332, and on the physically exposed surfaces of the insulating layers 32 and the contact-level dielectric layer 80. The conformal dielectric liner 432L may comprise any insulating material, such as silicon oxide. The thickness of the conformal dielectric liner 432L may be greater than one half of the thickness of the tubular silicon oxide spacers 51' so that the conformal dielectric liner 432L fills the annular divots 43D. For example, the thickness of the conformal dielectric liner 432L may range from 2 nm to 4 nm. In one embodiment, the conformal dielectric liner 432L comprises undoped silicate glass (e.g., silicon dioxide) or a doped silicate glass.

Referring to FIG. 10D, an isotropic recess etch process can be performed to etch back portions of the conformal dielectric liner 432L from outside the volumes of the annular divots 43D. Horizontally-extending surfaces of the silicon oxycarbide liners 332 can be physically exposed around each backside recess 43. The duration of the isotropic etch process can be selected to minimize collateral etching of the silicon oxycarbide liners 332 which function as etch stop layers. Each remaining portion of the conformal dielectric liner 432L that fills a respective annular divot 43D has an annular shape, and is herein referred to as a divot-fill annular dielectric spacer 432.

In one embodiment, each memory opening fill structure 58 comprises divot-fill annular dielectric spacers 432. Each tubular silicon oxide spacer 51' is in contact with a respective overlying one of the divot-fill annular dielectric spacers 432 and is in contact with a respective underlying one of the divot-fill annular dielectric spacers 432. In one embodiment, a plurality of the tubular silicon oxide spacers 51' comprise a respective upper concave annular surface and a respective lower concave annular surface.

Figure 10E:
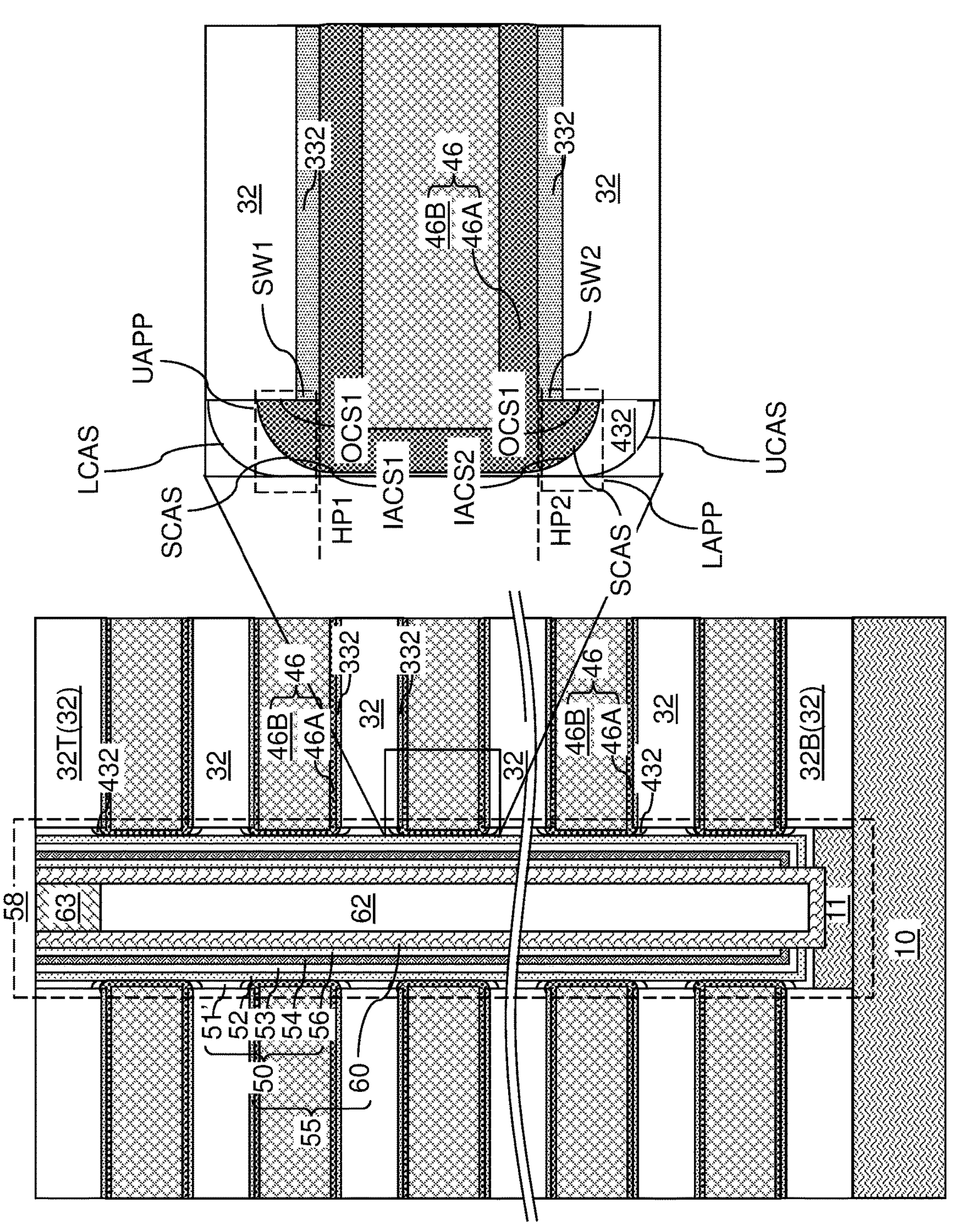

Referring to FIGS. 10E and 11, the processing steps described with reference to FIGS. 9C and 11 can be performed to form electrically conductive layers 46 in the backside recesses. The electrically conductive layers 46 may also have a hammer shape in this configuration. In the second configuration of the first exemplary structure, the electrically conductive layers 46 are formed on the concave annular surfaces SCAS of a pair of divot-fill annular dielectric spacers 432.

The electrically conductive layers 46 are formed directly on the outer cylindrical surface segments of the dielectric metal oxide blocking dielectric layer 52 of each memory opening fill structure 58. In one embodiment, the tubular silicon oxide spacers 51' comprise a respective upper concave annular surface UCAS and a respective lower concave annular surface LCAS.

At least one of the electrically conductive layers 46 comprises an upper annular protrusion portion UAPP that protrudes above a first horizontal plane HP1 including an interface between an electrically conductive layer 46 and the overlying silicon oxycarbide liner 332, and a lower annular protrusion portion LAPP that protrudes below a second horizontal plane HP2 including an interface between the electrically conductive layer 46 and the underlying silicon oxycarbide liner 332.

In one embodiment, the upper annular protrusion portion UAPP contacts a sidewall SW1 of an opening in the overlying silicon oxycarbide liner 332; the lower annular protrusion portion LAPP contacts a sidewall of an opening in the underlying silicon oxycarbide liner 332; and the memory opening fill structure 58 vertically extends through the opening in the overlying silicon oxycarbide liner 332 and through the opening in the underlying silicon oxycarbide liner 332. In one embodiment, the upper annular protrusion portion UAPP comprises a first inner annular convex surface IACS1 and a first outer cylindrical surface OCS1; and the lower annular protrusion portion LAPP comprises a second inner annular convex surface IACS2 and a second outer cylindrical surface OCS2.

In one embodiment, the memory film 50 in each memory opening fill structure 58 comprises a vertical stack of tubular silicon oxide spacers 51' in contact with a respective one of the insulating layers 32. In one embodiment, a plurality of the tubular silicon oxide spacers 51' comprises an upper concave annular surface UCAS that contacts a first divot-fill annular dielectric spacer 432 and further comprises a lower concave annular surface LCAS that contacts a divot-fill annular dielectric spacer 432.

Figure 12A:
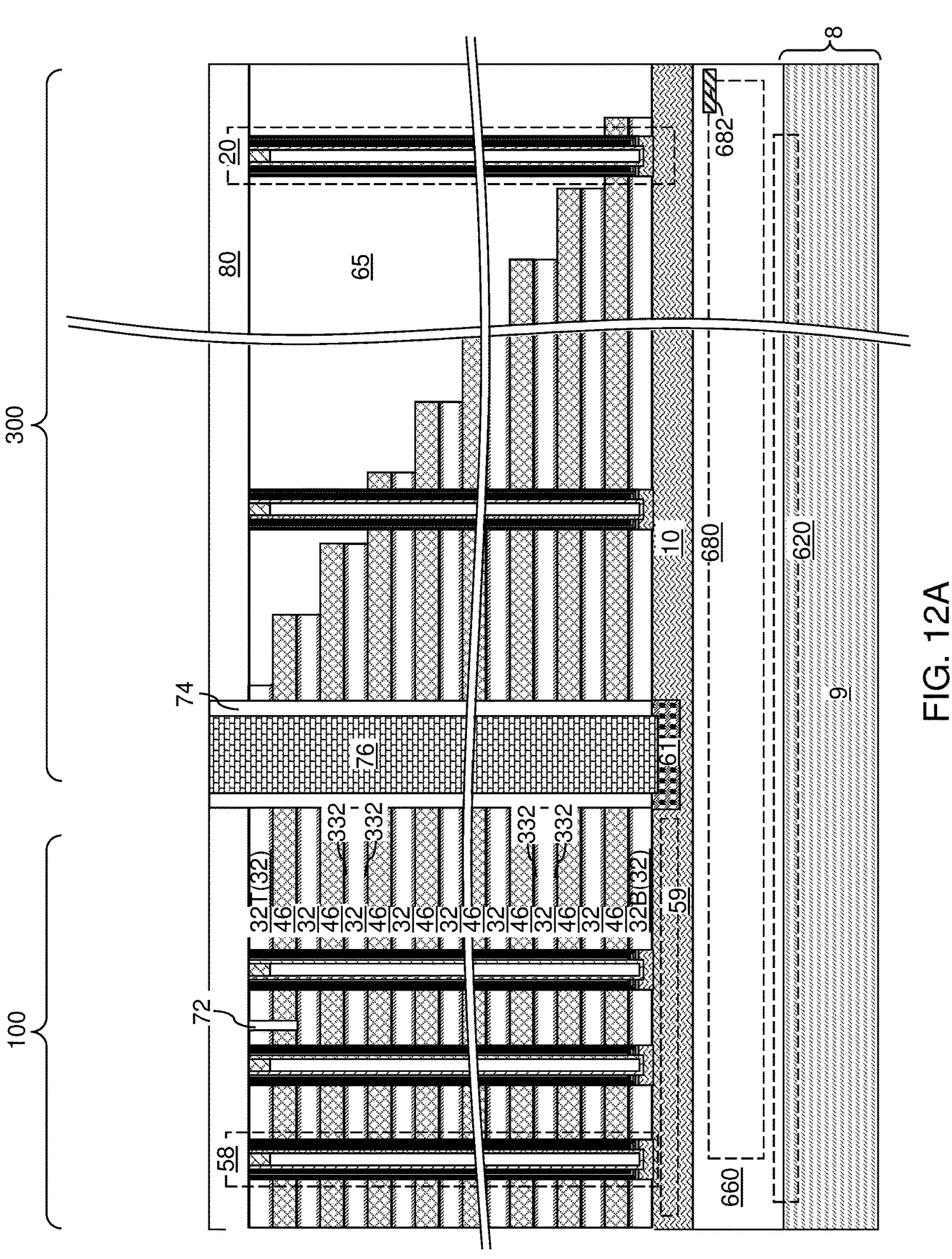
FIG. 12A is a schematic vertical cross-sectional view of the first exemplary structure after formation of backside trench fill structures according to the first embodiment of the present disclosure.
Figure 12B:
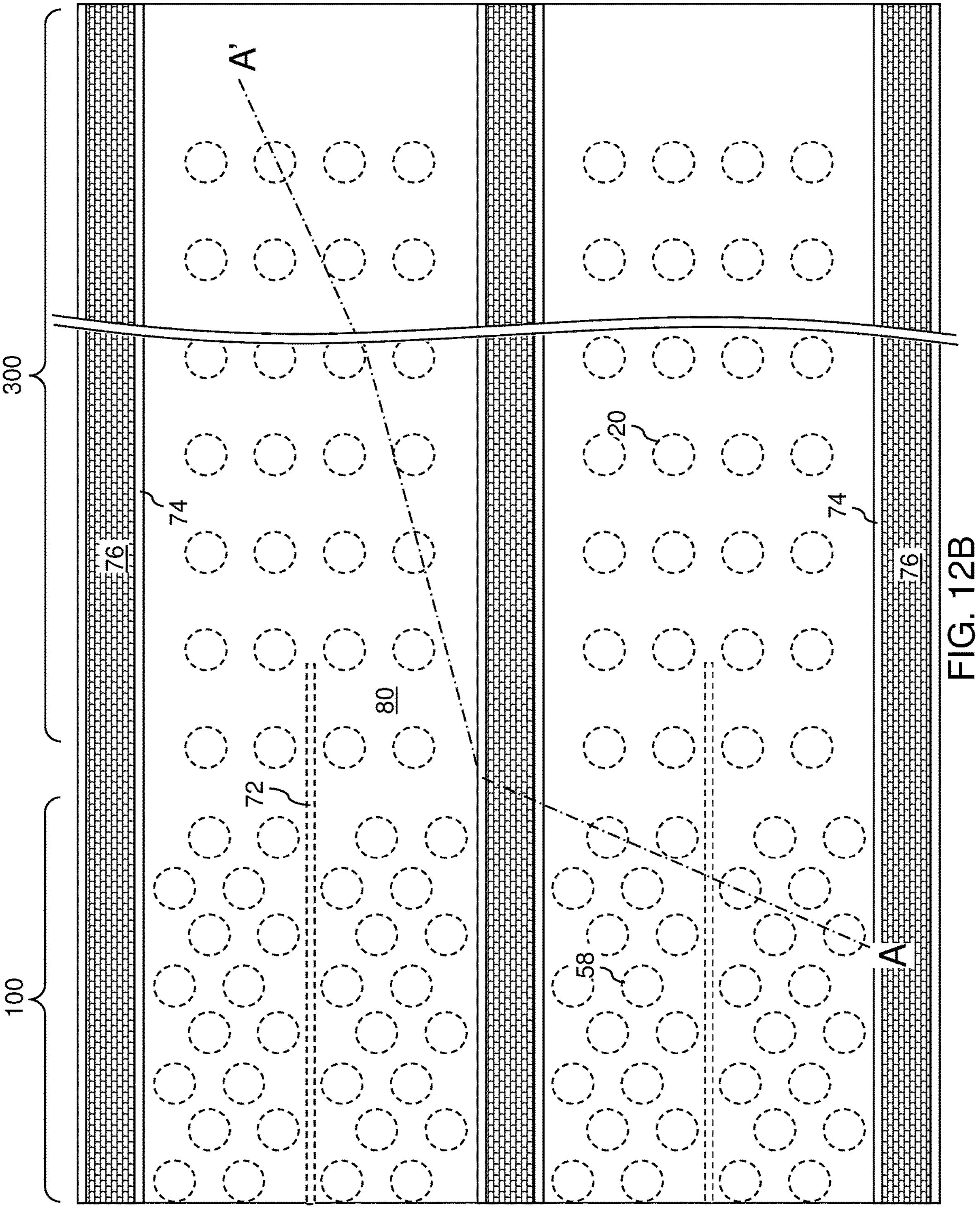
FIG. 12B is a top-down view of the first exemplary structure of FIG. 12A. The vertical plane A-A' is the plane of the schematic vertical cross-sectional view of FIG. 12A.

Referring to FIGS. 12A and 12B, an insulating material layer can be formed in the backside trenches 79 and over the contact-level dielectric layer 80 and an alternating stack of insulating layers 32 and electrically conductive layers 46 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact-level dielectric layer 80 and at the bottom of each backside trench 79. Each remaining portion of the insulating material layer constitutes an insulating spacer 74. A backside cavity is present within a volume surrounded by each insulating spacer 74.

A top surface of a source region 61 can be physically exposed at the bottom of each backside trench 79. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor material layer 10. Semiconductor channels (59, 60) extend between each source region 61 and a respective set of drain regions 63. The semiconductor channels (59, 60) include the vertical semiconductor channels 60 of the memory stack structures 55.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 80 overlying the alternating stack (32, 46) as a stopping layer. If chemical mechanical planarization (CMP) process is employed, the contact-level dielectric layer 80 can be employed as a CMP stopping layer. Each remaining continuous portion of the at least one conductive material in the backside trenches 79 constitutes a backside contact via structure 76. Each backside contact via structure 76 extends through the alternating stacks (32, 46), and contacts a top surface of a respective source region 61.

Generally, a backside contact via structure 76 can be formed within each of the backside trenches 79 after formation of the insulating spacers 74 by depositing and planarizing at least one conductive material in volumes of the backside trenches 79 that are not filled with the insulating spacers 74.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact a side of the lower portion of the semiconductor channel 60.

Figure 13A:
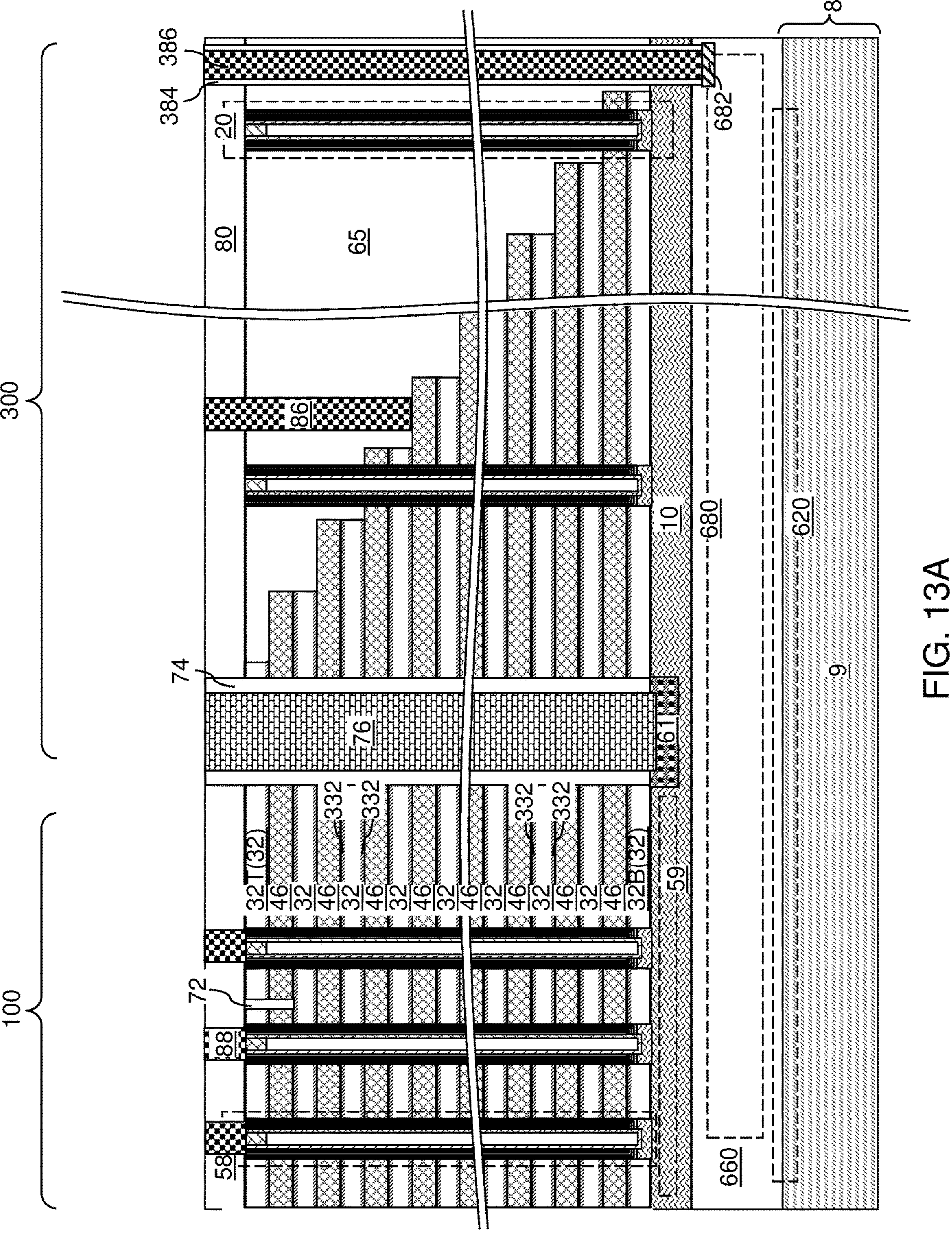
FIG. 13A is a schematic vertical cross-sectional view of the first exemplary structure after formation of additional contact via structures according to the first embodiment of the present disclosure.
Figure 13B:
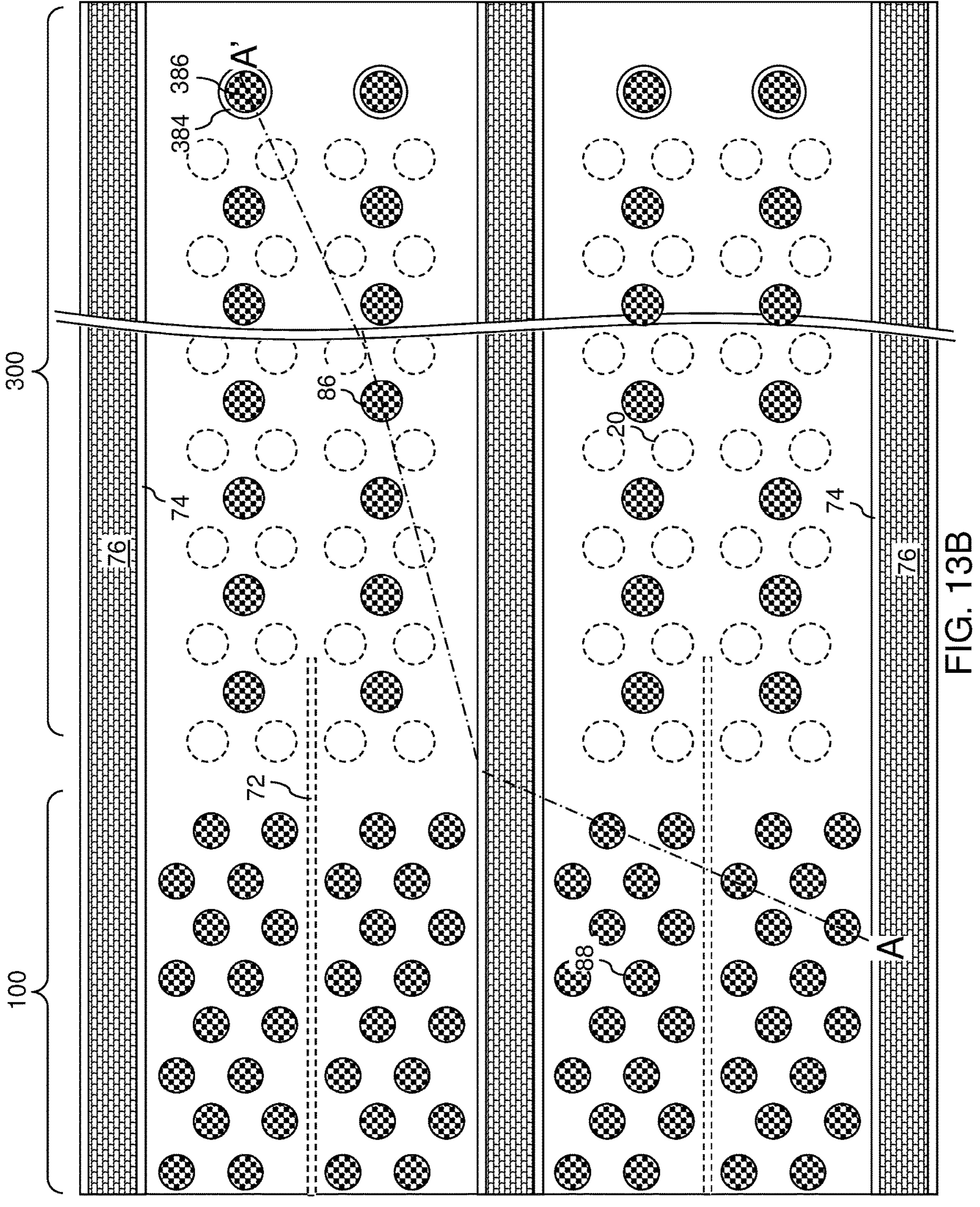
FIG. 13B is a top-down view of the first exemplary structure of FIG. 13A. The vertical plane A-A' is the plane of the schematic vertical cross-sectional view of FIG. 13A.

Referring to FIGS. 13A and 13B, additional contact via structures (88, 86, 386) can be formed through the contact-level dielectric layer 80, and optionally through the retro-stepped dielectric material portion 65. For example, drain contact via structures 88 can be formed through the contact-level dielectric layer 80 on each drain region 63. Layer contact via structures 86 can be formed on the electrically conductive layers 46 through the contact-level dielectric layer 80, and through the retro-stepped dielectric material portion 65. Through-memory-level connection via structures 386 can be formed through the retro-stepped dielectric material portion 65 and through the semiconductor material layer 10 directly on a respective metal pad 682. An insulating spacer 384 may be formed around each through-memory-level connection via structure 386 to electrically isolate the through-memory-level connection via structures 386 from the semiconductor material layer 10.

FIGS. 14A-14F are sequential schematic vertical cross-sectional views of a memory opening 49 within a second exemplary structure during formation of a memory opening fill structure 58 according to a second embodiment of the present disclosure.

Figures 14A, 14B:
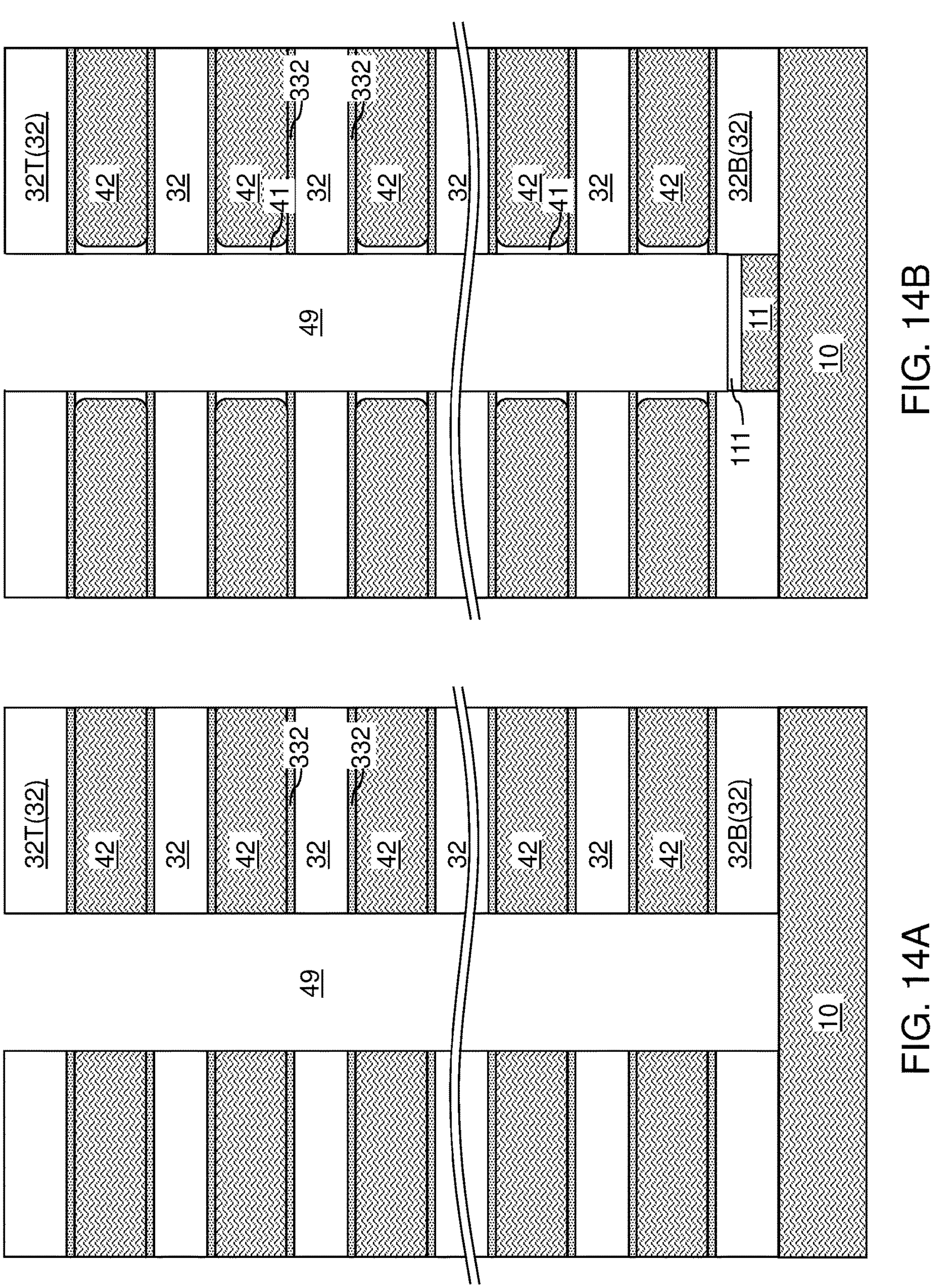
FIGS. 14A-14F are sequential schematic vertical cross-sectional views of a memory opening within a second exemplary structure during formation of a memory opening fill structure according to a second embodiment of the present disclosure.

Referring to FIG. 14A, a region around a memory opening 49 in a second exemplary structure according to the second embodiment of the present disclosure is illustrated. The second exemplary structure at this processing step may be the same as the first exemplary structure after the processing steps of FIGS. 4A and 4B. The sacrificial material layers 42 comprise silicon nitride.

Referring to FIG. 14B, the processing steps described with reference to FIG. 5B can be optionally performed to form an optional pedestal channel portion 11 at the bottom of each of the memory openings 49 and the support openings 19. An oxidation process is performed to convert physically exposed surface portions of the sacrificial material layers 42 around each memory opening 49 and around each support opening 19 into tubular silicon oxide portions 41. Surface portions of each sacrificial material layer 42 is oxidized into tubular silicon oxide portions 41. The oxidation process may comprise a thermal oxidation process or a plasma oxidation process. In one embodiment, the sacrificial material layers 42 comprise silicon nitride layers, and the tubular silicon oxide portions 41 either contain no nitrogen or contain a residual amount of nitrogen atoms (e.g., portions 41 may comprise silicon oxynitride). If the silicon oxide portions 41 contain a residual amount of nitrogen atoms, then each of the silicon oxide portions 41 may have a composition variation in which an atomic concentration of nitrogen atoms increases with a lateral distance from the memory opening 49. In other words, atomic concentration of residual nitrogen atoms within the tubular silicon oxide portions 41 may increase with a lateral distance from the void of a respective memory opening 49 or from the void of a respective support opening 19.

Each of the tubular silicon oxide portions 41 may have a uniform thickness except at top portions and at bottom portions. The top portions and the bottom portions of the tubular silicon oxide portions 41 may have a greater thickness near interfaces with a respective one of the silicon oxycarbide liners 332 because the oxycarbide material of the oxycarbide liners 332 and the silicon oxide material of the insulation layers 32 allow diffusion of oxygen atoms during the oxidation process. The thickness of the middle portion of each tubular silicon oxide portion 42 may be in a range from 1 nm to 12 nm, such as from 3 nm to 8 nm, although lesser and greater thicknesses may also be employed.

If the optional pedestal channel portion 11 is formed in the memory opening 49, then an optional planar semiconductor oxide plate 111 is formed at the bottom of each of the memory openings 49 and the support openings 19 by oxidation of physically exposed surface portions of the pedestal channel portion 11. The planar semiconductor oxide plate (e.g., silicon oxide plate) 111 is located on a top surface of the pedestal channel portion 11.

Figures 14C, 14D:
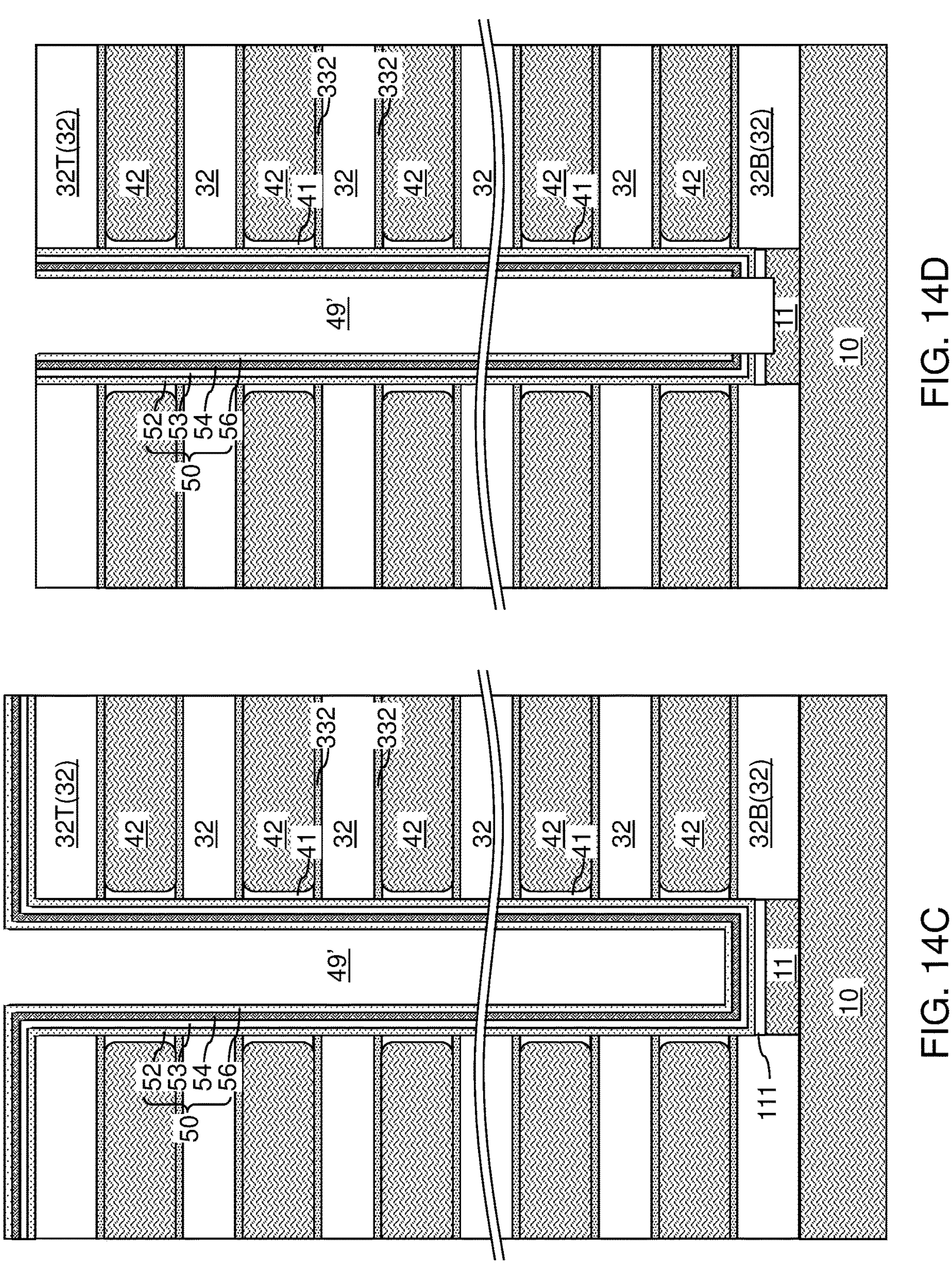

Referring to FIG. 14C, the processing steps described with reference to FIG. 5C can be performed, with the omission of the silicon oxide liner 51, to form a memory film 50 including, from bottom to top above the topmost insulating layer 32T and from outside to inside within each memory opening 49, a dielectric metal oxide blocking dielectric layer 52, a silicon oxide blocking dielectric layer 53, a memory material layer 54, and a tunneling dielectric layer 56.

Referring to FIG. 14D, the processing steps described with reference to FIG. 5D can be performed to remove horizontally-extending portions of the memory film 50, and to physically expose a surface of a pedestal channel portion 11 or a semiconductor material layer 10 at the bottom of each of the memory openings 49 and the support openings 19.

Figures 14E, 14F:
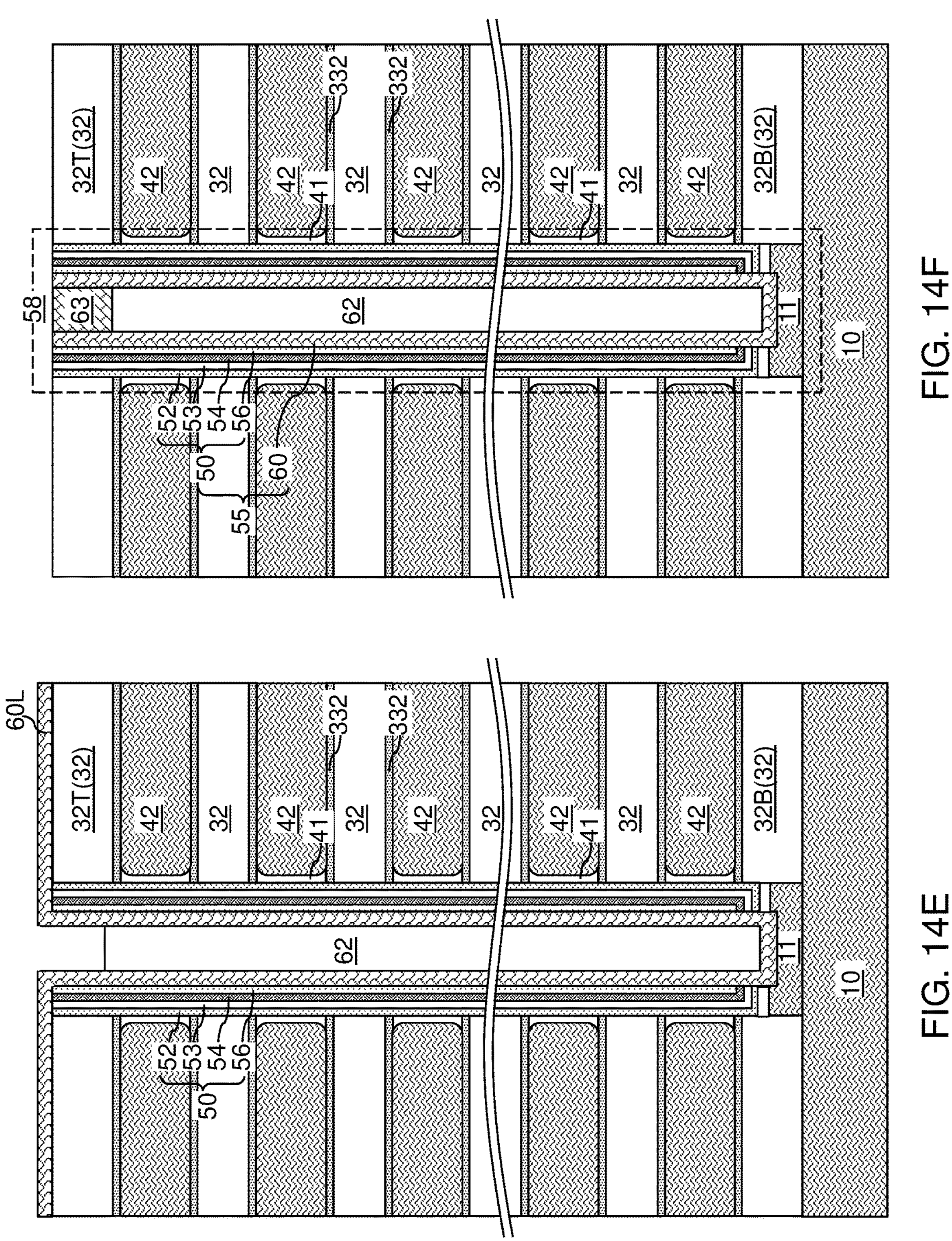

Referring to FIG. 14E, the processing steps described with reference to FIG. 5E can be performed to form a semiconductor channel layer 60L and a dielectric core 62 within each of the memory openings 49 and the support openings 19.

Referring to FIG. 14F, the processing steps described with reference to FIG. 5F can be performed to form a vertical semiconductor channel 60 and a drain region 63 in each of the memory openings 49 and the support openings 19. A memory opening fill structure 58 is formed in each memory opening 49, and a support pillar structure 20 is formed in each support opening 19. Each of the memory opening fill structures 58 comprises a memory film 50 that includes, from outside to inside, a dielectric metal oxide blocking dielectric layer 52, a silicon oxide blocking dielectric layer 53, a memory material layer 54, and the tunneling dielectric layer 56, and further comprises a vertical semiconductor channel 60 that is formed on the memory film 50.

Subsequently, the processing steps described with reference to FIGS. 7A and 7B can be performed to form a contact-level dielectric layer 80, backside trenches 79, and source regions 61.

The processing steps described with reference to FIGS. 8 and 9A can be performed to remove the sacrificial material layers 42 and to form the backside recesses 43.

Figures 15A, 15B:
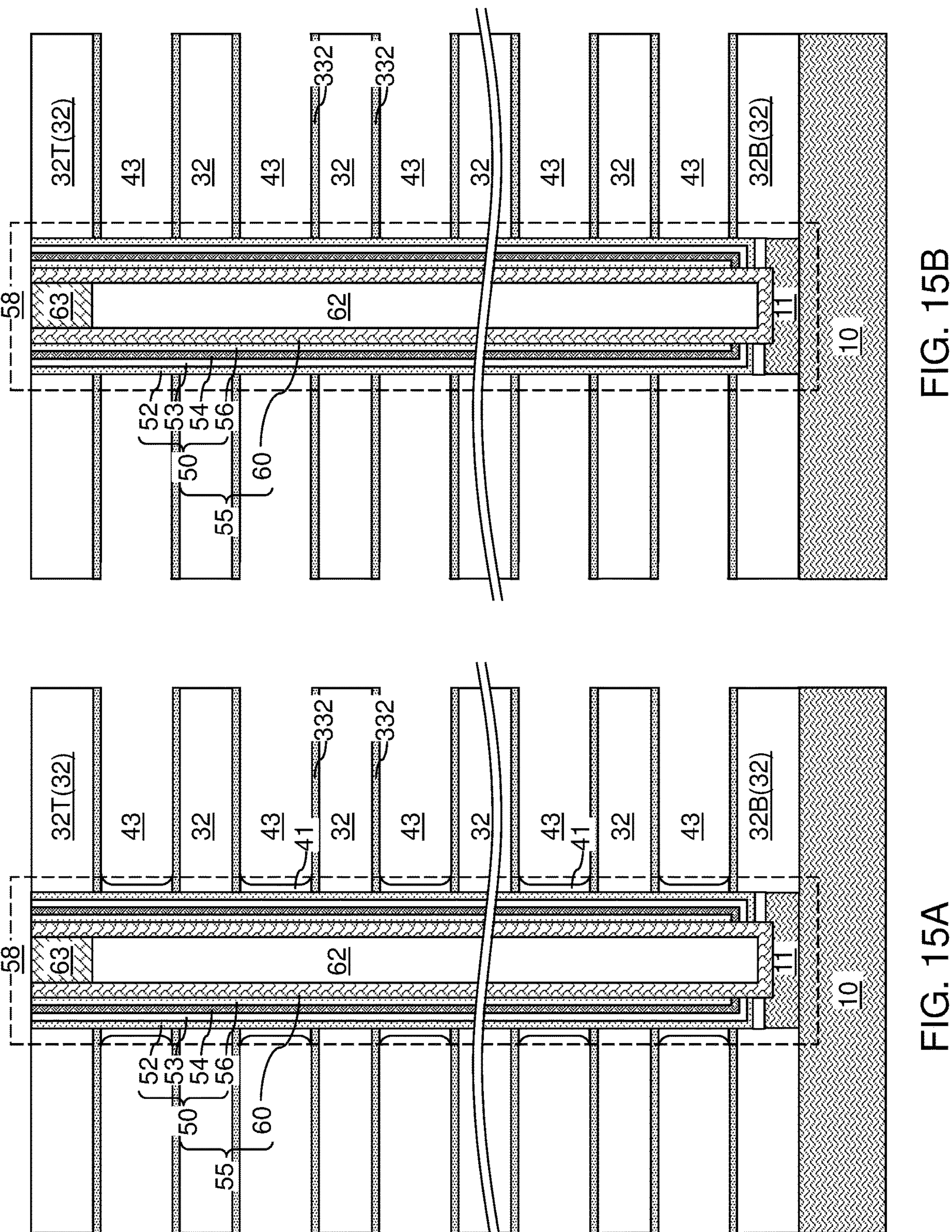
FIGS. 15A-15C are sequential vertical cross-sectional views of a region around a memory opening fill structure in the second exemplary structure during formation of electrically conductive layers according to the second embodiment of the present disclosure.
Figure 15C:
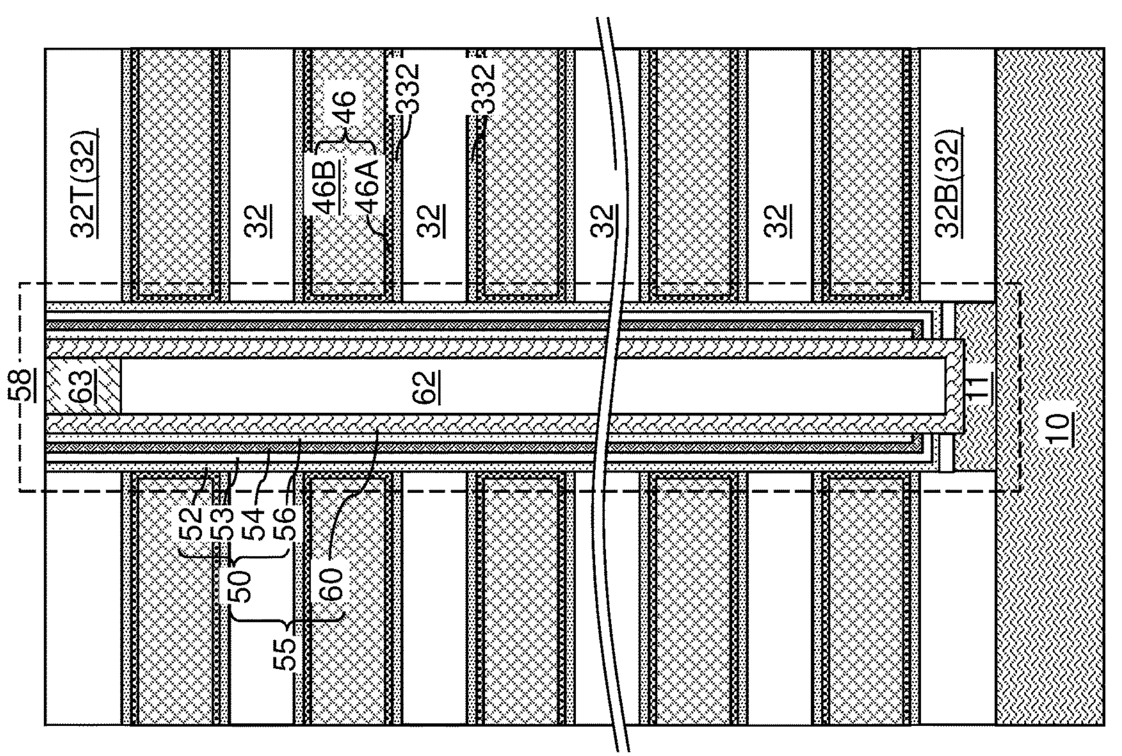

FIGS. 15A-15C are sequential vertical cross-sectional views of a region around a memory opening fill structure 58 in the second exemplary structure during formation of electrically conductive layers 46 according to the second embodiment of the present disclosure.

Referring to FIG. 15A, a region around a memory opening fill structure 58 in the first configuration of the first exemplary structure is illustrated after formation of the backside recesses 43. The isotropic etch process that etches the sacrificial material layers 42 may be selective to the materials of the insulating layers 32, the silicon oxycarbide liners 332, and the tubular silicon oxide portions 41. The backside recesses 43 can be formed by removing the sacrificial material layer 42 selective to the silicon oxycarbide liners 332 and the tubular silicon oxide portions 41.

Referring to FIG. 15B, an isotropic etch process that etches the material of the tubular silicon oxide portions 41 is performed. The tubular silicon oxide portions 41 can be etched selective to the dielectric metal oxide blocking dielectric layer 52. The etch chemistry of the isotropic etch process is selected such that the isotropic etch process etches the material of the tubular silicon oxide portions 41 (i.e., a silicon oxide material) at a higher etch rate than the material of the silicon oxycarbide liners 332.

In an illustrative example, the tubular silicon oxide portions 41 may comprise silicon oxide, and the isotropic etch process may comprise dilute hydrofluoric acid or buffered hydrofluoric acid. The etch rate of the silicon oxycarbide liners 322 may be significantly less than the etch rate of the silicon oxide material of the tubular silicon oxide portions 41. In one embodiment, the etch rate of the silicon oxycarbide liners 322 is less than 50% of the etch rate of the silicon oxide material of the tubular silicon oxide portions 41. In one embodiment, the etch rate of the silicon oxycarbide liners 322 is less than 20% of the etch rate of the silicon oxide material of the tubular silicon oxide portions 41.

The entirety of the tubular silicon oxide portions 41 can be removed without entirely removing the silicon oxycarbide liners 332. Cylindrical segments of the outer sidewall of a dielectric metal oxide blocking dielectric layer 52 can be physically exposed to the backside recesses 43 around each memory opening fill structure 58. Each of the first silicon oxycarbide liners 332 and the second silicon oxycarbide liners 332 may be thinned. In one embodiment, the thickness of each of the first silicon oxycarbide liners 332 and the second silicon oxycarbide liners 332 prior to the isotropic etch process may be in a range from 0.5 nm to 4 nm, and/or from 1.0 nm to 2.5 nm, and the thickness of each of the first silicon oxycarbide liners 332 and the second silicon oxycarbide liners 332 after the isotropic etch process may be in a range from 0.25 nm to 2 nm, and/or from 0.5 nm to 1.2 nm. Generally, the thickness decrease of each of the first silicon oxycarbide liners 332 and the second silicon oxycarbide liners 332 may be in a range from 25% to 75% of the initial thickness of a respective silicon oxycarbide liner 332.

Referring to FIG. 15C, the processing steps described with respective to FIG. 9C can be performed to form electrically conductive layers 46 in the backside recesses 43. In the second exemplary structure, the electrically conductive layers 46 can be formed directly on horizontally-extending surfaces of the silicon oxycarbide liners 332. In one embodiment, the electrically conductive layers 46 are formed directly on cylindrical outer surface segments of the dielectric metal oxide blocking dielectric layer 52. In one embodiment, each of the electrically conductive layers 46 has a respective uniform vertical thickness throughout. Each cylindrical surface of an electrically conductive layer 46 contacting a respective dielectric metal oxide blocking dielectric layer 52 may have an upper periphery that is adjoined to a horizontally-extending top surface of the electrically conductive layer 46 and a bottom periphery that is adjoined to a horizontally-extending bottom surface of the electrically conductive layer 46.

Subsequently, the processing steps described with reference to FIGS. 12A and 12B, and the processing steps described with reference to FIGS. 13A and 13B can be performed.

Referring to all drawings and according to various embodiments of the present disclosure, a memory device comprises: an alternating stack (32, 46) of insulating layers 32 and electrically conductive layers 46, wherein a first electrically conductive layer 46 of the electrically conductive layers 46 is in contact with an underlying silicon oxycarbide liner 332 and with an overlying silicon oxycarbide liner 332; a memory opening 49 vertically extending through the alternating stack (32, 46); and a memory opening fill structure 58 located in the memory opening 49 and comprising a vertical semiconductor channel 60 and a memory film comprising a continuous memory material layer 54 which continuously extends through the entire alternating stack.

In one embodiment, the memory film 50 comprises, from outside to inside, a dielectric metal oxide blocking dielectric layer 52, a silicon oxide blocking dielectric layer 53, the continuous memory material layer 54 and a tunneling dielectric layer 56.

In one embodiment, the first electrically conductive layer 46 comprises: an upper annular protrusion portion UAPP that protrudes above a first horizontal plane HP1 including an interface between the first electrically conductive layer 46 and the overlying silicon oxycarbide liner 332; and a lower annular protrusion portion LAPP that protrudes below a second horizontal plane HP2 including an interface between the first electrically conductive layer 46 and the underlying silicon oxycarbide liner 332. In one embodiment, the upper annular protrusion portion UAPP contacts a sidewall SW1 of an opening in the overlying silicon oxycarbide liner 332; the lower annular protrusion portion LAPP contacts a sidewall of an opening in the underlying silicon oxycarbide liner 332; and the memory opening fill structure 58 vertically extends through the opening in the overlying silicon oxycarbide liner 332 and through the opening in the underlying silicon oxycarbide liner 332. In one embodiment, the upper annular protrusion portion UAPP comprises a first inner annular convex surface IACS1 and a first outer cylindrical surface OCS1; and the lower annular protrusion portion LAPP comprises a second inner annular convex surface IACS2 and a second outer cylindrical surface OCS2.

In one embodiment, the memory film 50 comprises a vertical stack of tubular silicon oxide spacers 51' in contact with a respective one of the insulating layers 32. In one embodiment, one the tubular silicon oxide spacers 51' comprises an upper concave annular surface UCAS that contacts the first electrically conductive layer 46 and further comprises a lower concave annular surface LCAS that contacts a second electrically conductive layer 46 of the electrically conductive layers 46. In one embodiment, the memory opening fill structure 58 comprises divot-fill annular dielectric spacers 432; and each tubular silicon oxide spacer 51' is in contact with a respective overlying one of the divot-fill annular dielectric spacers 432 and is in contact with a respective underlying one of the divot-fill annular dielectric spacers 432.

In one embodiment, the overlying silicon oxycarbide liner 332 is in contact with a bottom surface of an overlying insulating layer 32 of the insulating layers 32; and the underlying silicon oxycarbide liner 332 is in contact with a top surface of an underlying insulating layer 32 of the insulating layers 32.

In one embodiment, the insulating layers 32 do not embed a seam or an airgap therein. In one embodiment, each of the electrically conductive layers 46 has a respective uniform vertical thickness throughout.

The various embodiments of the present disclosure provide electrically conductive layers 46 having less or no corner rounding around memory opening fill structures 58. The electrically conductive layers 46 may comprise a respective pair of annular protrusions or orthogonal angular corners at an interface with a dielectric metal oxide blocking dielectric layers 52. The decreased or eliminated corner rounding reduces short channel effects and improves the control gate electrode controllability and control gate electrode length adjacent to the memory film 50.

Figure 16:
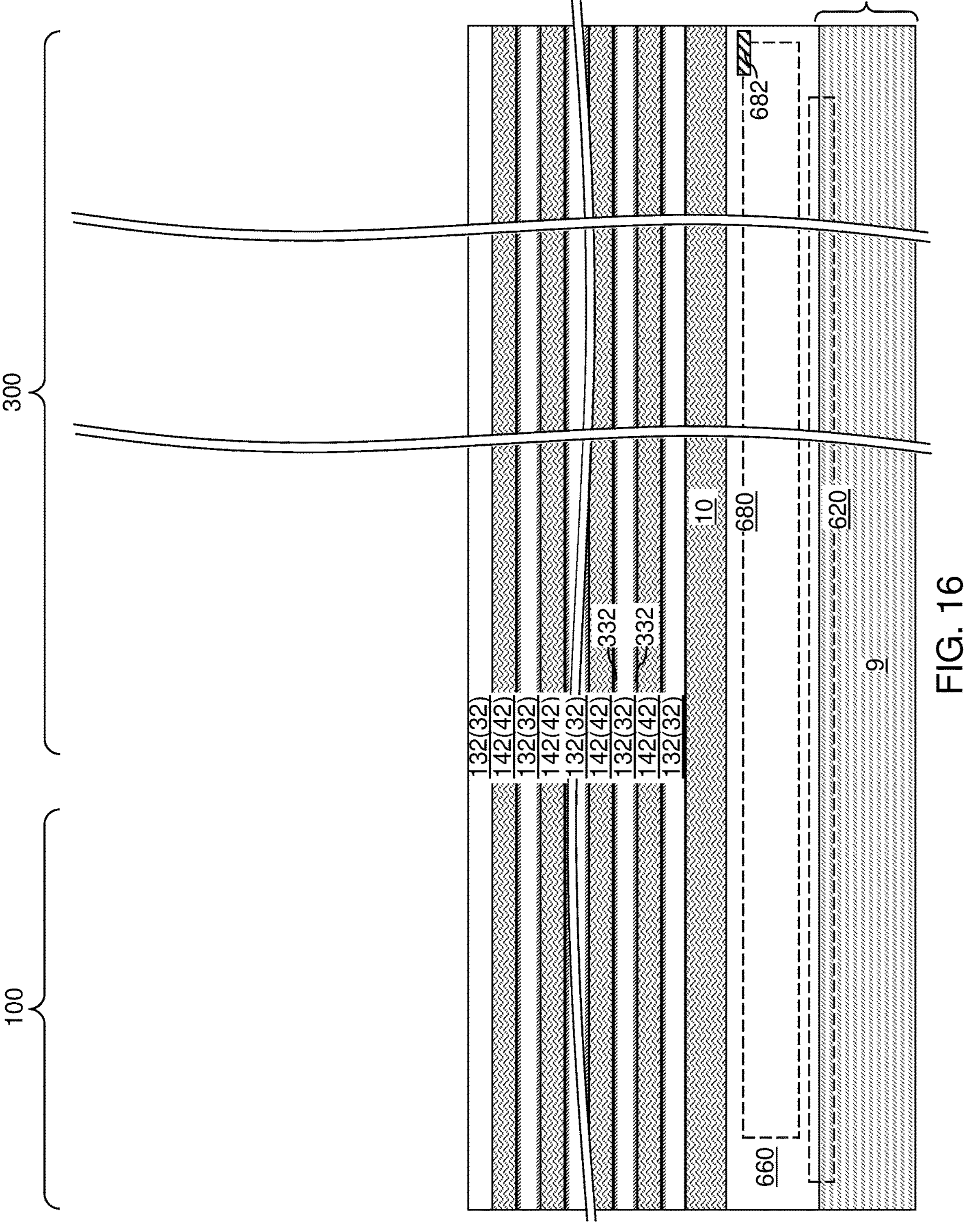
FIG. 16 is a vertical cross-sectional view of a third exemplary structure after formation of a first vertical repetition of multiple instances of a repetition unit of a first insulating layer, a first silicon oxycarbide liner, a first sacrificial material layer, and a second silicon oxycarbide liner with an omission of a topmost silicon oxynitride liner according to a third embodiment of the present disclosure.

Referring to FIG. 16, a third exemplary structure according to a third embodiment of the present disclosure can be derived from the first exemplary structure illustrated in FIG. 1 by omitting formation of at least one instance of a silicon oxycarbide liner 332 in the first exemplary structure of FIG. 1. An additional vertical repetition (shown in FIG. 21) of multiple instances of a first repetition unit is subsequently formed above the structure illustrated in FIG. 16. As such, the insulating layers 32 in the first exemplary structure of FIG. 1 are referred to as first-tier insulating layers 132 in the third exemplary structure of FIG. 16, the sacrificial material layers 42 in the first exemplary structure of FIG. 1 are referred to as first-tier sacrificial material layers 142 in the third exemplary structure of FIG. 16, and the vertical repetition of the multiple instances of the first repetition unit in the first exemplary structure of FIG. 1 is referred to as a first vertical repetition of multiple instances of a first repetition unit. Each instance of the first repetition unit in the third exemplary structure includes a first-tier insulating layer 132, a first silicon oxycarbide liner 332, a first-tier sacrificial material layer 142, and a second silicon oxycarbide liner 332 with an omission of a topmost silicon oxynitride liner according to a third embodiment of the present disclosure.

According to the third embodiment of the present disclosure, at least one instance of a silicon oxycarbide liner 332 in the third exemplary structure is omitted such that at least one (e.g., the topmost) first-tier sacrificial material layer 142 is in direct contact with one of the first-tier insulating layers 132 and is in direct contact with one of the silicon oxycarbide liners 332. In other words, at least one first-tier sacrificial material layer 142 is provided such that a silicon oxycarbide liner 332 is interposed between each such first-tier sacrificial material layer 142 and a respective first neighboring first-tier insulating layer 132, and each such first-tier sacrificial material layer 142 is direct contact with a second first-tier insulating layer 132.

In the illustrated example of FIG. 16, a silicon oxycarbide liner 332 is interposed between a topmost first-tier sacrificial material layer 142 and a second from the top first-tier insulating layer 132, while the topmost first-tier sacrificial material layer 142 is direct contact with the topmost first-tier insulating layer 132. Thus, the topmost first-tier sacrificial material layer 142 has a first (e.g., bottom) major horizontal surface which contacts a respective silicon oxycarbide liner 332 and an opposing second (e.g., top) major horizontal surface which contacts a respective (e.g., topmost) first-tier insulating layer (e.g., silicon oxide layer) 132. Specifically, the silicon oxycarbide liners 332 may be omitted directly below and directly above the joint region between the first and second device tiers, as will be described in more detail below with respect to FIG. 21.

A first alternating stack of first-tier insulating layers 132 and first-tier sacrificial material layers 142 is formed in the first tier such that silicon oxycarbide liners 332 are interposed between a majority of neighboring pairs of first-tier insulating layers 132 and first-tier sacrificial material layers 142, and are not present between a minority of neighboring pairs of first-tier insulating layers 132 and first-tier sacrificial material layers 142. The set of all layers overlying the semiconductor material layer 10 is herein referred to as first-tier material layers (132, 142, 332).

While an embodiment is described in which only one of the first-tier sacrificial material layers 142 is in direct contact with one of the first-tier insulating layers 132 and one of the silicon oxycarbide layers 332, embodiments are expressly contemplated herein in which multiple first-tier sacrificial material layers 142 are in direct contact with a respective first-tier insulating layer 132 and a respective silicon oxycarbide layer 332.

Figure 17:
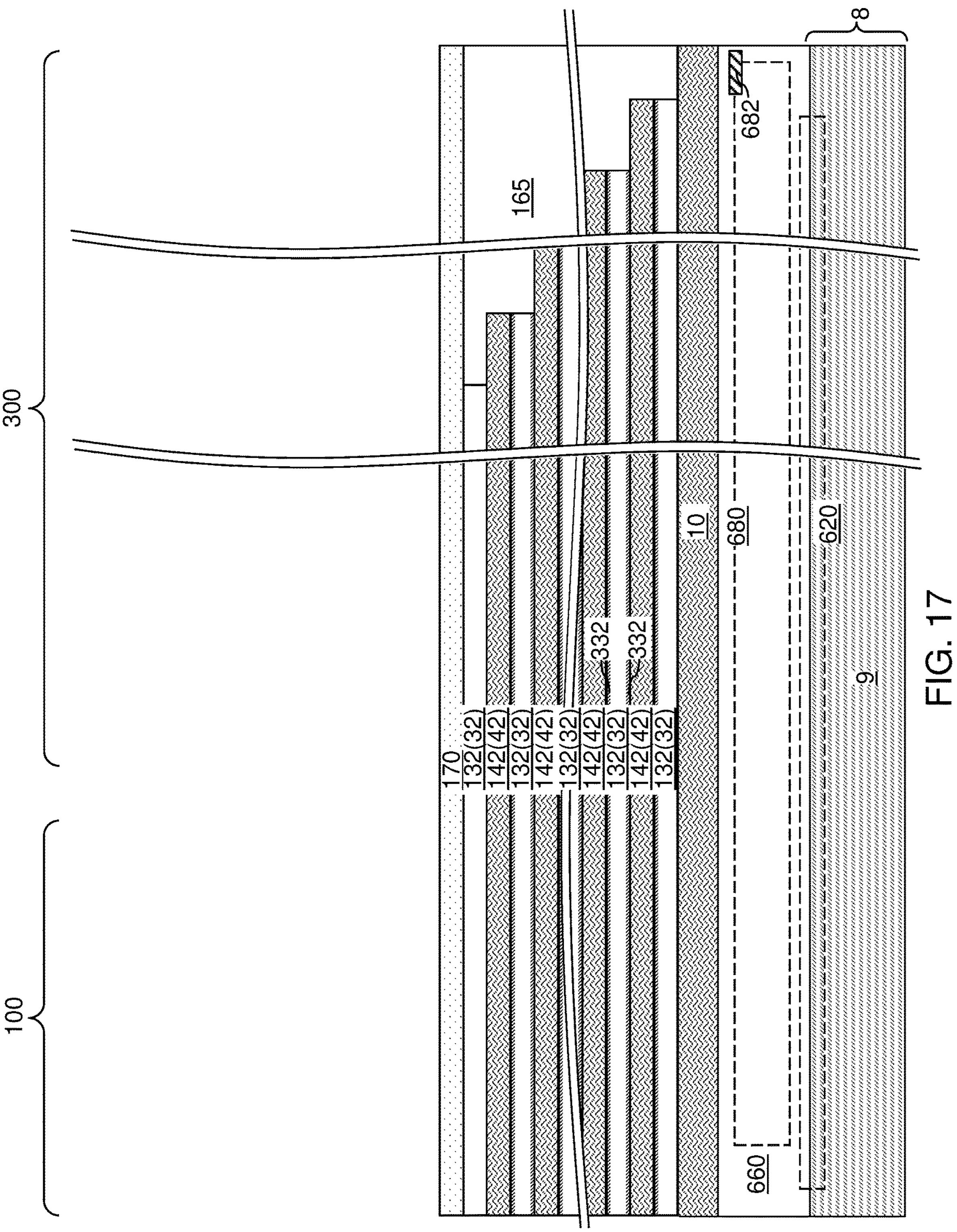
FIG. 17 is a vertical cross-sectional view of the third exemplary structure after formation of first stepped surfaces, a first retro-stepped dielectric material portion, and an inter-tier dielectric layer according to the third embodiment of the present disclosure.

Referring to FIG. 17, the processing steps described with reference to FIG. 2 can be performed to form stepped surfaces in the contact region 300. The stepped surfaces formed on the first-tier material layers (132, 142, 332) are herein referred to as first stepped surfaces. The processing steps described with reference to FIG. 3 can then be performed to form a retro-stepped dielectric material portion, which is herein referred to as a first retro-stepped dielectric material portion 165.

Subsequently, a dielectric material layer composed of and/or consisting essentially of silicon oxide (e.g., silicon dioxide) can be formed over the first-tier material layers (132, 142, 332) and the first retro-stepped dielectric material portion 165. The dielectric material layer is herein referred to as an inter-tier dielectric layer 170. The thickness of the inter-tier dielectric layer 170 may be in a range from 50 nm to 250 nm, although lesser and greater thicknesses may also be employed.

Figure 18A:
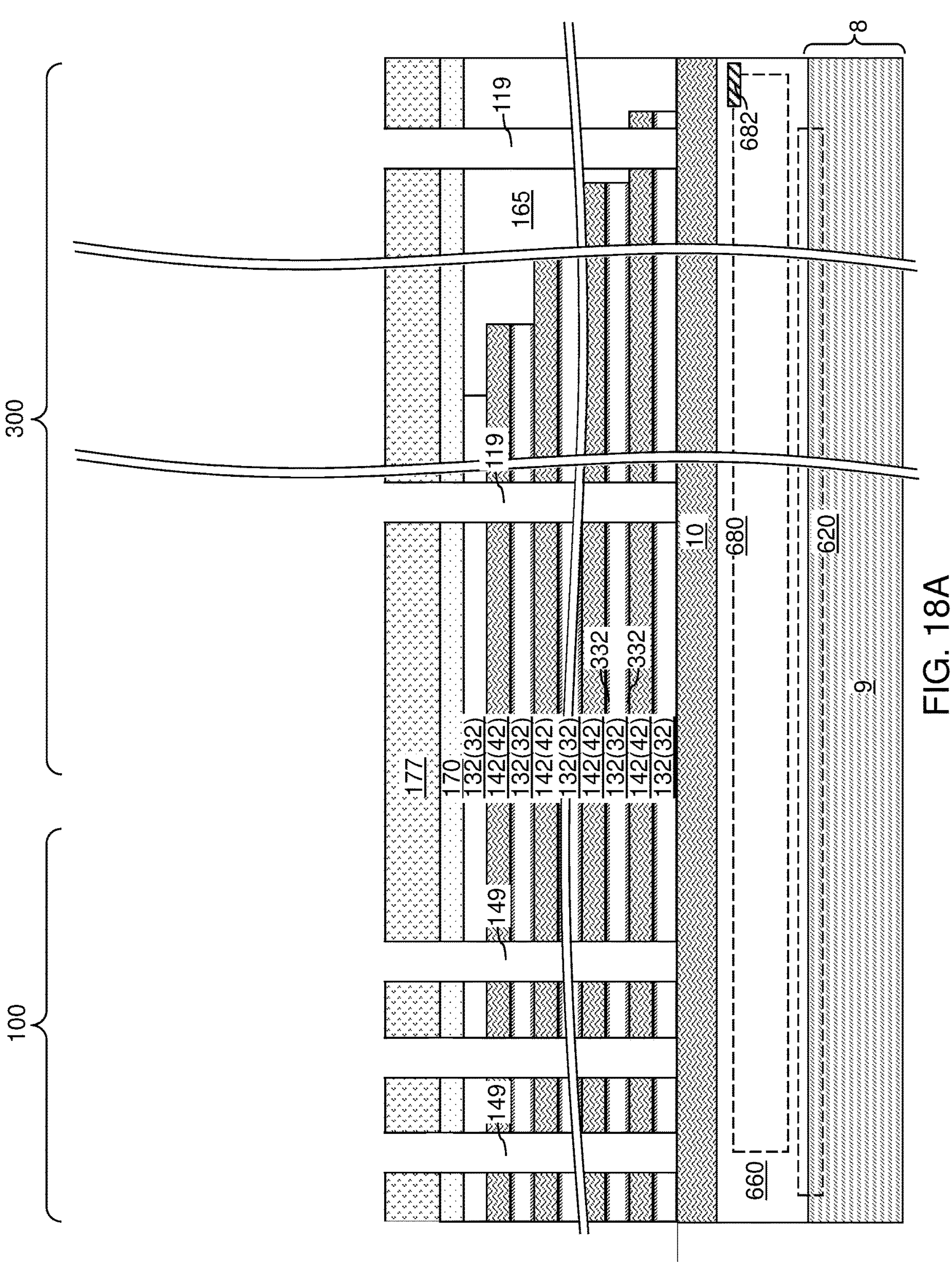
FIG. 18A is a vertical cross-sectional view of the third exemplary structure after formation of first-tier memory openings and first-tier support openings according to the third embodiment of the present disclosure.
Figure 18B:
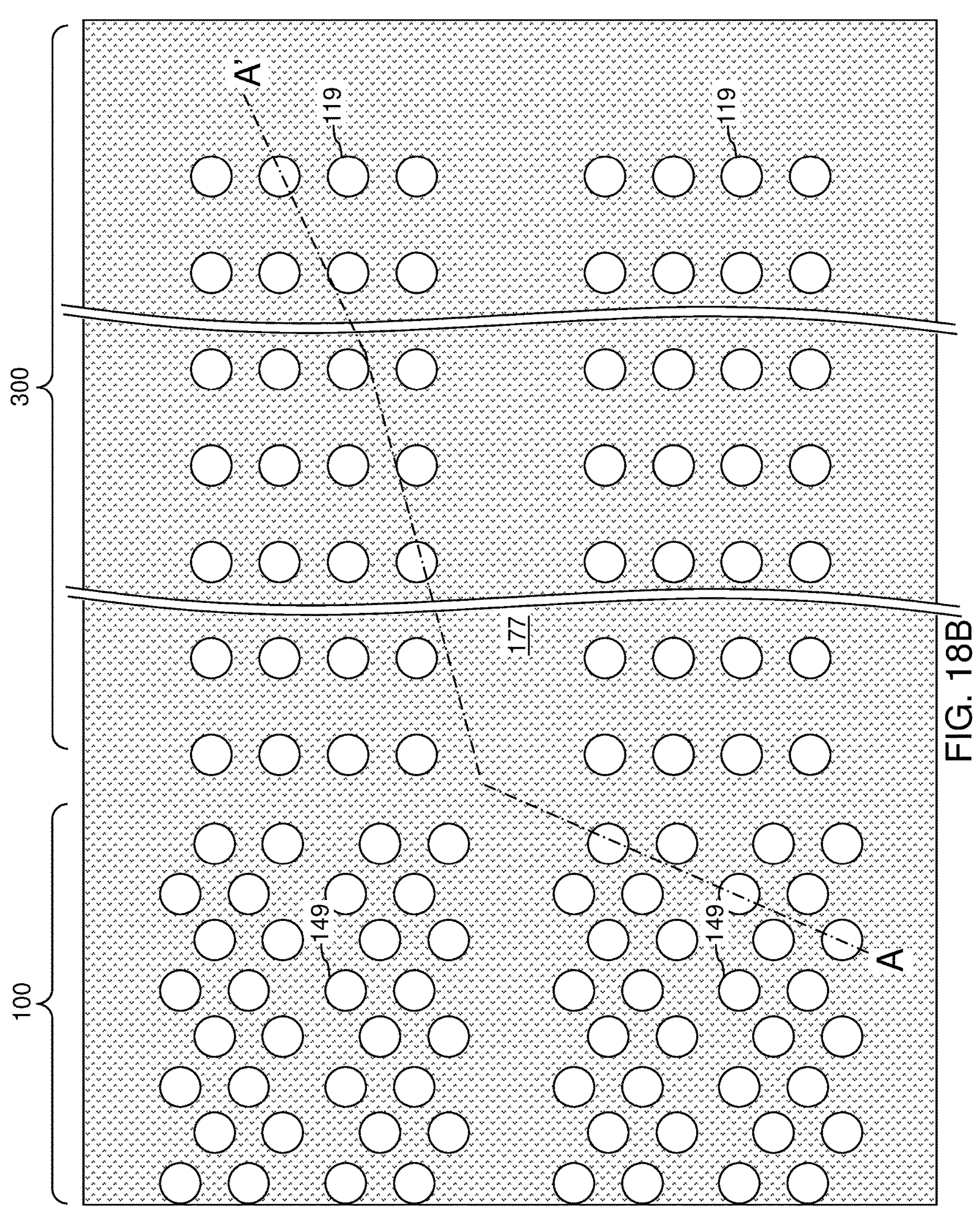
FIG. 18B is a top-down view of the third exemplary structure of FIG. 18A. The hinged vertical plane A-A' is the plane of the vertical cross-sectional view of FIG. 18A.

Referring to FIGS. 18A and 18B, a lithographic material stack (not shown) including at least a photoresist layer can be formed over the inter-tier dielectric layer 170, and can be lithographically patterned to form openings therein. The openings include a first set of openings formed in the memory array region 100 and a second set of openings formed in the contact region 300. The pattern in the lithographic material stack can be transferred through the inter-tier dielectric layer 170, the first-tier material layers (132, 142, 332), and the first retro-stepped dielectric material portion 165 by at least one anisotropic etch that employs the patterned lithographic material stack as an etch mask. Portions of the inter-tier dielectric layer 170, the first-tier material layers (132, 142, 332), and the first retro-stepped dielectric material portion 165 underlying the openings in the patterned lithographic material stack are etched to form first-tier memory openings 149 and first-tier support openings 119. The first-tier memory openings 149 are formed through the inter-tier dielectric layer 170 and each layer in the first-tier material layers (132, 142, 332) in the memory array region 100. The first-tier support openings 119 are formed through the inter-tier dielectric layer 170 and each layer in the first-tier material layers (132, 142, 332) in the contact region 300. The patterned lithographic material stack can be subsequently removed, for example, by ashing.

The first-tier memory openings 149 and the first-tier support openings 119 can extend from the top surface of the inter-tier dielectric layer 170 to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each first-tier memory opening 149 and each first-tier support opening 119. Each of the first-tier memory openings 149 and the first-tier support openings 119 may include a sidewall (or a plurality of sidewalls) that extends substantially perpendicular to the topmost surface of the semiconductor material layer 10. A two-dimensional array of first-tier memory openings 149 can be formed in the first-tier memory array region 100. A two-dimensional array of first-tier support openings 119 can be formed in the contact region 300.

Figure 19:
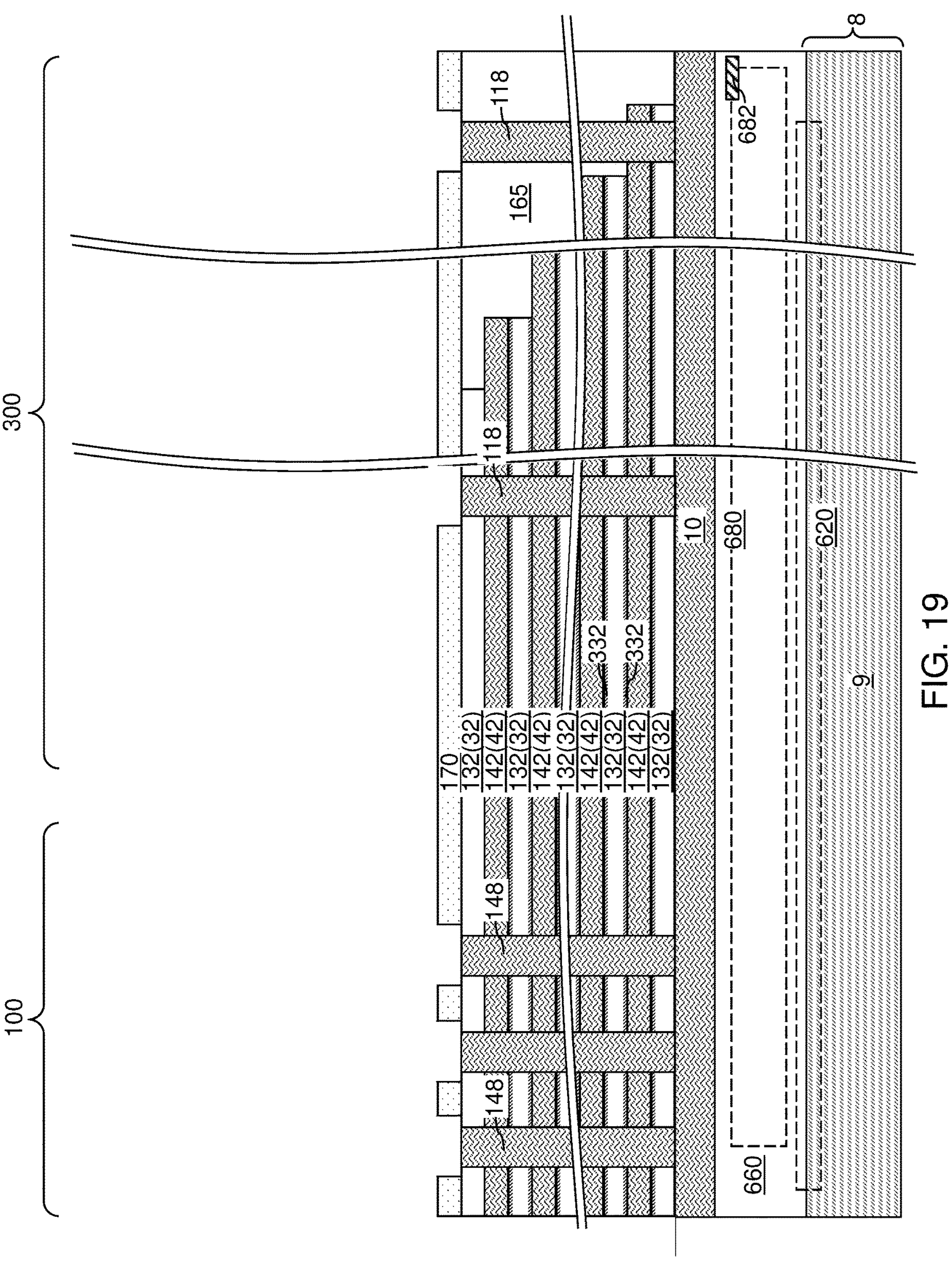
FIG. 19 is a vertical cross-sectional view of the third exemplary structure after formation of first-tier sacrificial fill material portions and expanding upper regions of the first-tier memory openings and the first-tier support openings according to the third embodiment of the present disclosure.

Referring to FIG. 19, a first sacrificial fill material can be deposited in the first-tier memory openings 49 and the first-tier support openings 19. The first sacrificial fill material may comprise a carbon-based material (such as amorphous carbon or diamond-like carbon), a polymer material, a semiconductor material, or any other suitable material that can be removed selective to the materials of the semiconductor material layer 10 and the first-tier material layers (132, 142, 332). Portions of the first sacrificial fill material can be removed from above a horizontal plane located at, or about, the bottom surface of the inter-tier dielectric layer 170 by performing a recess etch process. Each remaining portion of the first sacrificial fill material that fills a first-tier memory opening 149 constitutes a first-tier sacrificial memory opening fill structure 148. Each remaining portion of the first sacrificial fill material that fills a first-tier support opening 119 constitutes a first-tier sacrificial support opening fill structure 118.

An isotropic etch process can be performed to isotropically recess physically exposed surfaces inter-tier dielectric layer 170. Upper portions of the first-tier memory openings 149 and the first-tier support openings 119 that are not filled with the first-tier sacrificial memory opening fill structures 148 or the first-tier sacrificial support opening fill structures 118 can be laterally expanded by the isotropic etch process. Further, the top surface of the inter-tier dielectric layer 170 can be vertically recessed by the isotropic etch process. In an illustrative example, a wet etch process employing dilute hydrofluoric acid can be performed to isotropically recess the physically exposed surfaces of the inter-tier dielectric layer 170. The lateral recess distance of the isotropic etch process may be in a range from 10% to 80%, such as from 25% to 50%, of the thickness of the inter-tier dielectric layer 170. For example, the lateral recess distance of the isotropic etch process may be in a range from 10 nm to 50 nm, although lesser and greater lateral recess distances may also be employed.

Figure 20:
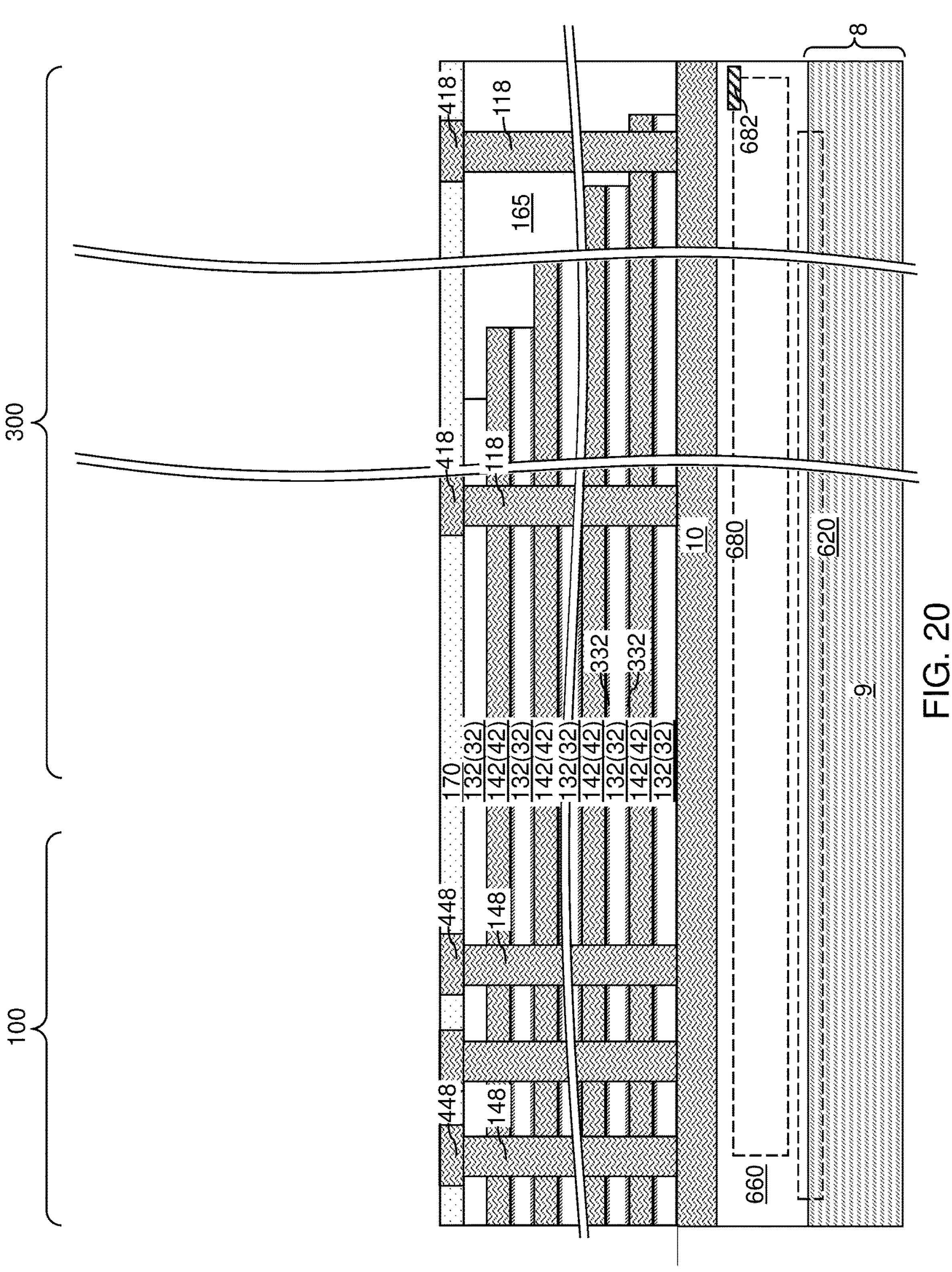
FIG. 20 is a vertical cross-sectional view of the third exemplary structure after formation of inter-tier sacrificial fill material portions according to the third embodiment of the present disclosure.

Referring to FIG. 20, a second sacrificial fill material can be deposited in the unfilled volumes in the upper portions of the first-tier memory openings 149 and the first-tier support openings 119 located at the level of the inter-tier dielectric layer 170. The second sacrificial fill material may comprise the same material as the first sacrificial fill material. Portions of the second sacrificial fill material can be removed from above a horizontal plane including the top surface of the inter-tier dielectric layer 170 by performing a planarization process, which may comprise a recess etch process and/or a chemical mechanical polishing (CMP) process. Each remaining portion of the second sacrificial fill material that fills an upper portion of a first-tier memory opening 149 constitutes an inter-tier sacrificial memory opening fill structure 448. Each remaining portion of the second sacrificial fill material that fills an upper portion of a first-tier support opening 119 constitutes an inter-tier sacrificial support opening fill structure 418.

Figure 21:
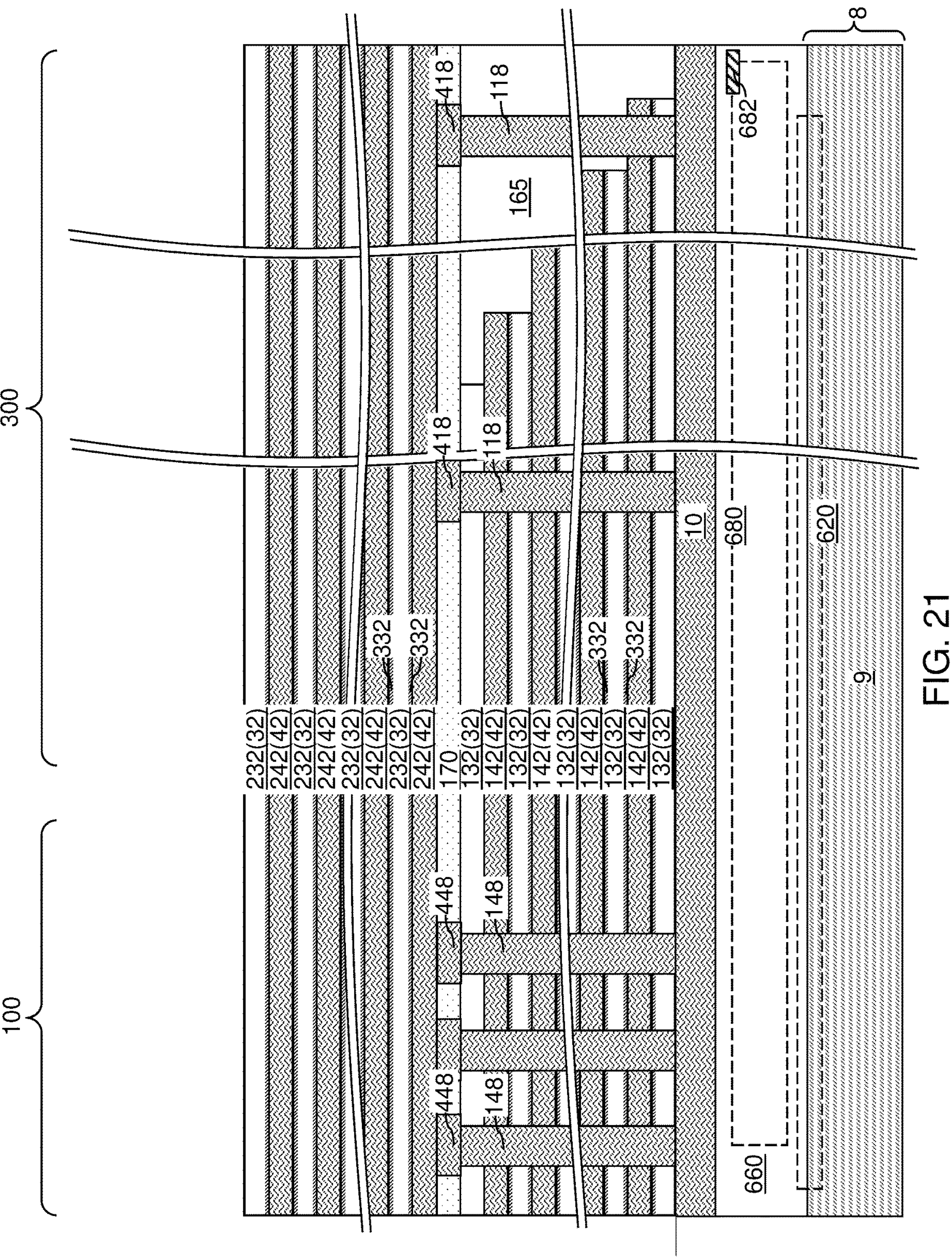
FIG. 21 is a vertical cross-sectional view of the third exemplary structure after formation of a second vertical repetition of multiple instances of a repetition unit of a second insulating layer, a first silicon oxycarbide liner, a second sacrificial material layer, and a second silicon oxycarbide liner with an omission of a bottommost silicon oxynitride liner according to the third embodiment of the present disclosure.

Referring to FIG. 21, the processing steps described with reference to FIG. 1 can be performed again with suitable modifications to form a second vertical repetition of multiple instances of a second repetition unit without forming at least one instance of a silicon oxycarbide liner 332. Each instance of the second repetition unit in the third exemplary structure includes a second-tier insulating layer 232, a first silicon oxycarbide liner 332, a first sacrificial material layer 242, and a second silicon oxycarbide liner 332. In one embodiment, a silicon oxynitride liner 332 can be omitted from one or more instances of the second repetition unit. In the illustrated example, the bottommost first silicon oxycarbide liner 332 is omitted such that the bottommost second-tier sacrificial material layer 242 is formed directly on the top surface of the inter-tier dielectric layer 170.

In one embodiment, at least one second-tier sacrificial material layer 242 is provided, which is in direct contact with one of the second-tier insulating layers 232 and is in direct contact with one of the silicon oxycarbide liners 332. In other words, at least one second-tier sacrificial material layer 242 is provided such that a silicon oxycarbide liner 332 is interposed between each such second-tier sacrificial material layer 242 and a respective neighboring second-tier insulating layer 232, and each such second-tier sacrificial material layer 242 is direct contact with another second-tier insulating layer 232 or the inter-tier insulating layer 170. In the illustrated example of FIG. 21, a silicon oxycarbide liner 332 is interposed between a bottommost second-tier sacrificial material layer 242 and an overlying (i.e., bottommost) second-tier insulating layer 232, and the bottommost second-tier sacrificial material layer 242 is direct contact with the inter-tier dielectric layer 170, which is a dielectric layer composed of a silicon oxide (e.g., silicon dioxide) material.

Thus, a second alternating stack of second-tier insulating layers 232 and second-tier sacrificial material layers 242 is formed such that silicon oxycarbide liners 332 are interposed between a majority of neighboring pairs of second-tier insulating layers 232 and second-tier sacrificial material layers 242, and are not present between a minority of neighboring pairs of second-tier insulating layers 232 and second-tier sacrificial material layers 242. The set of all layers overlying the inter-tier dielectric layer 170 is herein referred to as second-tier material layers (232, 242, 332).

While an embodiment is described in which only one of the second-tier sacrificial material layers 242 is in direct contact with a silicon oxide material layer and one of the silicon oxycarbide layers 332, embodiments are expressly contemplated herein in which multiple second-tier sacrificial material layers 242 are in direct contact with a respective silicon oxide layer (such as the second-tier insulating layers 232 or the inter-tier dielectric layer 170) and a respective silicon oxycarbide layer 332. In one embodiment, a second vertical repetition of multiple instances of a repetition unit of a second-tier insulating layer 232, a first silicon oxycarbide liner 332, a second-tier sacrificial material layer 242, and a second silicon oxycarbide liner 332 can be formed over the inter-tier dielectric layer 170 with an omission of a bottommost silicon oxynitride liner 332.

Generally speaking, an alternating stack {(132, 142), (232, 242)} of insulating layers (132, 232) and sacrificial material layers (142, 242) can be formed such that a silicon oxycarbide liner 332 is interposed between a first sacrificial material layer (142 or 242) and a first insulating layer (132 or 232), and the first sacrificial material layer (142 or 242) is direct contact with a second insulating layer (132 or 232) or is in direct contact with a dielectric material layer (such as an inter-tier dielectric layer 170) composed of a silicon oxide material (i.e., which is not a silicon oxycarbide layer).

Figure 22:
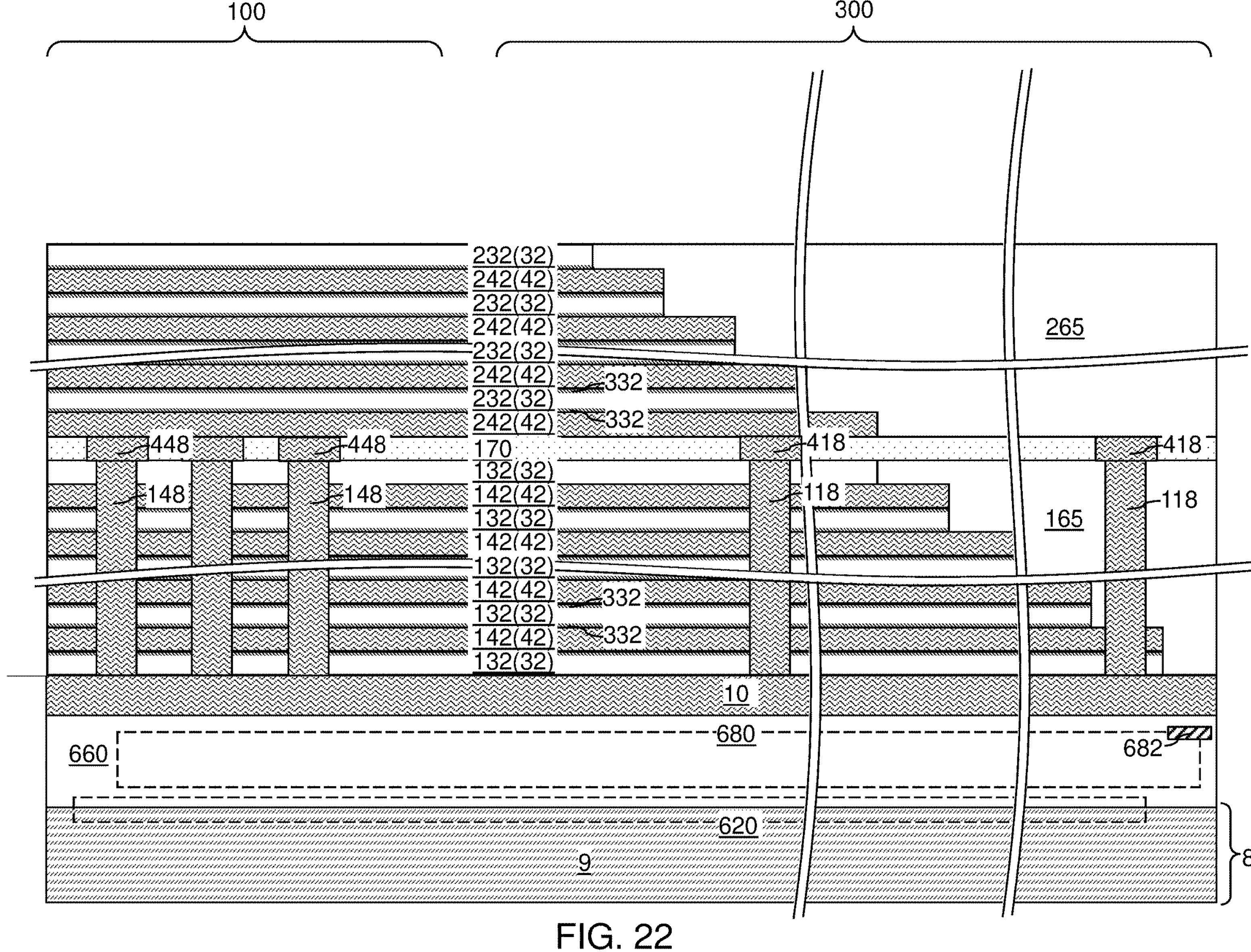
FIG. 22 is a vertical cross-sectional view of the third exemplary structure after formation of second stepped surfaces and a second retro-stepped dielectric material portion according to the third embodiment of the present disclosure.

Referring to FIG. 22, the processing steps described with reference to FIG. 2 can be performed to form second stepped surfaces by patterning the second-tier material layers (232, 242, 332). Subsequently, a dielectric fill material such as silicon oxide can be deposited over the second stepped surfaces, and can be planarized to form a second retro-stepped dielectric material portion 265. A top surface of the second retro-stepped dielectric material portion 265 may be formed in the horizontal plane including the topmost surface of the second-tier material layers (232, 242, 332), such as the top surface of the topmost second-tier insulating layer 232.

The first-tier insulating layers 132 and the second-tier insulating layers 232 are collectively referred to as insulating layers 32. The first-tier sacrificial material layers 142 and the second-tier sacrificial material layers 242 are collectively referred to as sacrificial material layers 42.

Figure 23:
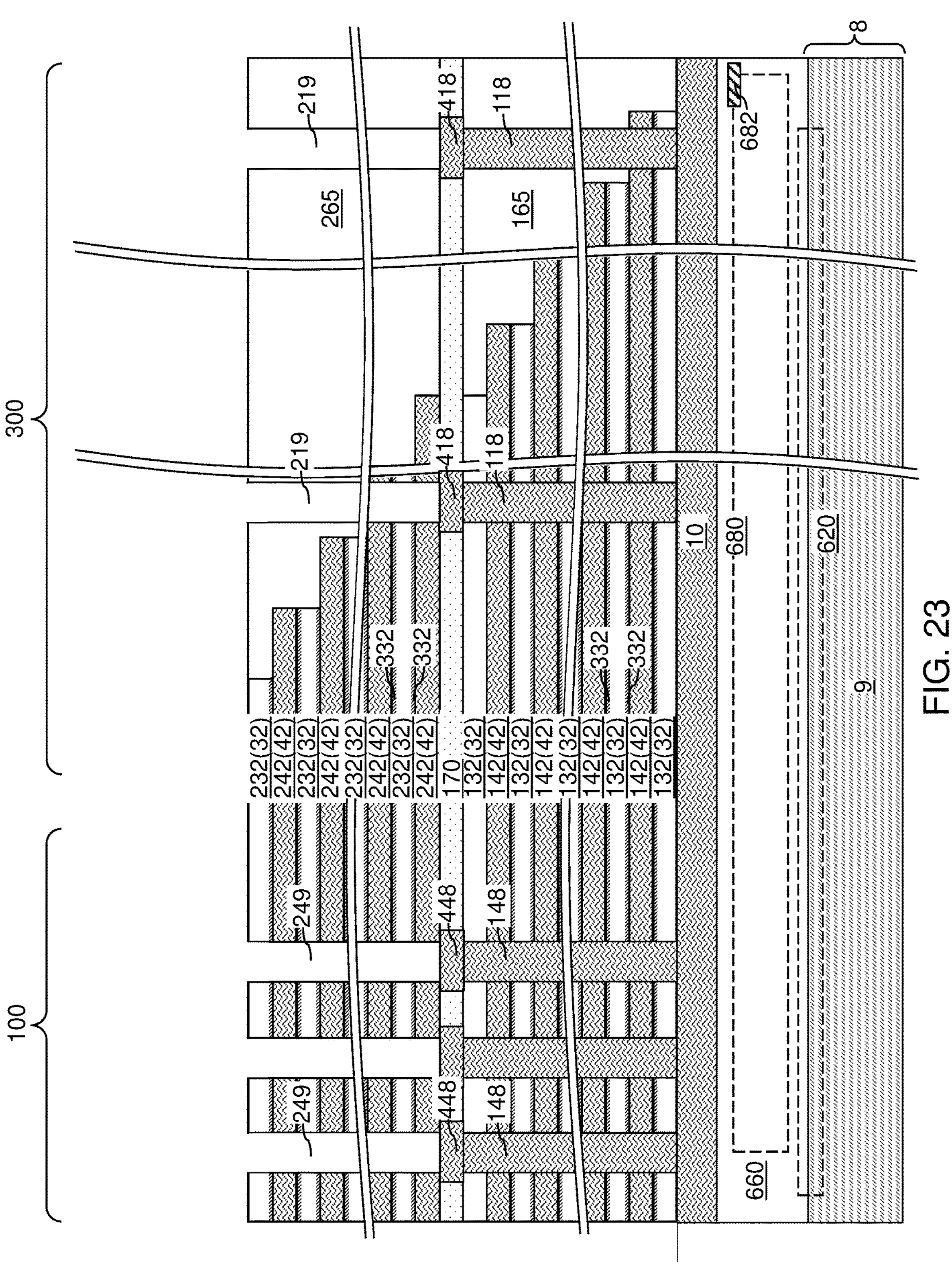
FIG. 23 is a vertical cross-sectional view of the third exemplary structure after formation of second-tier memory openings and second-tier support openings according to the third embodiment of the present disclosure.

Referring to FIG. 23, a lithographic material stack (not shown) including at least a photoresist layer can be formed over the second-tier material layers (232, 242, 332), and can be lithographically patterned to form openings therein. The openings include a first set of openings formed in the memory array region 100 and a second set of openings formed in the contact region 300. The first set of openings has an areal overlap with the first-tier sacrificial memory opening fill structures 148, and the second set of openings has an areal overlap with the first-tier sacrificial support opening fill structures 118.

The pattern in the lithographic material stack can be transferred through the second-tier material layers (232, 242, 332) and the second retro-stepped dielectric material portion 265 by at least one anisotropic etch that employs the patterned lithographic material stack as an etch mask. Portions of the second-tier material layers (232, 242, 332) and the second retro-stepped dielectric material portion 265 underlying the openings in the patterned lithographic material stack are etched to form second-tier memory openings 249 and second-tier support openings 219. The second-tier memory openings 249 are formed through each layer in the second-tier material layers (132, 242, 332) in the memory array region 100. The second-tier support openings 219 are formed through each layer in the second-tier material layers (132, 242, 332) in the contact region 300. The patterned lithographic material stack can be subsequently removed, for example, by ashing. A top surface of an inter-tier sacrificial memory opening fill structure 448 is physically exposed at the bottom of each second-tier memory opening 249. A top surface of an inter-tier sacrificial support opening fill structure 418 is physically exposed at the bottom of each second-tier support openings 219.

Figure 24:
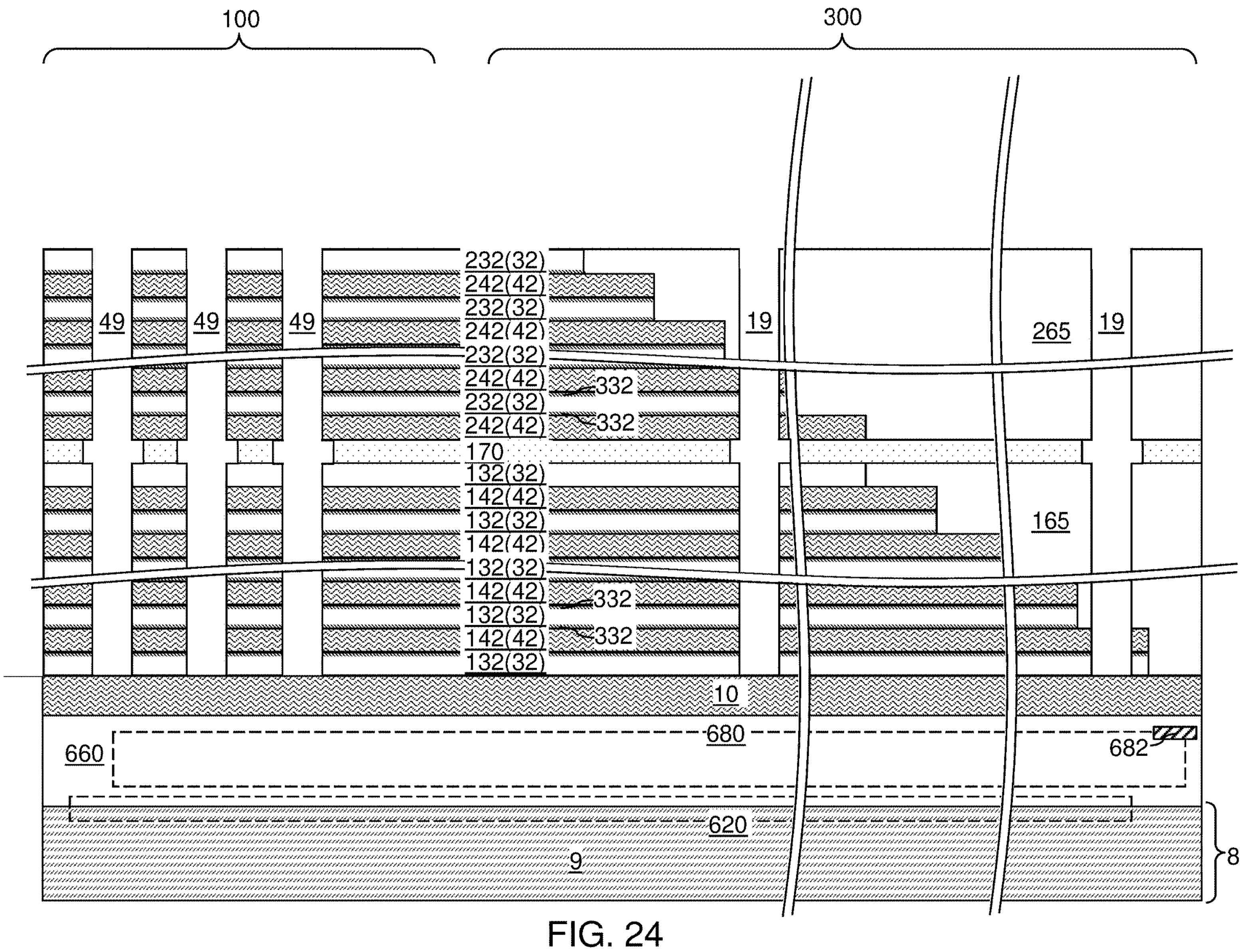
FIG. 24 is a vertical cross-sectional view of the third exemplary structure after formation of inter-tier memory openings and inter-tier support openings according to the third embodiment of the present disclosure.

Referring to FIG. 24, the inter-tier sacrificial memory opening fill structures 448, the inter-tier sacrificial support opening fill structures 418, the first-tier sacrificial memory opening fill structures 148, and the first-tier sacrificial support opening fill structures 118 can be removed selective to the materials of the second-tier material layers (232, 242, 332), the first-tier material layers (132, 142, 332), the inter-tier material layer 170, and the semiconductor material layer 10. For example, if the inter-tier sacrificial memory opening fill structures 448, the inter-tier sacrificial support opening fill structures 418, the first-tier sacrificial memory opening fill structures 148, and the first-tier sacrificial support opening fill structures 118 comprise carbon-based materials, an ashing process can be performed to remove the inter-tier sacrificial memory opening fill structures 448, the inter-tier sacrificial support opening fill structures 418, the first-tier sacrificial memory opening fill structures 148, and the first-tier sacrificial support opening fill structures 118.

Each continuous void including the volumes from which a first-tier sacrificial memory opening fill structure 148 and an inter-tier sacrificial memory opening fill structure 448 are removed and a volume of a second-tier memory opening 249 constitutes an inter-tier memory opening 49, which is also referred to as a memory opening 49. Each continuous void including the volumes from which a first-tier sacrificial support opening fill structure 118 and an inter-tier sacrificial support opening fill structure 418 are removed and a volume of a second-tier support opening 219 constitutes an inter-tier support opening 19, which is also referred to as a support opening 19. The memory openings 49 and the support openings 19 have a wider width (e.g., larger diameter) at the level of the inter-tier dielectric layer 170 (i.e., in the joint region between the first and second tiers) than at the levels of the first and second tiers (i.e., at the levels of the first-tier material layers (132, 142, 332) and the second-tier material layers (232, 242, 332)).

Figure 25A:
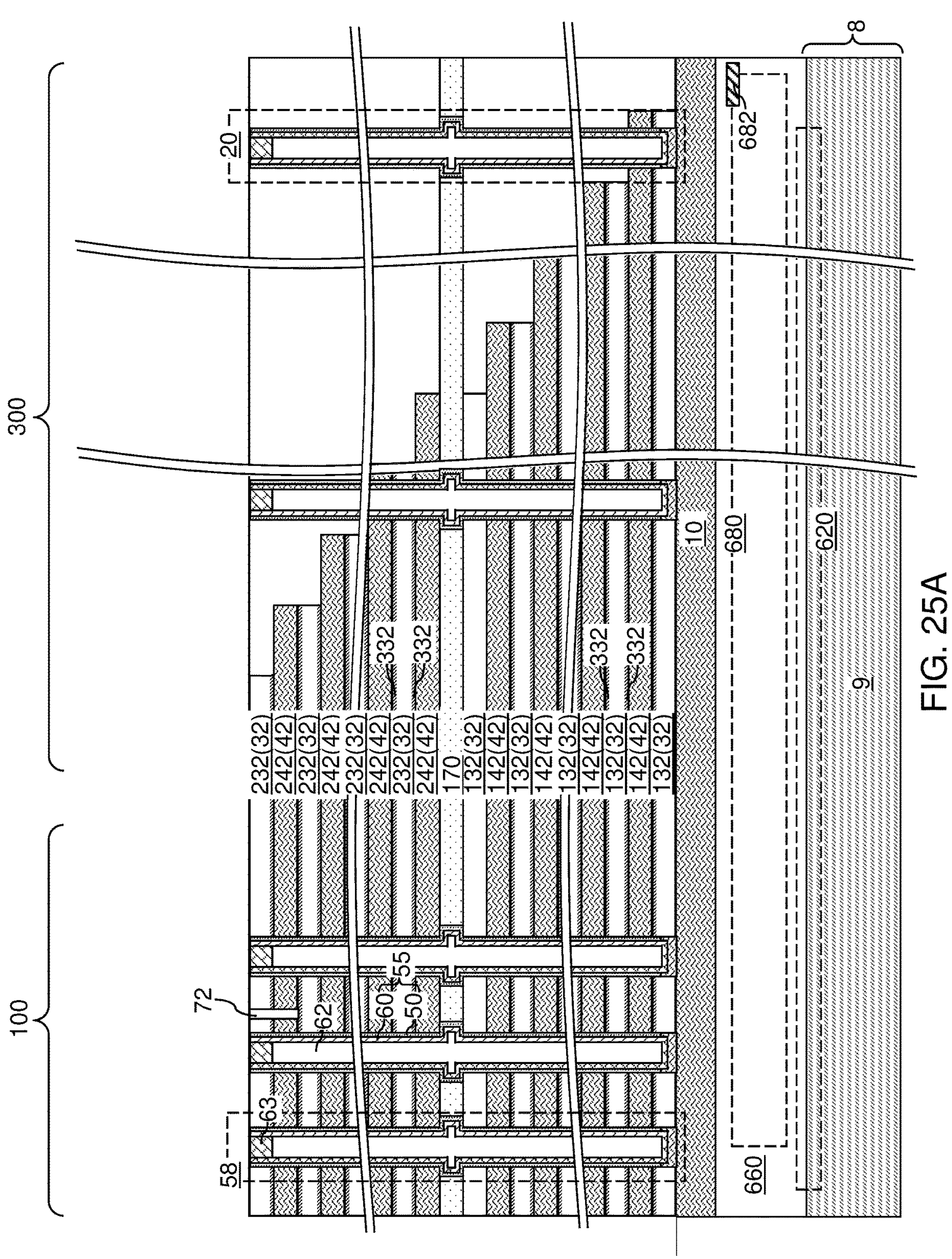
FIG. 25A is a vertical cross-sectional view of the third exemplary structure after formation of memory opening fill structures and support pillar structures according to the third embodiment of the present disclosure.
Figures 25B, 25C:
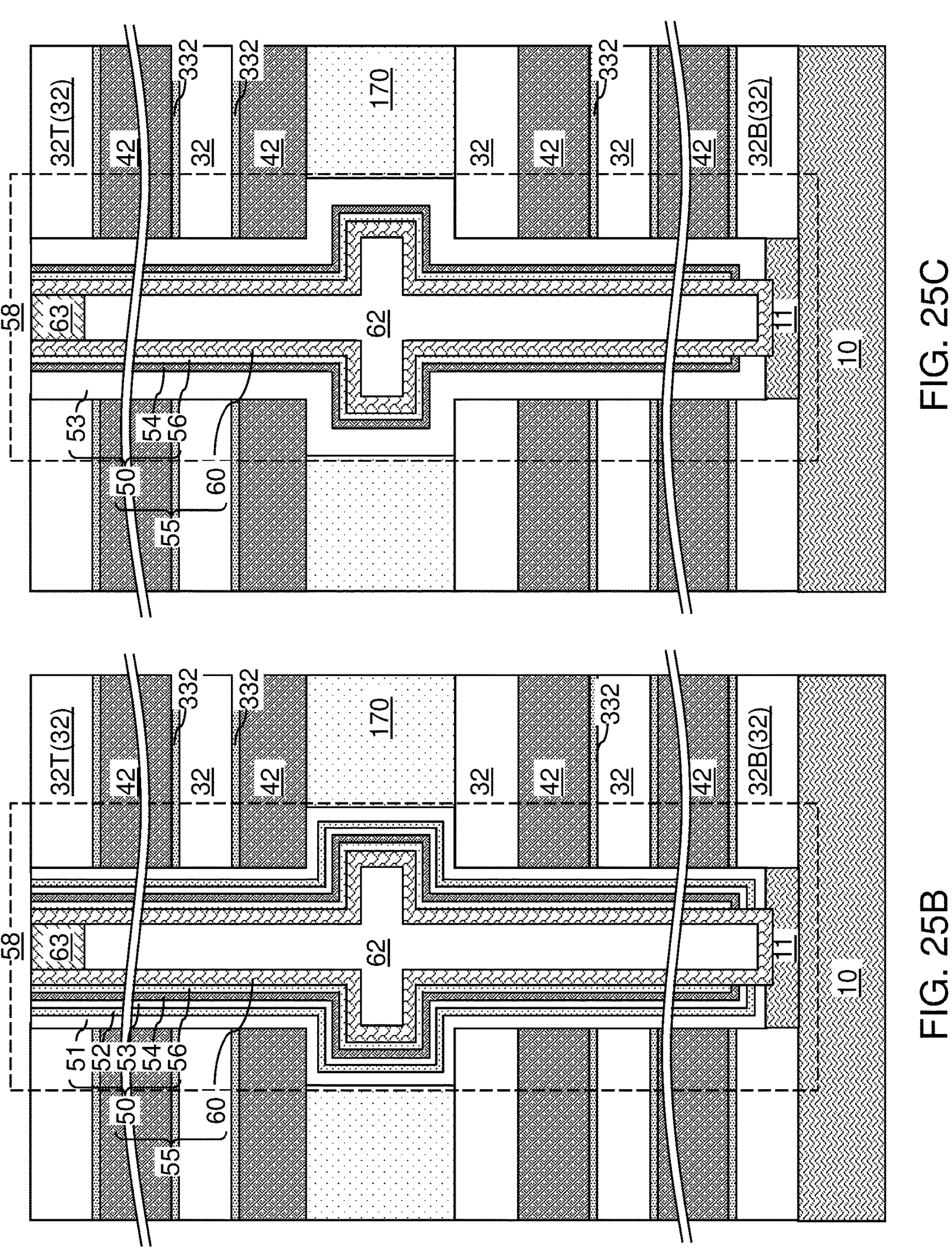
FIG. 25B is a vertical cross-sectional view of a region of the third exemplary structure around a memory opening fill structure in FIG. 25A.
FIG. 25C is a vertical cross-sectional view of a region of an alternative embodiment of the third exemplary structure around a memory opening fill structure in FIG. 25A.

Referring to FIGS. 25A-25C, the processing steps described with reference to FIGS. 5A-5F can be performed to form a memory opening fill structure 58 in each memory opening 49 and to form a support pillar structure 20 in each support opening 19. Each memory opening fill structure 58 can be formed in a respective the memory opening 49, and can comprise a respective vertical semiconductor channel 60 and a respective memory film 50. Each memory film 50 may comprise a continuous memory material layer 54 which continuously extends through the entire alternating stack {(132, 142), (232, 242)}. Drain-select-level isolation structures 72 may be formed through at least one second-tier sacrificial material layer 242.

FIG. 25B illustrates an embodiment of the third exemplary structure around a memory opening fill structure 58 in FIG. 25A, in which each memory film 50 includes, from outside to inside, a silicon oxide liner 51, a dielectric metal oxide blocking dielectric layer 52, a silicon oxide blocking dielectric layer 53, a continuous memory material layer 54, and a tunneling dielectric layer 56. The dielectric metal oxide blocking dielectric layer 52 may comprise an aluminum oxide layer.

FIG. 25C illustrates an alternative embodiment of the third exemplary structure around a memory opening fill structure 58 in FIG. 25A, in which each memory film 50 comprises, from outside to inside, a silicon oxide blocking dielectric layer 53, the continuous memory material layer 54, and a tunneling dielectric layer 56.

Figure 26A:
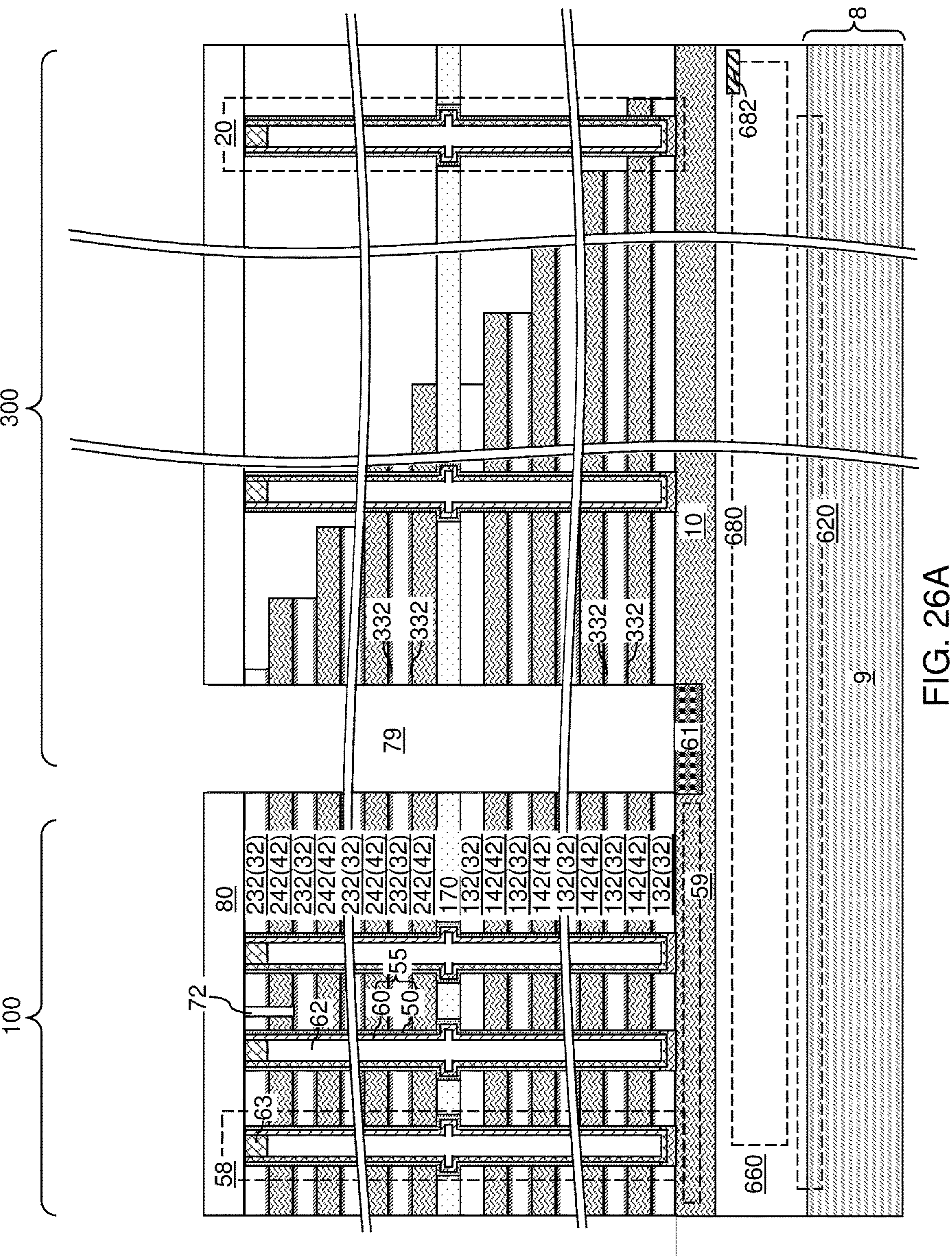
FIG. 26A is a vertical cross-sectional view of the third exemplary structure after formation of a contact-level dielectric layer and isolation trenches according to the third embodiment of the present disclosure.
Figure 26B:
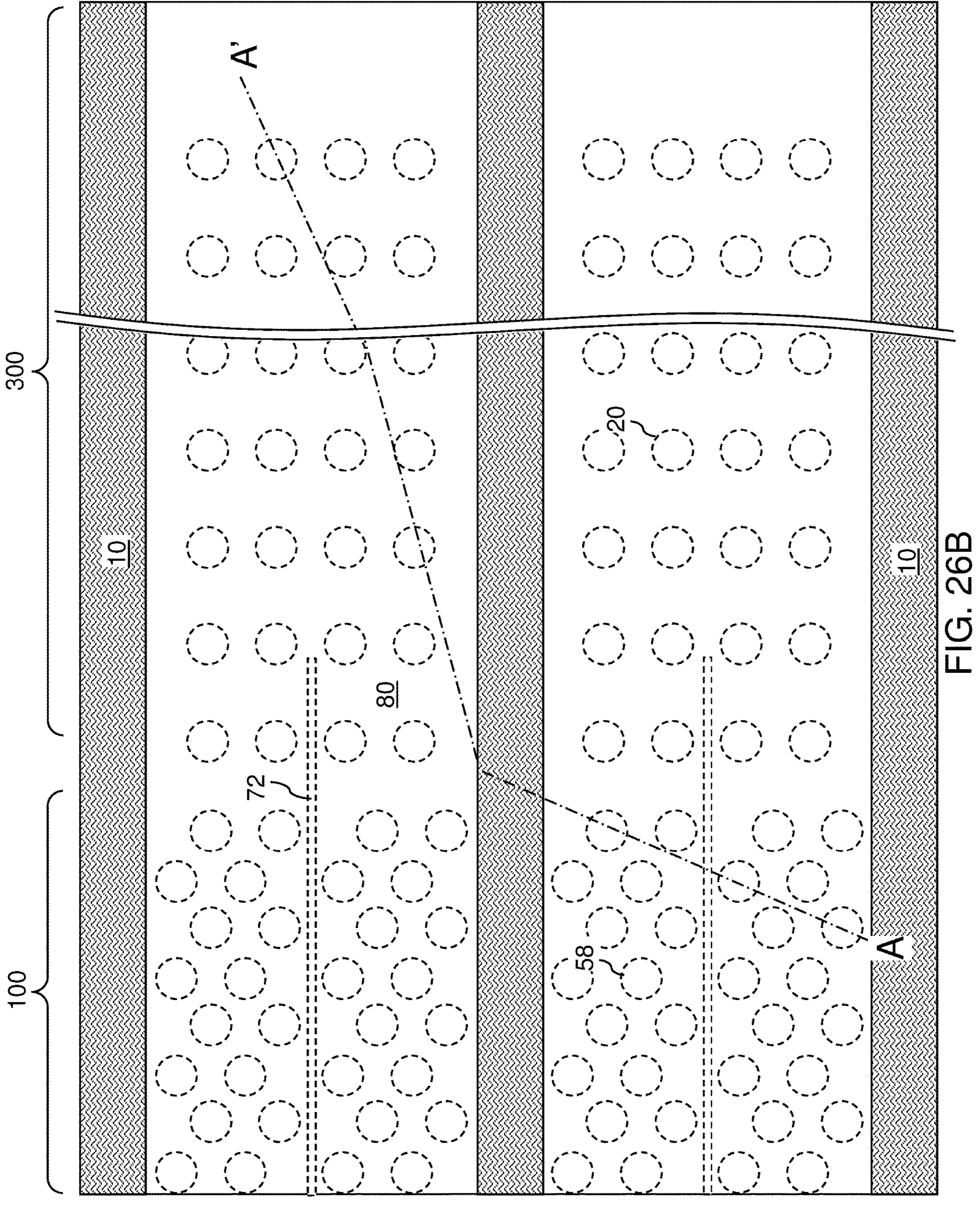
FIG. 26B is a top-down view of the third exemplary structure of FIG. 26A. The hinged vertical plane A-A' is the plane of the vertical cross-sectional view of FIG. 26A.

Referring to FIGS. 26A and 26B, a contact-level dielectric layer 80 can be formed over the second-tier material layers (232, 242, 332) and over the memory opening fill structures 58 and the support pillar structures 20. The contact-level dielectric layer 80 includes a dielectric material that is different from the dielectric material of the sacrificial material layers (142, 242). For example, the contact-level dielectric layer 80 can include silicon oxide. The contact-level dielectric layer 80 can have a thickness in a range from 50 nm to 500 nm, although lesser and greater thicknesses can also be employed.

A photoresist layer (not shown) can be applied over the contact-level dielectric layer 80, and is lithographically patterned to form openings in areas between clusters of memory opening fill structures 58. The pattern in the photoresist layer can be transferred through the contact-level dielectric layer 80, the second-tier material layers (232, 242, 332), the inter-tier dielectric layer 170, the first-tier material layers (132, 142, 332), the second retro-stepped dielectric material portion 265, and the first retro-stepped dielectric material portion 165. Backside trenches 79 are formed in volumes from which the materials of the contact-level dielectric layer 80, the second-tier material layers (232, 242, 332), the inter-tier dielectric layer 170, the first-tier material layers (132, 142, 332), the second retro-stepped dielectric material portion 265, and the first retro-stepped dielectric material portion 165. The backside trenches 79 vertically extend from the top surface of the contact-level dielectric layer 80 at least to the top surface of the semiconductor material layer 10, and laterally extend through the memory array region 100 and the contact region 300.

In one embodiment, the backside trenches 79 can laterally extend along the first horizontal direction hd1 (which may be a word line direction), and can be laterally spaced apart along the second horizontal direction hd2 (which can be a bit line direction) that is perpendicular to the first horizontal direction hd1. The memory opening fill structures 58 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1).

Multiple rows of memory opening fill structures 58 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing. Generally, backside trenches 79 can laterally extend along the first horizontal direction hd1, and can vertically extend from the top surface of the contact-level dielectric layer 80 to a top surface of the semiconductor material layer 10. The stack of the first-tier material layers (132, 142, 332), the inter-tier dielectric layer 170, the second-tier material layers (232, 242, 332), and the contact-level dielectric layer 80 is divided into multiple patterned layer stacks that are laterally spaced apart along the second horizontal direction hd2 by the backside trenches 79.

Dopants of the second conductivity type can be implanted into physically exposed surface portions of the semiconductor material layer 10 (which may be surface portions of the semiconductor material layer 10) that are located at the bottom of the backside trenches by an ion implantation process. A source region 61 can be formed at a surface portion of the semiconductor material layer 10 under each backside trench 79. Each source region 61 is formed in a surface portion of the semiconductor material layer 10 that underlies a respective backside trench 79. Due to the straggle of the implanted dopant atoms during the implantation process and lateral diffusion of the implanted dopant atoms during a subsequent activation anneal process, each source region 61 can have a lateral extent greater than the lateral extent of the lateral extent of the overlying backside trench 79.

An upper portion of the semiconductor material layer 10 that extends between the source region 61 and the vertical semiconductor channels 60 in the memory opening fill structures 58 constitutes a horizontal semiconductor channel 59 for a plurality of field effect transistors. The horizontal semiconductor channel 59 is connected to multiple vertical semiconductor channels 60.

Figure 27:
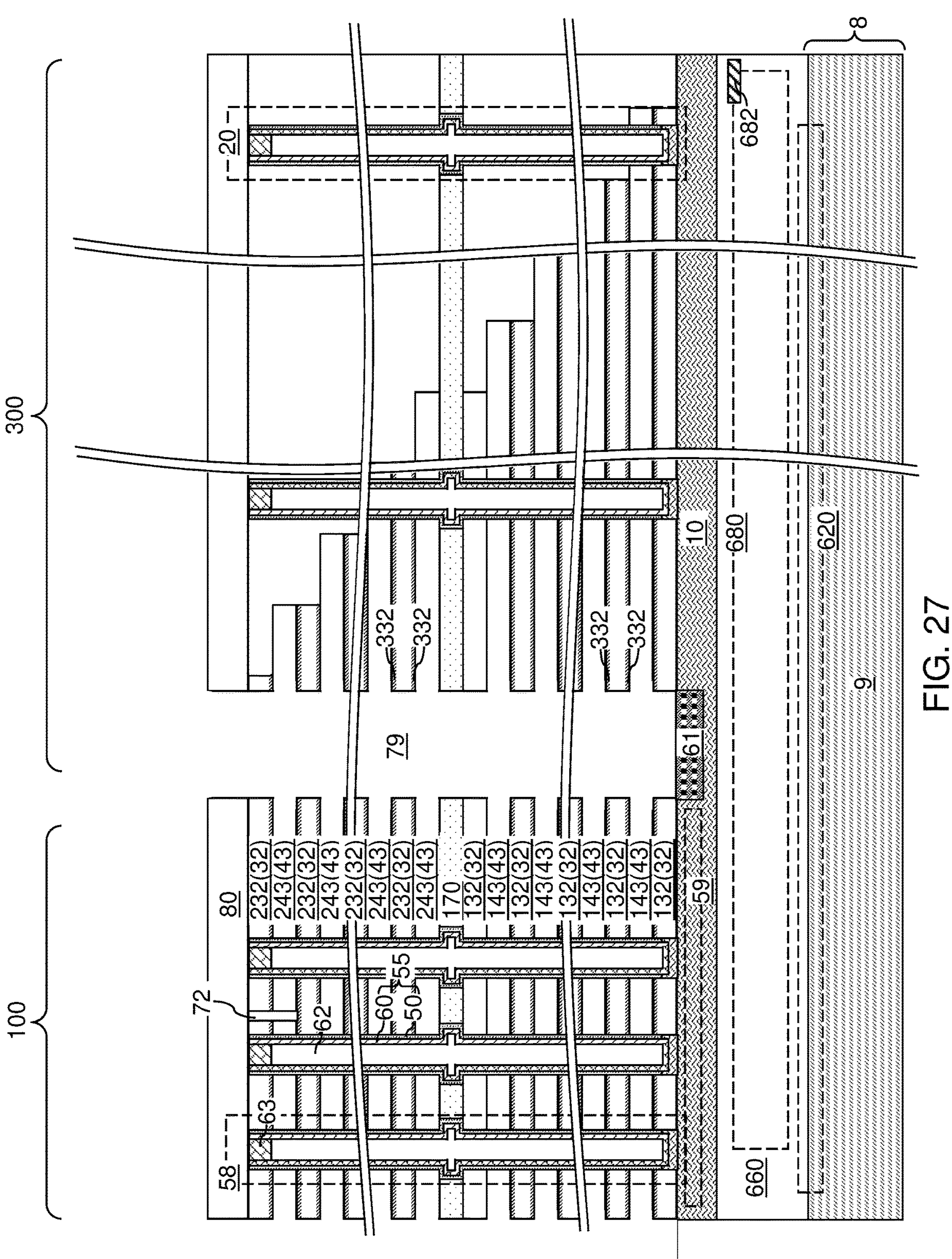
FIG. 27 is a vertical cross-sectional view of the third exemplary structure after formation of backside recesses according to the third embodiment of the present disclosure.
Figures 28A, 28B:
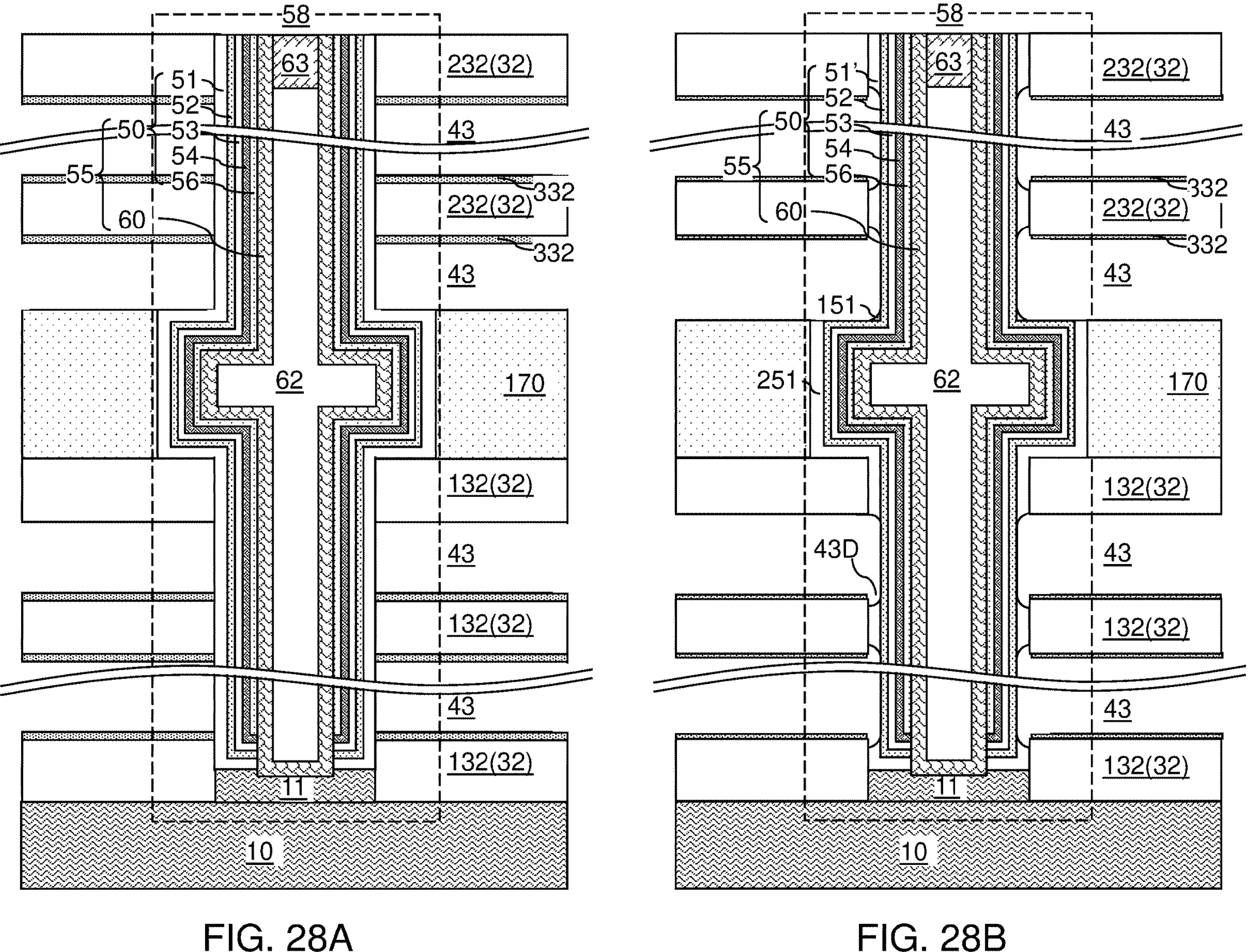
FIGS. 28A-28E are sequential vertical cross-sectional views of a region of the third exemplary structure around a memory opening fill structure during formation of electrically conductive layers according to the third embodiment of the present disclosure.

Referring to FIGS. 27 and 28A, a first configuration of the third exemplary structure is illustrated after formation of backside recesses 43 by removing the sacrificial material layers (142, 242) selective to the silicon oxycarbide liner 332, the insulating layers (132, 232) (which comprises a silicon oxide material), the inter-tier dielectric layer 170 including a silicon oxide material, and the contact-level dielectric layer 80.

Specifically, an etchant that selectively etches the sacrificial material layers (142, 242) with respect to the insulating layers (132, 232) and the silicon oxycarbide liners 332 can be introduced into the backside trenches 79 during an isotropic etch process. Backside recesses 43 are formed in volumes from which the sacrificial material layers (142, 242) are removed. The removal of the sacrificial material layers (142, 242) can be selective to the material of the insulating layers (132, 232), the material of the silicon oxycarbide liners 332, the material of the retro-stepped dielectric material portions (165, 265), the material of the inter-tier dielectric layer 170, the semiconductor material of the semiconductor material layer 10, and the material of the outermost layer of the memory films 50 (such as the silicon oxide liner 51).

The etch process can be a wet etch process employing a wet etch solution, or can be a gas phase (dry) etch process in which the etchant is introduced in a vapor phase into the backside trenches 79. For example, if the sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers (142, 242).

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the sacrificial material layers (142, 242) are removed. The memory openings 49 in which the memory stack structures 55 are formed are herein referred to as front side openings or front side cavities in contrast with the backside recesses 43. Each of the plurality of backside recesses 43 can extend substantially parallel to the top surface of the semiconductor material layer 10.

According to an aspect of the present disclosure, a horizontal surface of an insulating layer (132, 232) is physically exposed to at least one of the backside recesses 43. In the illustrated example, a bottom horizontal surface of the topmost first-tier insulating layer 132 and a top horizontal surface of the inter-level dielectric layer 170 can be physically exposed to a respective backside recess 43.

Referring to FIG. 28B, an isotropic etch process that etches the material of the silicon oxide liner 51 is performed. The etch chemistry of the isotropic etch process is selected such that the isotropic etch process etches the material of the silicon oxide liner 51 (i.e., a silicon oxide material) at a higher etch rate than the material of the silicon oxycarbide liners 332.

In an illustrative example, the silicon oxide liner 51 may comprise silicon dioxide, and the isotropic etch process may comprise dilute hydrofluoric acid or buffered hydrofluoric acid. An etch rate of a silicon oxycarbide material formed by chemical vapor deposition employing silane and carbon dioxide as precursor gases in 500:1 dilute hydrofluoric acid is about 2.2 nm/minute. An etch rate of silicon dioxide formed by decomposition of tetraethylorthosilicate glass in 500:1 dilute hydrofluoric acid is about 11.8 nm/minute. The ratio of the etch rate of the silicon oxycarbide material to the etch rate of the silicon oxide material is about 0.18 in this case. The use of buffered hydrofluoric acid as the etching liquid provides a ratio of about 0.48 between the etch rate of a silicon oxycarbide material and the etch rate of a silicon oxide material.

Generally, the etch rate of the silicon oxycarbide liners 322 may be significantly less than the etch rate of the silicon oxide material of the silicon oxide liner 51. In one embodiment, the etch rate of the silicon oxycarbide liners 322 is less than 50% of the etch rate of the silicon oxide material of the silicon oxide liner 51. In one embodiment, the etch rate of the silicon oxycarbide liners 322 is less than 20% of the etch rate of the silicon oxide material of the silicon oxide liner 51.

In one embodiment, the thickness of the silicon oxide liner 51, the thickness of the silicon oxycarbide liners 332, and the chemistry and the duration of the isotropic etch process can be selected such that cylindrical portions of the silicon oxide liner 51 are removed at each level of the backside recesses 43 without completely removing the silicon oxycarbide liners 332. Cylindrical segments of the outer sidewall of the dielectric metal oxide blocking dielectric layer 52 can be physically exposed to the backside recesses 43 around each memory opening fill structure 58. The silicon oxide liner 51 of each memory opening fill structure 58 can be divided into a plurality of discrete silicon oxide portions having a respective tubular configuration, which is herein referred to as a vertical stack of tubular silicon oxide spacers 51'.

Each of the first silicon oxycarbide liners 332 and the second silicon oxycarbide liners 332 may be thinned. In one embodiment, the thickness of each of the first silicon oxycarbide liners 332 and the second silicon oxycarbide liners 332 prior to the isotropic etch process may be in a range from 0.5 nm to 4 nm, and/or from 1.0 nm to 2.5 nm, and the thickness of each of the first silicon oxycarbide liners 332 and the second silicon oxycarbide liners 332 after the isotropic etch process may be in a range from 0.25 nm to 2 nm, and/or from 0.5 nm to 1.2 nm. Generally, the thickness decrease of each of the first silicon oxycarbide liners 332 and the second silicon oxycarbide liners 332 may be in a range from 25% to 75% of the initial thickness of a respective silicon oxycarbide liner 332.

According to an aspect of the present disclosure, physically exposed horizontal surfaces of at least one insulating layer (e.g., topmost first insulating layer 132) and the inter-tier dielectric layer 170 can be vertically recessed during the isotropic etch process. For example, the bottom horizontal surface of the topmost first-tier insulating layer 132 and the top horizontal surface of the inter-level dielectric layer 170 can be vertically recessed during the isotropic etch process.

Generally, portions of the silicon oxide liner 51 can be removed from around the backside recesses 43 by performing an isotropic etch process. Outer cylindrical surface segments of the dielectric metal oxide blocking dielectric layer 52 are exposed after the isotropic etch process. Remaining portions of the silicon oxide liner 51 comprise a vertical stack of tubular silicon oxide spacers 51', an optional annular silicon oxide spacer 151 that that is located on an annular surface segment of a horizontally-extending top surface of the dielectric metal oxide blocking dielectric layer 52 located at or above the horizontal plane including the top surface of the inter-tier dielectric layer 170, and a contoured silicon oxide spacer 251 that is laterally surrounded by and is contacted by the inter-tier dielectric layer 170 and the topmost first-tier insulating layer 132. Thus, the memory film 50 comprises a vertical stack of tubular silicon oxide spacers 51' in contact with the respective insulating layers 32.

The isotropic etch process etches the silicon oxide liner 51 isotropically. As such, concave annular surfaces are formed on each of the tubular silicon oxide spacers 51'. Annular divots 43D are formed by the isotropic etch process between the dielectric metal oxide blocking dielectric layer 52 and the first and second silicon oxycarbide liners 332. In one embodiment, a plurality of tubular silicon oxide spacers 51' may comprise a respective upper concave annular surface and a respective lower concave annular surface having a respective radius of curvature that is the same as or greater than the thickness of each tubular silicon oxide spacer 51' (i.e., the lateral distance between an inner cylindrical sidewall and an outer cylindrical sidewall).

Generally, portions of the silicon oxide liner 51 can be isotropically etched selective to the silicon oxycarbide liner 332 by performing an isotropic etch process after formation of the backside recesses 43. The isotropic etch process divides the silicon oxide liner 51 into a vertical stack of silicon oxide spacers (51', 151, 251) that are vertically spaced apart from each other. The silicon oxide spacers (51', 151, 251) comprise tubular silicon oxide spacers 51' having a respective tubular configuration (i.e., a respective cylindrical outer sidewall and a respective cylindrical inner sidewall), an optional annular silicon oxide spacer 151, and a contoured silicon oxide spacer 251. A vertical stack of annular divots 43D can be formed between each silicon oxycarbide liner 332 and the dielectric metal oxide blocking dielectric layer 52.

Figures 28C, 28D:
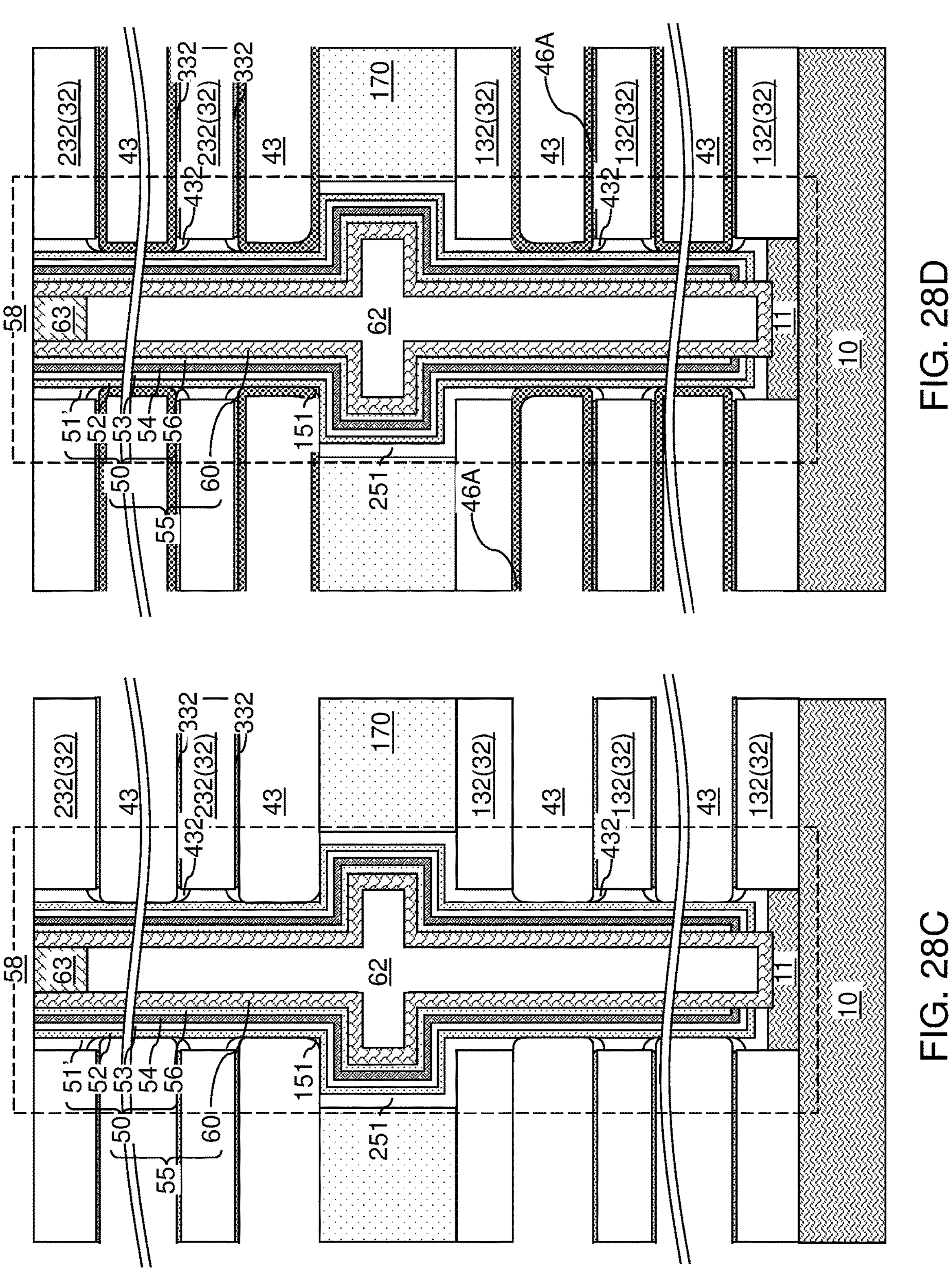

Referring to FIG. 28C, an optional conformal dielectric liner may be deposited in the annular divots 43D around the memory opening fill structures 58, on the physically exposed surfaces of the silicon oxycarbide spacers 332, and on the physically exposed surfaces of the insulating layers 32, the inter-tier dielectric layer 170, and the contact-level dielectric layer 80. The conformal dielectric liner may comprise any insulating material, such as silicon oxide. The thickness of the conformal dielectric liner may be greater than one half of the thickness of the tubular silicon oxide spacers 51' so that the conformal dielectric liner fills the annular divots 43D. The thickness of the conformal dielectric liner may be less than the thickness of the tubular silicon oxide spacers 51'. For example, the thickness of the conformal dielectric liner may range from 2 nm to 4 nm. In one embodiment, the conformal dielectric liner comprises undoped silicate glass (e.g., silicon dioxide) or a doped silicate glass.

An isotropic recess etch process can be performed to etch back portions of the conformal dielectric liner from outside the volumes of the annular divots 43D. Horizontally-extending surfaces of the silicon oxycarbide liners 332 can be physically exposed around each backside recess 43. The duration of the isotropic etch process can be selected to minimize collateral etching of the silicon oxycarbide liners 332 which function as etch stop layers. Each remaining portion of the conformal dielectric liner that fills a respective annular divot 43D has an annular shape, and is herein referred to as a divot-fill annular dielectric spacer 432.

In one embodiment, each memory opening fill structure 58 comprises divot-fill annular dielectric spacers 432. A plurality of tubular silicon oxide spacers 51' may be in contact with a respective overlying one of the divot-fill annular dielectric spacers 432, and may be in contact with a respective underlying one of the divot-fill annular dielectric spacers 432. Alternatively, the step shown in FIG. 28C is not performed and the divot-fill annular dielectric spacers 432 are omitted.

Referring to FIG. 28D, a metallic barrier layer 46A can be deposited in the backside recesses 43. The metallic barrier layer 46A in the third exemplary structure may have the same material composition and the same thickness as the metallic barrier layer 46A in the first and second exemplary structures, and may be formed by a conformal deposition process.

Figure 28E:
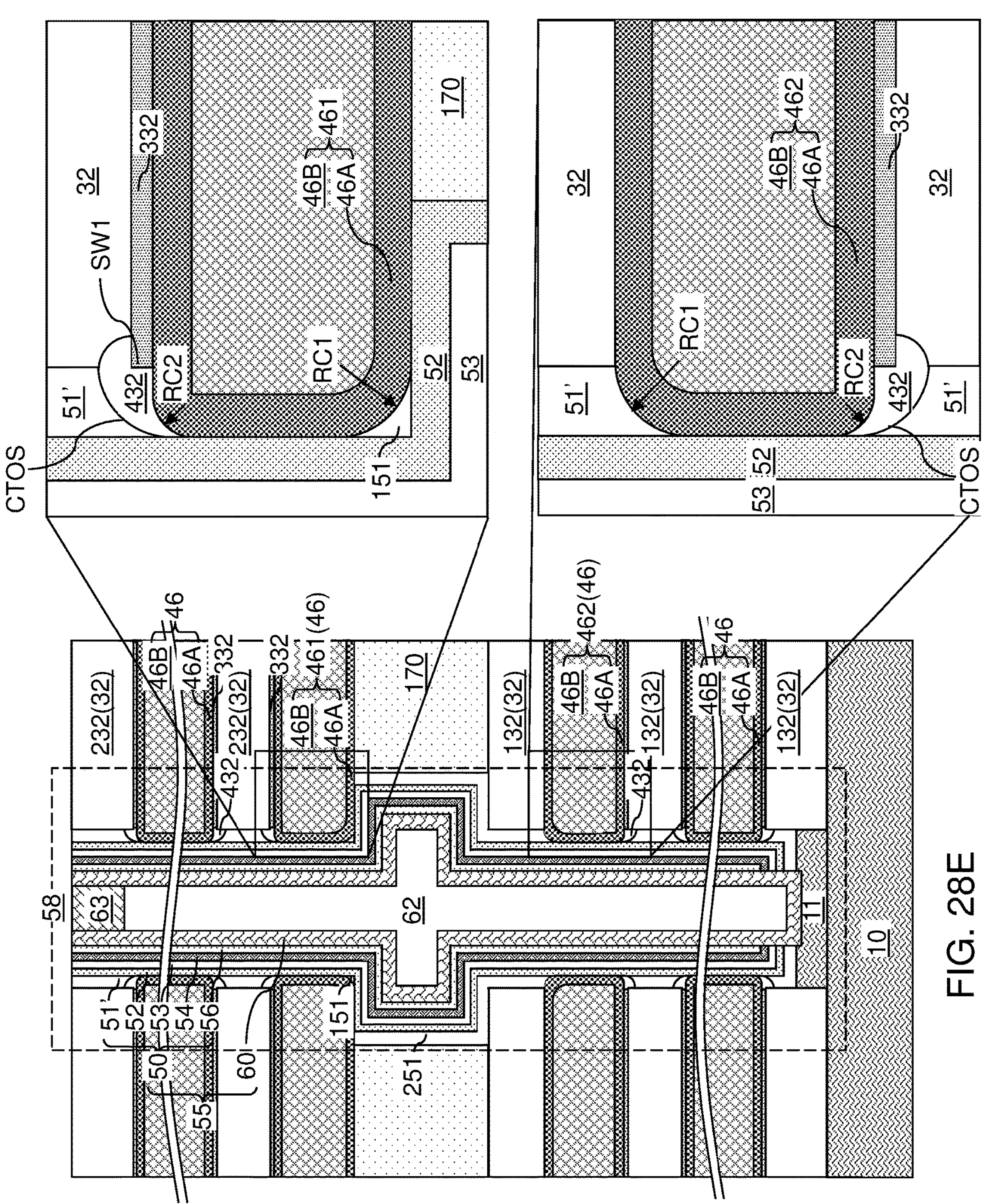

Referring to FIG. 28E, a metal fill material is deposited in the plurality of backside recesses 43, on the sidewalls of the at least one the backside trench 79, and over the top surface of the contact-level dielectric layer 80 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, molybdenum or tantalum.

In one embodiment, the metallic fill material layer 46B can consist essentially of a single elemental metal, such as tungsten. The metallic fill material layer 46B may be spaced from the insulating layers 32 and the memory stack structures 55 by the optional metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer can be formed on the sidewalls of each backside trench 79 and over the contact-level dielectric layer 80. Each electrically conductive layer 46 includes a portion of the optional metallic barrier layer 46A and a portion of the metallic fill material layer 46B that are located between a vertically neighboring pair of dielectric material layers, such as a pair of insulating layers 32. The continuous metallic material layer includes a continuous portion of the metallic barrier layer 46A and a continuous portion of the metallic fill material layer 46B that are located in the backside trenches 79 or above the contact-level dielectric layer 80.

The deposited metallic material of the continuous electrically conductive material layer is etched back from the sidewalls of each backside trench 79 and from above the contact-level dielectric layer 80 by performing an isotropic etch process that etches the at least one conductive material of the continuous electrically conductive material layer. Each remaining portion of the deposited metallic material in the backside recesses 43 constitutes an electrically conductive layer 46. Each electrically conductive layer 46 can be word line or a select gate electrode. Thus, the sacrificial material layers 42 are replaced with the electrically conductive layers 46.

An alternating stack (32, 46) of insulating layers 32 and electrically conductive layers 46 can be formed. In one embodiment, a first electrically conductive layer 461 and a second electrically conductive layer 462 of the electrically conductive layers 46 may be deposited on an optional respective divot-fill annular dielectric spacer 432, a respective silicon oxycarbide liner 332, and a respective cylindrical surface segment of an outer sidewall of the dielectric metal oxide blocking dielectric layer 52. In one embodiment, the first electrically conductive layer 461 and the second electrically conductive layer 462 may be in contact with the respective silicon oxycarbide liner 332 and with a respective one of the insulating layers 32 (as in the case of the first electrically conductive layer 461) or a dielectric material layer (such as an inter-tier dielectric layer 170) composed of a silicon oxide material (as in the case of the second electrically conductive layer 462). It is noted that either of the first electrically conductive layer 461 and the second electrically conductive layer 462 illustrated in FIG. 28E may be referred to as a first electrically conductive layer or as a second electrically conductive layer since as discussed above, elements of a same type may be identified with any ordinal.

In one embodiment, the memory film 50 comprises, from outside to inside, a vertical stack of silicon oxide spacers (51', 151, 251), a dielectric metal oxide blocking dielectric layer 52, a silicon oxide blocking dielectric layer 53, the continuous memory material layer 54, and a tunneling dielectric layer 56. In one embodiment, each of the electrically conductive layers 46 is in direct contact with a respective surface segment of an outer sidewall of the dielectric metal oxide blocking dielectric layer 52.

In one embodiment, a vertical stack of tubular silicon oxide spacers 51' may be vertically spaced apart from each other, and may laterally surround and contact the dielectric metal oxide blocking dielectric layer 52. Optional divot-fill annular dielectric spacers 432 may contact a concave tapered surface of a respective one of the tubular silicon oxide spacers 51', and may contact a respective cylindrical surface segment of an outer sidewall of the dielectric metal oxide blocking dielectric layer 52.

An annular silicon oxide spacer 151 may be optionally located within each memory opening fill structure 58. The annular silicon oxide spacer 151 may have an inner sidewall contacting a cylindrical surface segment of an outer sidewall of the dielectric metal oxide blocking dielectric layer 52, and may have a concave and tapered outer sidewall segment contacting a first convex and tapered annular surface segment of the first electrically conductive layer 461. In one embodiment, one of the divot-fill annular dielectric spacers 432 contacts a second convex and tapered annular surface segment of the first electrically conductive layer 461.

In one embodiment, the annular silicon oxide spacer 151 has a planar annular bottom surface contacting an annular segment of a top surface of a horizontally-extending portion of the dielectric metal oxide blocking dielectric layer 52.

In one embodiment shown in the inset of FIG. 28E, one of the tubular silicon oxide spacers 51' comprises a concave and tapered outer sidewall segment CTOS contacting a first convex and tapered annular surface segment of an electrically conductive layer (such that the first or the second electrically conductive layer (461, 462). One of the divot-fill annular dielectric spacers 432 contacts a second convex and tapered annular surface segment of the electrically conductive layer.

In one embodiment, a sidewall surface and a peripheral portion of a horizontal planar surface of the silicon oxycarbide liner 332 may be in contact with one of the divot-fill annular dielectric spacers 432.

In one embodiment, the first electrically conducive layer 461 and/or the second electrically conductive layer 462 comprises a respective major horizontally-extending planar surface that contacts a respective silicon oxycarbide liner 332. In one embodiment, the first electrically conducive layer 461 and/or the second electrically conductive layer 462 comprises a respective first convex and tapered annular surface segment having a first radius of curvature RC1, and a respective second convex and tapered annular surface segment having a second radius of curvature RC2 that is less than the first radius of curvature RC1. In one embodiment, an edge of the respective second convex and tapered annular surface segment is adjoined to an edge of the respective horizontally-extending planar surface. The first radius of curvature RC1 may be the same as or greater than the lateral thickness of the tubular silicon oxide liners 51' (i.e., the lateral distance between the inner sidewall and the outer sidewall). The second radius of curvature RC2 may be the same as or greater than one half of the lateral thickness of the tubular silicon oxide liners 51', and is less than the first radius of curvature RC1.

Thus, the first and second electrically conductive layers (461, 462) are formed with a respective rounded corner facing the inter-tier joint region (i.e., the inter-tier dielectric layer 170) having a greater radius of curvature than the opposing rounded corner facing away from the joint region and toward the respect silicon oxycarbide liner 332. The increased word line corner rounding at the joint region improves back tunneling and thus device erase efficiency. In contrast, the decreased word line corner rounding for the remainder of word line corners decreases short channel effect degradation and improves word line controllability.

The third exemplary structure may be formed in a second configuration in lieu of the first configuration illustrated in FIGS. 28A-28E. FIGS. 29A-29E are sequential vertical cross-sectional views of a region of an alternative configuration, i.e., the second configuration, of the third exemplary structure around a memory opening fill structure 58 during formation of electrically conductive layers 46 according to the third embodiment of the present disclosure.

Figures 29A, 29B:
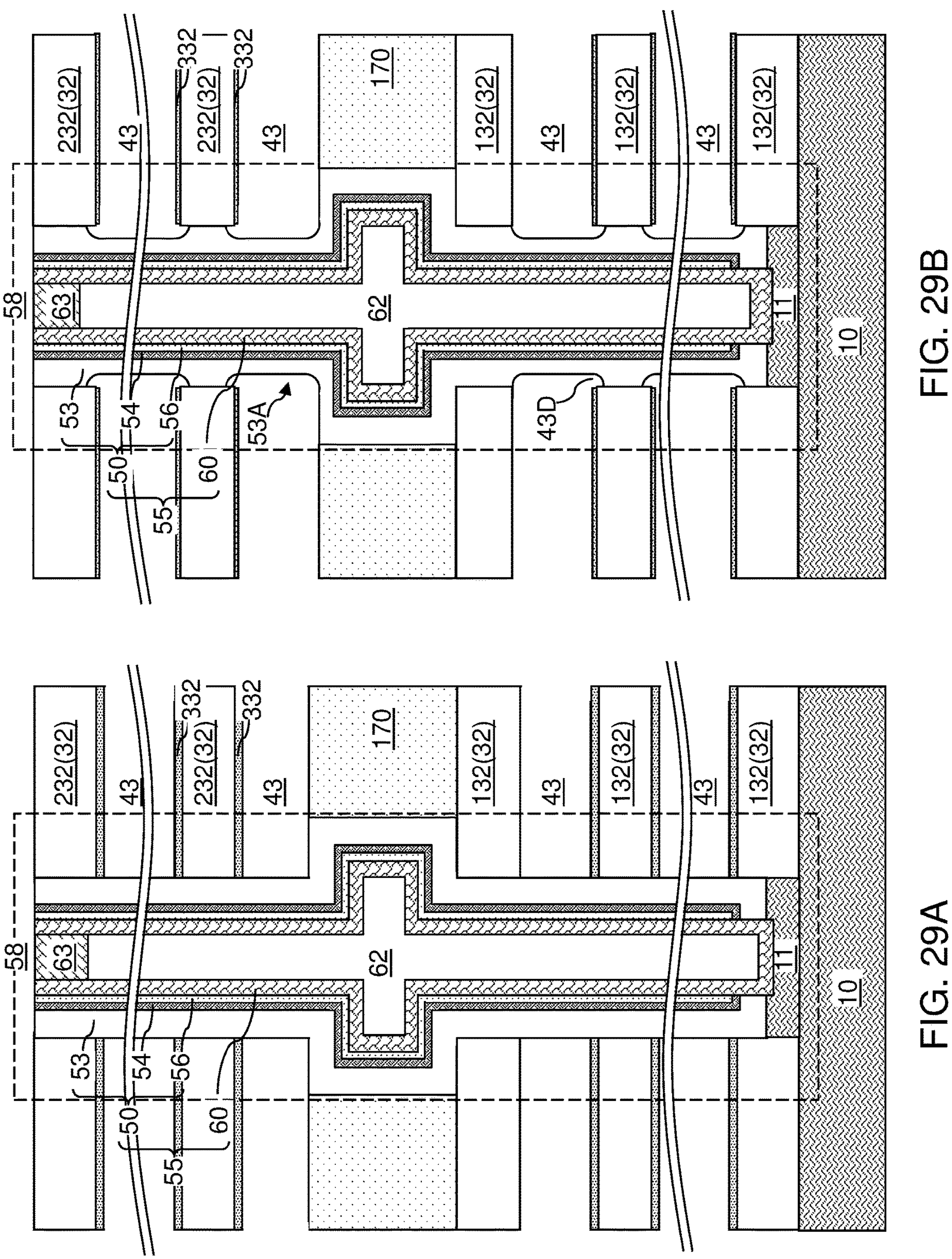
FIGS. 29A-29E are sequential vertical cross-sectional views of a region of an alternative configuration of the third exemplary structure around a memory opening fill structure during formation of electrically conductive layers according to the third embodiment of the present disclosure.

Referring to FIGS. 27 and 29A, a second configuration of the third exemplary structure is illustrated after formation of backside recesses 43 by removing the sacrificial material layers (142, 242) selective to the silicon oxycarbide liner 332, the insulating layers (132, 232) (which comprises a silicon oxide material), the inter-tier dielectric layer 170 including a silicon oxide material, and the contact-level dielectric layer 80.

In the second configuration, the memory opening fill structures 58 have the configuration illustrated in FIG. 25C. Specifically, an etchant that selectively etches the sacrificial material layers (142, 242) with respect to the insulating layers (132, 232) and the silicon oxycarbide liners 332 can be introduced into the backside trenches 79 during an isotropic etch process, as described above with respect to FIG. 28A. Backside recesses 43 are formed in volumes from which the sacrificial material layers (142, 242) are removed. The removal of the sacrificial material layers (142, 242) can be selective to the material of the insulating layers (132, 232), the material of the silicon oxycarbide liners 332, the material of the retro-stepped dielectric material portions (165, 265), the material of the inter-tier dielectric layer 170, the semiconductor material of the semiconductor material layer 10, and the material of the outermost layer of the memory films 50 (such as the silicon oxide blocking dielectric layer 53).

Referring to FIG. 29B, an isotropic etch process that etches the material of the silicon oxide blocking dielectric layer 53 is performed. The etch chemistry of the isotropic etch process is selected such that the isotropic etch process etches the material of the silicon oxide blocking dielectric layer 53 (i.e., a silicon oxide material) at a higher etch rate than the material of the silicon oxycarbide liners 332. In other words, the isotropic etch process etches a material of the silicon oxide liner at a higher etch rate than materials of the first silicon oxycarbide liners 332 and the second silicon oxycarbide liners 332. The isotropic etch process employed at the processing steps of FIG. 29B may be the same as the isotropic etch process employed at the processing steps of FIG. 28B.

The isotropic etch process isotropically etches portions of the silicon oxide blocking dielectric layer 53 selective to the silicon oxycarbide liner 332. A vertical stack of annular lateral indentations 53A that are vertically spaced apart is formed on the outer sidewall of the silicon oxide blocking dielectric layer 53 at each level of the backside recesses 43. The lateral etch distance of the isotropic etch process on the outer sidewall of the silicon oxide blocking dielectric layer 53 may be in a range from 20% to 90%, such as from 30% to 80%, of the thickness of the silicon oxide blocking dielectric layer 53 as formed at the processing steps of FIG. 25C. A vertical stack of annular divots 43D can be formed between each silicon oxycarbide liner 332 and the silicon oxide blocking dielectric layer 53.

Figures 29C, 29D:
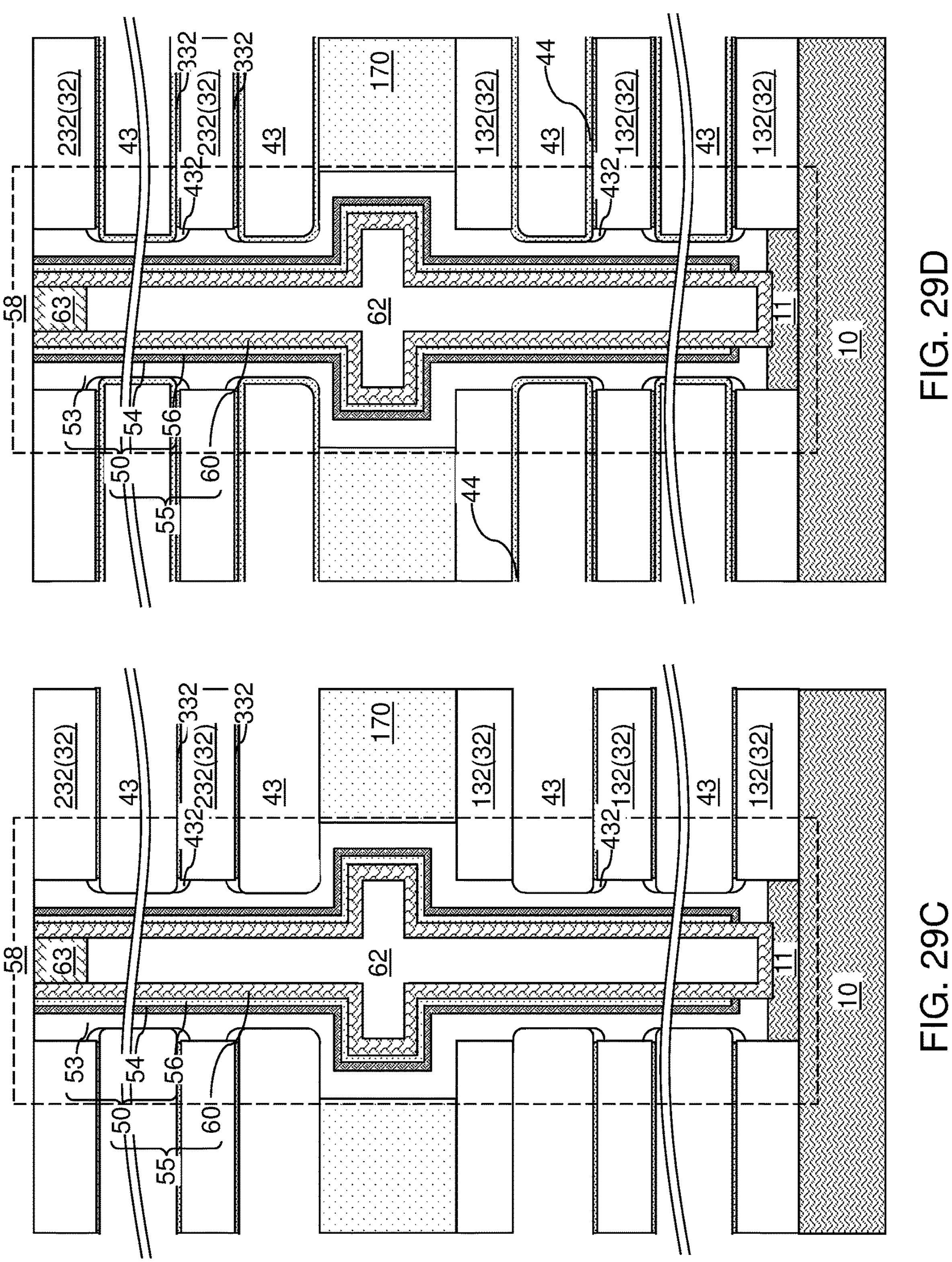

Referring to FIG. 29C, the optional step described above with respect to FIG. 28C may be performed to deposit a conformal dielectric liner in the annular divots 43D around the memory opening fill structures 58, on the physically exposed surfaces of the silicon oxycarbide spacers 332, and on the physically exposed surfaces of the insulating layers 32, the inter-tier dielectric layer 170, and the contact-level dielectric layer 80. The conformal dielectric liner may comprise any insulating material, such as silicon oxide. The thickness of the conformal dielectric liner may be greater than one half of the lateral etch distance of the isotropic etch process so that the conformal dielectric liner fills the annular divots 43D. The thickness of the conformal dielectric liner may be less than the lateral etch distance of the isotropic etch process. For example, the thickness of the conformal dielectric liner may range from 2 nm to 4 nm. In one embodiment, the conformal dielectric liner comprises undoped silicate glass (e.g., silicon dioxide) or a doped silicate glass.

An isotropic recess etch process can be performed to etch back portions of the conformal dielectric liner from outside the volumes of the annular divots 43D. Horizontally-extending surfaces of the silicon oxycarbide liners 332 can be physically exposed around each backside recess 43. The duration of the isotropic etch process can be selected to minimize collateral etching of the silicon oxycarbide liners 332 which function as etch stop layers. Each remaining portion of the conformal dielectric liner that fills a respective annular divot 43D has an annular shape, and is herein referred to as a divot-fill annular dielectric spacer 432.

In one embodiment, each memory opening fill structure 58 comprises divot-fill annular dielectric spacers 432. Each of the annular lateral indentations 53A of the outer sidewall of the silicon oxide blocking dielectric layer 53 may be in contact with at least one divot-fill annular dielectric spacer 432. Thus, plurality of annular lateral indentations 53A of the outer sidewall of the silicon oxide blocking dielectric layer 53 may be in contact with a respective pair of divot-fill annular dielectric spacers 432.

Thus, in summary, an annular divot 43D may be formed between each silicon oxycarbide liner 332 and a respective one of the annular lateral indentations 53A in the outer sidewall of a silicon oxide blocking dielectric layer 53. Each annular divot 43D may optionally be filled with a divot-fill annular dielectric spacer 432.

Referring to FIG. 29D, a backside blocking dielectric layer 44 can be conformally deposited in the backside recesses 43. The backside blocking dielectric layer 44 may have the same material composition and the same thickness range as the dielectric metal oxide blocking dielectric layer 52 in the first and second exemplary structures, and may be formed by a conformal deposition process. The backside dielectric metal oxide blocking dielectric layer 44 can be deposited directly on the divot-fill annular dielectric spacers 432 (if present), directly on horizontal surfaces of the silicon oxycarbide liners 332, and directly on cylindrical surface segments of the annular lateral indentations of the silicon oxide blocking dielectric layer 53.

Figure 29E:
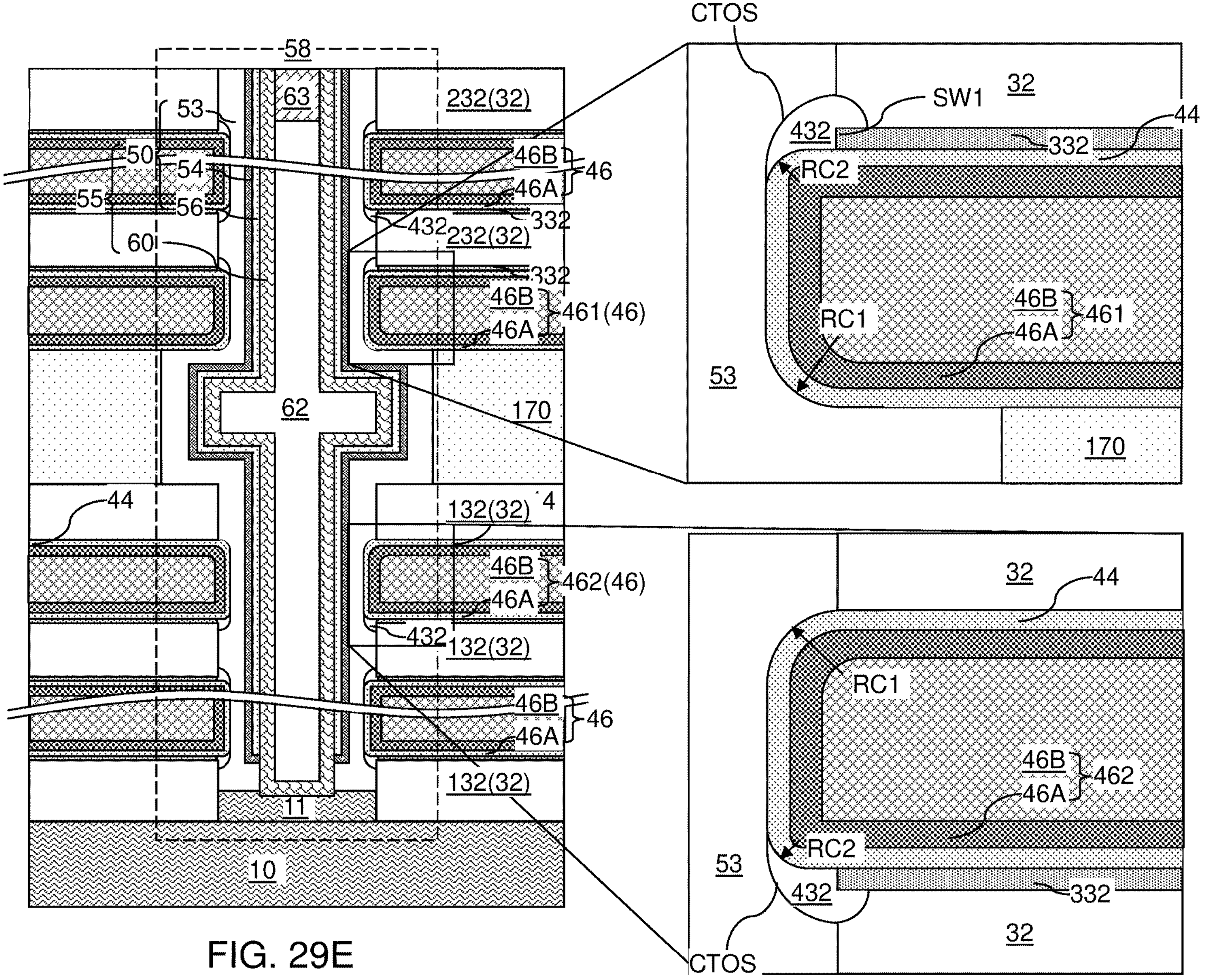

Referring to FIG. 29E, the processing steps described with reference to FIGS. 28D and 28E can be performed to conformally the electrically conductive layers 46. Each electrically conductive layer 46 may comprise a respective metallic barrier layer 46A and a metallic fill material portion 46B.

An alternating stack (32, 46) of insulating layers 32 and electrically conductive layers 46 can be formed. A first electrically conductive layer 461 and a second electrically conductive layer 462 may be in contact with a respective silicon oxycarbide liner 332, and with a respective insulating layer 32 or a dielectric material layer (such as an inter-tier dielectric layer 170) composed of a silicon oxide material.

Each of the electrically conductive layers 46 is vertically spaced from a respective overlying insulating layer 32 and from a respective underlying insulating layer 32 by a respective backside dielectric metal oxide blocking dielectric layer 44. A first backside dielectric metal oxide blocking dielectric layer 44 comprises a first horizontal surface that is in direct contact with a silicon oxycarbide liner 332 and a second horizontal surface that is in direct contact with one of the insulating layers 32 (as in the case of the first electrically conductive layer 461) or a dielectric material layer (such as an inter-tier dielectric layer 170) composed of a silicon oxide material (as in the case of the second electrically conductive layer 462).

In one embodiment, the first backside dielectric metal oxide blocking dielectric layer 44 embeds a first electrically conductive layer 461 or a second electrically conductive layer 462. The second horizontal surface is vertically spaced from the first horizontal surface by a sum of a vertical thickness of the first electrically conductive layer 461 or the second electrically conductive layer 462 and twice a thickness of the first backside dielectric metal oxide blocking dielectric layer 44.

In one embodiment, the silicon oxide blocking dielectric layer 53 is in contact with each of the backside dielectric metal oxide blocking dielectric layers 44. In one embodiment, the silicon oxide blocking dielectric layer 53 comprises an outer sidewall having a vertical stack of annular lateral indentations that are vertically spaced apart; and each of the annular lateral indentations comprises a cylindrical surface segment and a pair of annular concave surface segment adjoined to a respective edge of the cylindrical surface segment.

In one embodiment, divot-fill annular dielectric spacers 432 can contact a respective annular concave surface segment of the annular lateral indentations of the silicon oxide blocking dielectric layer 53. The first backside dielectric metal oxide blocking dielectric layer 44 may comprise a first convex and tapered annular surface segment having a first radius of curvature RC1 and contacting an annular concave surface segment of the silicon oxide blocking dielectric layer 53, and a second convex and tapered annular surface segment having a second radius of curvature RC2 that is less than the first radius of curvature RC1 and contacting one of the divot-fill annular dielectric spacers 432.

In one embodiment, the second horizontal surface of the first backside dielectric metal oxide blocking dielectric layer 44 is in direct contact with a horizontal planar surface of the silicon oxide blocking dielectric layer 53.

In one embodiment, each memory opening 49 vertically extends through the alternating stack (32, 46) of insulating layers and electrically conductive layers 46. A memory opening fill structure 58 can be formed in each of the memory openings 49. Each memory opening fill structure 58 comprises a vertical semiconductor channel 60 and a memory film 50 comprising a continuous memory material layer 54 which continuously extends through the entire alternating stack (32, 46).

Figure 30:
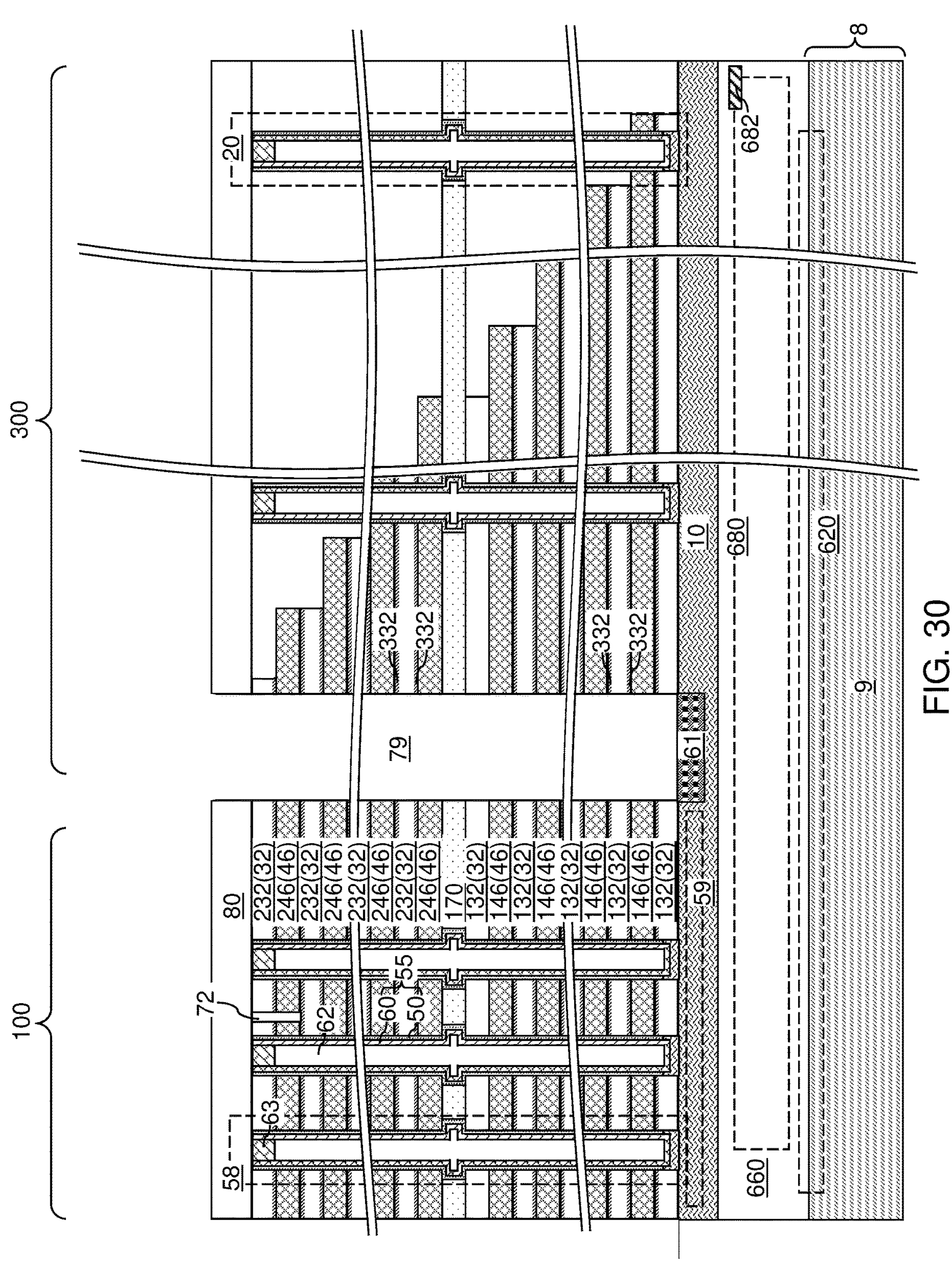
FIG. 30 is a vertical cross-sectional view of the third exemplary structure after formation of the electrically conductive layers according to the third embodiment of the present disclosure.

Referring to FIG. 30, the third exemplary structure is illustrated after formation of the electrically conductive layers 46, i.e., after the processing steps described with reference to FIGS. 28A-28E or after the processing steps described with reference to FIGS. 29A-29E. Electrically conductive layers 46 that replaces the first-tier sacrificial material layers 142 are herein referred to as first-tier electrically conductive layers 146, and electrically conductive layers 46 that replaces the second-tier sacrificial material layers 242 are herein referred to as second-tier electrically conductive layers 246.

Figure 31A:
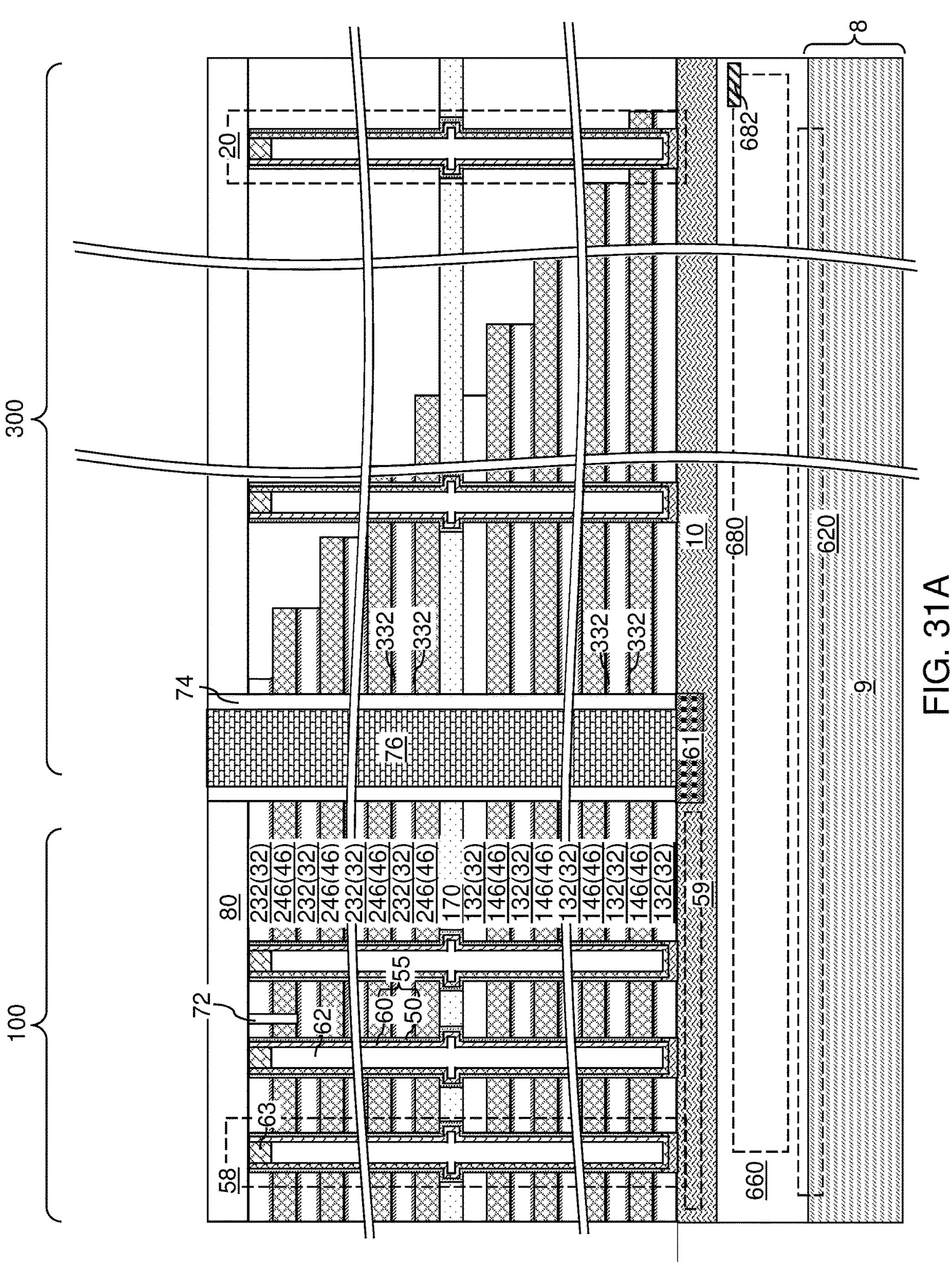
FIG. 31A is a vertical cross-sectional view of the third exemplary structure after formation of isolation trench fill structures according to the third embodiment of the present disclosure.
Figure 31B:
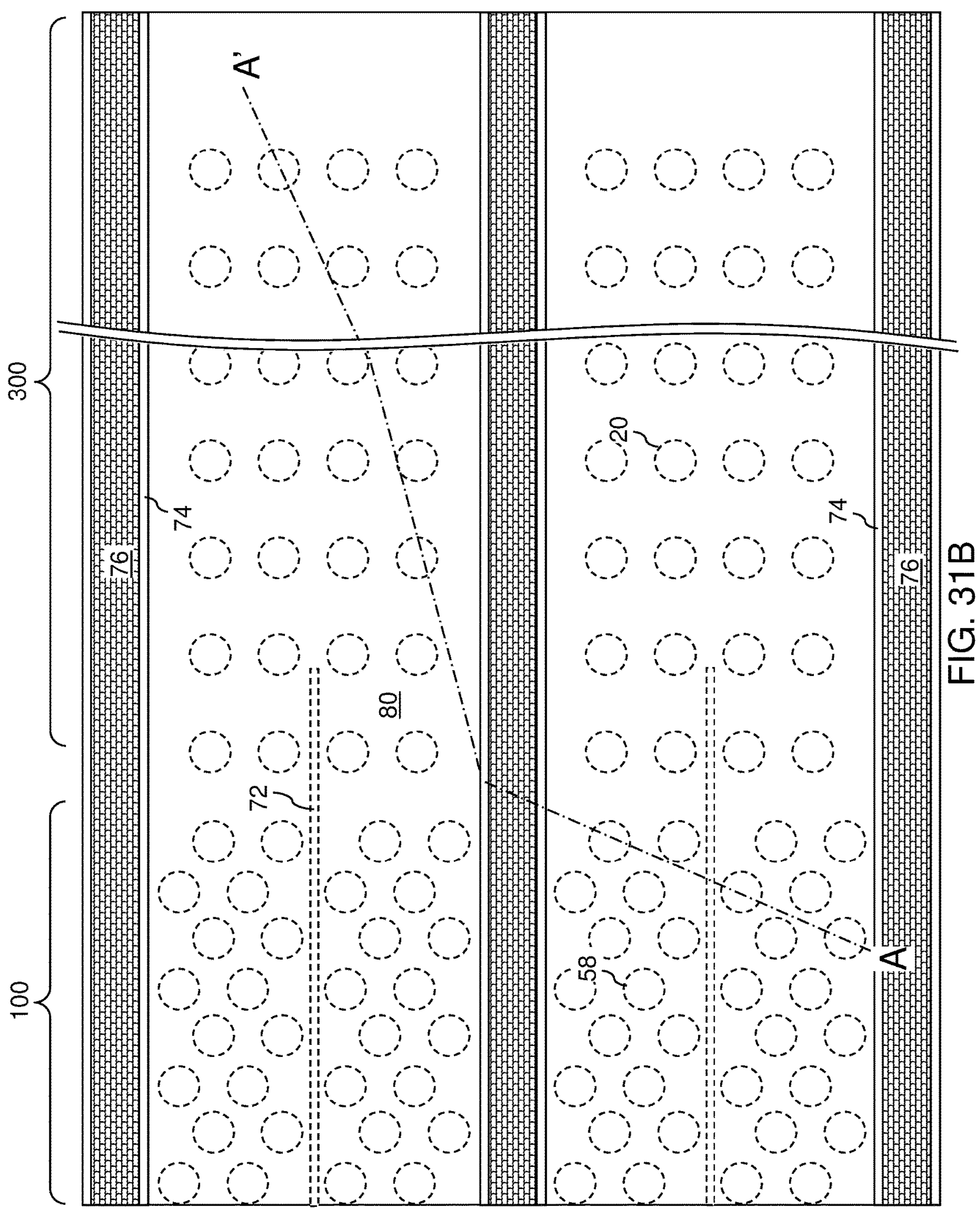
FIG. 31B is a top-down view of the third exemplary structure of FIG. 31A. The hinged vertical plane A-A' is the plane of the vertical cross-sectional view of FIG. 31A.

Referring to FIGS. 31A and 31B, the processing steps described with reference to FIGS. 12A and 12B can be performed to form a backside trench fill structure within each backside trench 79. For example, each backside trench fill structure may comprise a combination of an insulating spacer 74 and a backside contact via structure 76.

Figure 32A:
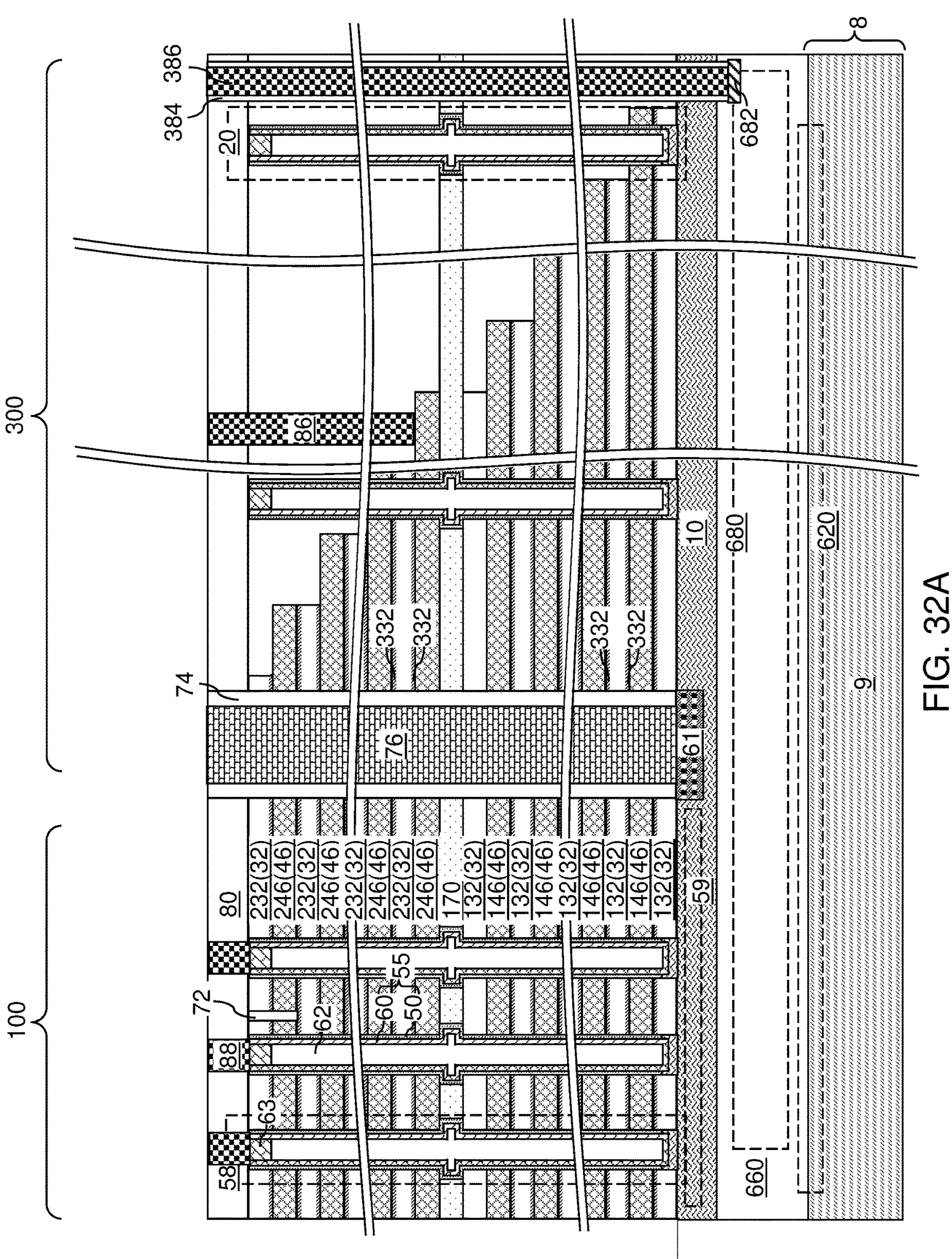
FIG. 32A is a vertical cross-sectional view of the third exemplary structure after formation of various contact via structures according to the third embodiment of the present disclosure.
Figure 32B:
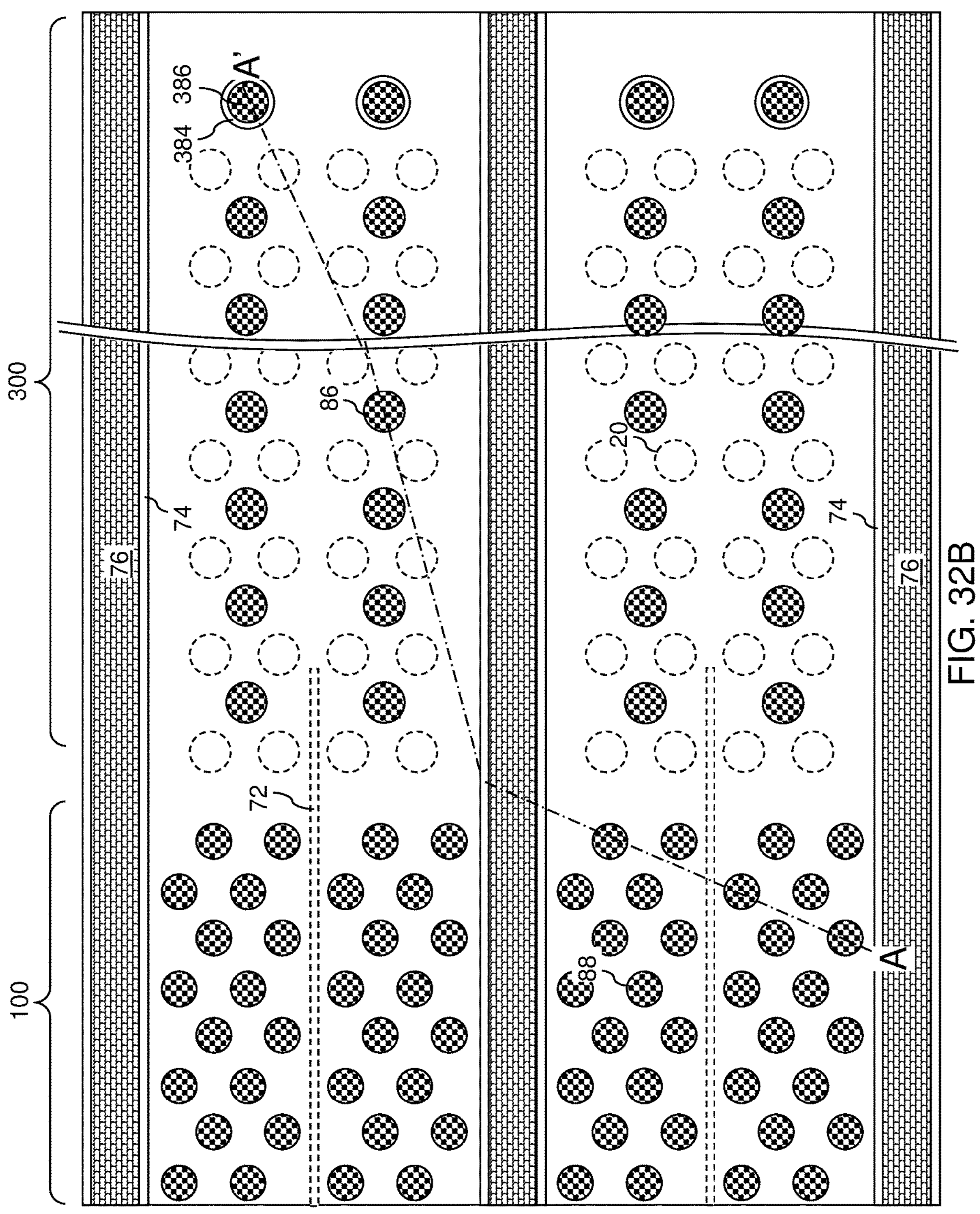
FIG. 32B is a top-down view of the third exemplary structure of FIG. 32A. The hinged vertical plane A-A' is the plane of the vertical cross-sectional view of FIG. 32A.

Referring to FIGS. 32A and 32B, the processing steps described with reference to FIGS. 13A and 13B can be performed to form various additional contact via structures such as drain contact via structures 88, layer contact via structures 86, and through-memory-level connection via structures 386.

Referring to all drawings related to the first configuration of the third exemplary structure shown in FIG. 28E, a memory device is provided, which comprises: an alternating stack (32, 46) of insulating layers 32 and electrically conductive layers 46, wherein a first electrically conductive layer (461 or 462) of the electrically conductive layers 46 has a first major horizontal surface in contact with a silicon oxycarbide liner 332 and an opposing second major surface in contact with one of the insulating layers 32 or a dielectric material layer (such as an inter-tier dielectric layer 170) composed of a silicon oxide material; a memory opening 49 vertically extending through the alternating stack (32, 46); and a memory opening fill structure 58 located in the memory opening 49 and comprising a vertical semiconductor channel 60 and a memory film 50.

In one embodiment, the memory film 50 comprises, from outside to inside, a dielectric metal oxide blocking dielectric layer 52, a silicon oxide blocking dielectric layer 53, a continuous memory material layer 54, and a tunneling dielectric layer 56. In one embodiment, each of the electrically conductive layers 46 is in direct contact with a respective surface segment of an outer sidewall of the dielectric metal oxide blocking dielectric layer 52.

In one embodiment, the memory device comprises: a vertical stack of tubular silicon oxide spacers 51' that are vertically spaced apart from each other and laterally surrounding and contacting the dielectric metal oxide blocking dielectric layer 52; and divot-fill annular dielectric spacers 432 contacting a concave tapered surface of a respective one of the tubular silicon oxide spacers 51' and contacting a respective cylindrical surface segment of an outer sidewall of the dielectric metal oxide blocking dielectric layer 52.

In one embodiment, the memory device further comprises an annular silicon oxide spacer 151 having an inner sidewall contacting a cylindrical surface segment of an outer sidewall of the dielectric metal oxide blocking dielectric layer 52 and having a concave and tapered outer sidewall segment CTOS segment CTOS contacting a first convex and tapered annular surface segment of the first electrically conductive layer (461 or 462), wherein one of the divot-fill annular dielectric spacers 432 contacts a second convex and tapered annular surface segment of the first electrically conductive layer (461 or 462). In one embodiment, the annular silicon oxide spacer 151 has a planar annular bottom surface contacting an annular segment of a top surface of a horizontally-extending portion of the dielectric metal oxide blocking dielectric layer 52.

In one embodiment, one of the tubular silicon oxide spacers 51' comprises a concave and tapered outer sidewall segment CTOS contacting a first convex and tapered annular surface segment of the first electrically conductive layer 462; and one of the divot-fill annular dielectric spacers 432 contacts a second convex and tapered annular surface segment of the first electrically conductive layer 462.

In one embodiment, a sidewall surface and a peripheral portion of a horizontal planar surface of the silicon oxycarbide liner 332 is in contact with one of the divot-fill annular dielectric spacers 432.

In one embodiment, the first electrically conductive layer (461 or 462) comprises a horizontally-extending planar surface that contacts the silicon oxycarbide liner 332; the first electrically conductive layer (461 or 462) comprises a first convex and tapered annular surface segment having a first radius of curvature RC1, and a second convex and tapered annular surface segment having a second radius of curvature RC2 that is less than the first radius of curvature RC1; and an edge of the second convex and tapered annular surface segment is adjoined to an edge of the horizontally-extending planar surface.

In one embodiment, the alternating stack comprises a first tier, a second tier and the dielectric material layer 170 composed of the silicon oxide material which is located between the first tier and the second tier. The first tier comprises alternating first electrically conductive layers 146 and first insulating layers 132, lower silicon oxycarbide liners 332 located between lower major horizontal surfaces of the first electrically conductive layers 146 and upper major horizontal surfaces of the underlying first insulating layers 132, and upper silicon oxycarbide liners 332 located between upper major horizontal surfaces of a subset of the first electrically conductive layers 146 and lower major horizontal surfaces of the overlying first insulating layers 132. The upper silicon oxycarbide liner 332 is not located on the upper major horizontal surface topmost one of the first electrically conductive layers 146. The second tier comprises alternating second electrically conductive layers 246 and second insulating layers 232, upper silicon oxycarbide liners 332 located between upper major horizontal surfaces of the second electrically conductive layers 246 and lower major horizontal surfaces of the overlying second insulating layers 232, and lower silicon oxycarbide liners 332 located between lower major horizontal surfaces of a subset the second electrically conductive layers 246 and upper major horizontal surfaces of the underlying second insulating layers 232. The lower silicon oxycarbide liner 232 is not located on the lower major horizontal surface of a bottommost one of the second electrically conductive layers 246.

Referring to all drawings related to the second configuration of the third exemplary structure shown in FIG. 29E, a memory device is provided, which comprises: an alternating stack (32, 46) of insulating layers 32 and electrically conductive layers 46, wherein each of the electrically conductive layers 46 is vertically spaced from a respective overlying insulating layer 32 and from a respective underlying insulating layer 32 by a respective backside dielectric metal oxide blocking dielectric layer 44, wherein a first backside dielectric metal oxide blocking dielectric layer 44 of the backside dielectric metal oxide blocking dielectric layers 44 comprises a first horizontal surface that is in direct contact with a silicon oxycarbide liner 332 and a second horizontal surface that is in direct contact with one of the insulating layers 32 or a dielectric material layer (such as an inter-tier dielectric layer 170) composed of a silicon oxide material; a memory opening 49 vertically extending through the alternating stack (32, 46); and a memory opening fill structure 58 located in the memory opening 49 and comprising a vertical semiconductor channel 60 and a memory film 50.

In one embodiment, the first backside dielectric metal oxide blocking dielectric layer 44 embeds a first electrically conductive layer (461 or 462) of the electrically conductive layers 46; and the second horizontal surface is vertically spaced from the first horizontal surface by a sum of a vertical thickness of the first electrically conductive layer (461 or 462) and twice a thickness of the first backside dielectric metal oxide blocking dielectric layer 44.

In one embodiment, the memory film 50 comprises, from outside to inside, a silicon oxide blocking dielectric layer 53, a continuous memory material layer 54, and a tunneling dielectric layer 56; and the silicon oxide blocking dielectric layer 53 is in contact with each of the backside dielectric metal oxide blocking dielectric layers 44.

In one embodiment, the silicon oxide blocking dielectric layer 53 comprises an outer sidewall having a vertical stack of annular lateral indentations that are vertically spaced apart; and each of the annular lateral indentations comprises a cylindrical surface segment and a pair of annular concave surface segment adjoined to a respective edge of the cylindrical surface segment.

In one embodiment, the memory device comprises divot-fill annular dielectric spacers 432 contacting a respective annular concave surface segment of the annular lateral indentations of the silicon oxide blocking dielectric layer 53, wherein: the first backside dielectric metal oxide blocking dielectric layer 44 comprises a first convex and tapered annular surface segment having a first radius of curvature RC1 and contacting an annular concave surface segment of the silicon oxide blocking dielectric layer 53, and a second convex and tapered annular surface segment having a second radius of curvature RC2 that is less than the first radius of curvature RC1 and contacting one of the divot-fill annular dielectric spacers 432.

In one embodiment, the second horizontal surface of the first backside dielectric metal oxide blocking dielectric layer 44 is in direct contact with a horizontal planar surface of the silicon oxide blocking dielectric layer 53.

In one embodiment, the alternating stack comprises a first tier, a second tier and the dielectric material layer 170 composed of the silicon oxide material which is located between the first tier and the second tier. The first tier comprises alternating first electrically conductive layers 146 and first insulating layers 132, lower silicon oxycarbide liners 332 located between lower major horizontal surfaces of the first electrically conductive layers 146 and upper major horizontal surfaces of the underlying first insulating layers 132, and upper silicon oxycarbide liners 332 located between upper major horizontal surfaces of a subset of the first electrically conductive layers 146 and lower major horizontal surfaces of the overlying first insulating layers 132. The upper silicon oxycarbide liner 332 is not located on the upper major horizontal surface topmost one of the first electrically conductive layers 146. The second tier comprises alternating second electrically conductive layers 246 and second insulating layers 232, upper silicon oxycarbide liners 332 located between upper major horizontal surfaces of the second electrically conductive layers 246 and lower major horizontal surfaces of the overlying second insulating layers 232, and lower silicon oxycarbide liners 332 located between lower major horizontal surfaces of a subset the second electrically conductive layers 246 and upper major horizontal surfaces of the underlying second insulating layers 232. The lower silicon oxycarbide liner 232 is not located on the lower major horizontal surface of a bottommost one of the second electrically conductive layers 246.

The various embodiments related to the third exemplary structure can provide electrically conductive layers 46 located at the inter-tier joint which have an asymmetric vertical cross-sectional profile. Specifically, one corner of an electrically conductive layer 46 that is proximal to a memory opening fill structure 58 can have a first radius of curvature, and another corner of the electrically conductive layer 46 that is proximal to the memory opening fill structure 58 can have a second radius of curvature that is different from the first radius of curvature. The different radii of curvature of the electrically conductive layer 46 may be advantageously employed to locally modify electrical field strength to enhance the electrical characteristics of the device. For example, portions of the electrically conductive layers 46 that are formed adjacent to an inter-tier dielectric layer 170 may be formed with larger radii of curvature to enhance the erase characteristics of the device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:

an alternating stack of insulating layers and electrically conductive layers, wherein a first electrically conductive layer of the electrically conductive layers has a first major horizontal surface in contact with a silicon oxycarbide liner and an opposing second major surface in contact with one of the insulating layers or with a dielectric material layer composed of a silicon oxide material;

a memory opening vertically extending through the alternating stack;

a memory opening fill structure located in the memory opening and comprising a vertical semiconductor channel and a memory film, wherein the memory film comprises, from outside to inside, a dielectric metal oxide blocking dielectric layer, a silicon oxide blocking dielectric layer, a continuous memory material layer, and a tunneling dielectric layer;

a vertical stack of tubular silicon oxide spacers that are vertically spaced apart from each other, and laterally surrounding and contacting the dielectric metal oxide blocking dielectric layer; and divot-fill annular dielectric spacers contacting a concave tapered surface of a respective one of the tubular silicon oxide spacers and contacting a respective cylindrical surface segment of an outer sidewall of the dielectric metal oxide blocking dielectric layer.

2. The memory device of claim 1, further comprising an annular silicon oxide spacer having an inner sidewall contacting a cylindrical surface segment of an outer sidewall of the dielectric metal oxide blocking dielectric layer and having a concave and tapered outer sidewall segment contacting a first convex and tapered annular surface segment of the first electrically conductive layer, wherein:

one of the divot-fill annular dielectric spacers contacts a second convex and tapered annular surface segment of the first electrically conductive layer; and wherein the annular silicon oxide spacer has a planar annular bottom surface contacting an annular segment of a top surface of a horizontally-extending portion of the dielectric metal oxide blocking dielectric layer.

3. The memory device of claim 1, wherein:

one of the tubular silicon oxide spacers comprises a concave and tapered outer sidewall segment contacting a first convex and tapered annular surface segment of the first electrically conductive layer; and one of the divot-fill annular dielectric spacers contacts a second convex and tapered annular surface segment of the first electrically conductive layer.

4. The memory device of claim 1, wherein a sidewall surface and a peripheral portion of a horizontal planar surface of the silicon oxycarbide liner is in contact with one of the divot-fill annular dielectric spacers.

5. A memory device, comprising:

an alternating stack of insulating layers and electrically conductive layers, wherein a first electrically conductive layer of the electrically conductive layers has a first major horizontal surface in contact with a silicon oxycarbide liner and an opposing second major surface in contact with one of the insulating layers or with a dielectric material layer composed of a silicon oxide material;

a memory opening vertically extending through the alternating stack; and a memory opening fill structure located in the memory opening and comprising a vertical semiconductor channel and a memory film;

wherein:

the first electrically conductive layer comprises a horizontally-extending planar surface that contacts the silicon oxycarbide liner;

the first electrically conductive layer comprises a first convex and tapered annular surface segment having a first radius of curvature, and a second convex and tapered annular surface segment having a second radius of curvature that is less than the first radius of curvature; and an edge of the second convex and tapered annular surface segment is adjoined to an edge of the horizontally-extending planar surface.

6. A memory device, comprising:

an alternating stack of insulating layers and electrically conductive layers, wherein a first electrically conductive layer of the electrically conductive layers has a first major horizontal surface in contact with a silicon oxycarbide liner and an opposing second major surface in contact with one of the insulating layers or with a dielectric material layer composed of a silicon oxide material;

a memory opening vertically extending through the alternating stack; and a memory opening fill structure located in the memory opening and comprising a vertical semiconductor channel and a memory film;

wherein:

the alternating stack comprises a first tier, a second tier and the dielectric material layer composed of the silicon oxide material is located between the first tier and the second tier;

the first tier comprises alternating first electrically conductive layers and first insulating layers, lower silicon oxycarbide liners located between lower major horizontal surfaces of the first electrically conductive layers and upper major horizontal surfaces of the underlying first insulating layers, and upper silicon oxycarbide liners located between upper major horizontal surfaces of a subset of the first electrically conductive layers and lower major horizontal surfaces of the overlying first insulating layers, wherein the upper silicon oxycarbide liner is not located on the upper major horizontal surface topmost one of the first electrically conductive layers; and the second tier comprises alternating second electrically conductive layers and second insulating layers, upper silicon oxycarbide liners located between upper major horizontal surfaces of the second electrically conductive layers and lower major horizontal surfaces of the overlying second insulating layers, and lower silicon oxycarbide liners located between lower major horizontal surfaces of a subset the second electrically conductive layers and upper major horizontal surfaces of the underlying second insulating layers, wherein the lower silicon oxycarbide liner is not located on the lower major horizontal surface of a bottommost one of the second electrically conductive layers.

7. A memory device, comprising:

an alternating stack of insulating layers and electrically conductive layers, wherein each of the electrically conductive layers is vertically spaced from a respective overlying insulating layer and from a respective underlying insulating layer by a respective backside dielectric metal oxide blocking dielectric layer, wherein a first backside dielectric metal oxide blocking dielectric layer of the backside dielectric metal oxide blocking dielectric layers comprises a first horizontal surface that is in direct contact with a silicon oxycarbide liner and a second horizontal surface that is in direct contact with one of the insulating layers or a dielectric material layer composed of a silicon oxide material;

a memory opening vertically extending through the alternating stack; and a memory opening fill structure located in the memory opening and comprising a vertical semiconductor channel and a memory film.

8. The memory device of claim 7, wherein:

the first backside dielectric metal oxide blocking dielectric layer embeds a first electrically conductive layer of the electrically conductive layers; and the second horizontal surface is vertically spaced from the first horizontal surface by a sum of a vertical thickness of the first electrically conductive layer and twice a thickness of the first backside dielectric metal oxide blocking dielectric layer.

9. The memory device of claim 7, wherein:

the memory film comprises, from outside to inside, a silicon oxide blocking dielectric layer, a continuous memory material layer, and a tunneling dielectric layer; and the silicon oxide blocking dielectric layer is in contact with each of the backside dielectric metal oxide blocking dielectric layers.

10. The memory device of claim 9, wherein:

the second horizontal surface of the first backside dielectric metal oxide blocking dielectric layer is in direct contact with a horizontal planar surface of the silicon oxide blocking dielectric layer;

the silicon oxide blocking dielectric layer comprises an outer sidewall having a vertical stack of annular lateral indentations that are vertically spaced apart; and each of the annular lateral indentations comprises a cylindrical surface segment and a pair of annular concave surface segment adjoined to a respective edge of the cylindrical surface segment.

11. The memory device of claim 10, further comprising divot-fill annular dielectric spacers contacting a respective annular concave surface segment of the annular lateral indentations of the silicon oxide blocking dielectric layer, wherein:

the first backside dielectric metal oxide blocking dielectric layer comprises a first convex and tapered annular surface segment having a first radius of curvature and contacting an annular concave surface segment of the silicon oxide blocking dielectric layer, and a second convex and tapered annular surface segment having a second radius of curvature that is less than the first radius of curvature and contacting one of the divot-fill annular dielectric spacers.

12. The memory device of claim 9, wherein:

the alternating stack comprises a first tier, a second tier and the dielectric material layer composed of the silicon oxide material is located between the first tier and the second tier;

the first tier comprises alternating first electrically conductive layers and first insulating layers, lower silicon oxycarbide liners located between lower major horizontal surfaces of the first electrically conductive layers and upper major horizontal surfaces of the underlying first insulating layers, and upper silicon oxycarbide liners located between upper major horizontal surfaces of a subset of the first electrically conductive layers and lower major horizontal surfaces of the overlying first insulating layers, wherein the upper silicon oxycarbide liner is not located on the upper major horizontal surface topmost one of the first electrically conductive layers; and the second tier comprises alternating second electrically conductive layers and second insulating layers, upper silicon oxycarbide liners located between upper major horizontal surfaces of the second electrically conductive layers and lower major horizontal surfaces of the overlying second insulating layers, and lower silicon oxycarbide liners located between lower major horizontal surfaces of a subset the second electrically conductive layers and upper major horizontal surfaces of the underlying second insulating layers, wherein the lower silicon oxycarbide liner is not located on the lower major horizontal surface of a bottommost one of the second electrically conductive layers.

* * * * *